(12) United States Patent
Cameron et al.

(10) Patent No.: US 10,911,061 B2
(45) Date of Patent: Feb. 2, 2021

(54) SYSTEM AND METHOD FOR DEMODULATION OF RESOLVER OUTPUTS

(71) Applicant: THE BOEING COMPANY, Chicago, IL (US)

(72) Inventors: Douglas C. Cameron, Ladera Ranch, CA (US); Dwayne C. Merna, Yorba Linda, CA (US); Manu Sharma, Long Beach, CA (US)

(73) Assignee: THE BOEING COMPANY, Chicago, IL (US)

( * ) Notice: Subject to any disclaimer, the term of this patent is extended or adjusted under 35 U.S.C. 154(b) by 398 days.

(21) Appl. No.: 15/933,991

(22) Filed: Mar. 23, 2018

(65) Prior Publication Data

US 2019/0296761 A1 Sep. 26, 2019

(51) Int. Cl.
*H03M 1/48* (2006.01)
*G01C 19/30* (2006.01)
*H03M 1/50* (2006.01)
*B64G 1/28* (2006.01)

(52) U.S. Cl.
CPC ............ *H03M 1/485* (2013.01); *B64G 1/288* (2013.01); *G01C 19/30* (2013.01); *H03M 1/504* (2013.01)

(58) Field of Classification Search
CPC ........ H03M 1/48; H03M 1/485; H03M 1/504; B64G 1/288; G01C 19/30
See application file for complete search history.

(56) References Cited

U.S. PATENT DOCUMENTS 3,603,979 A * 9/1971 Kosakowski ......... H03M 1/485
341/119
3,720,863 A * 3/1973 Ringland ................ B60L 50/13
318/52
(Continued)

FOREIGN PATENT DOCUMENTS

EP 1137162 A1 9/2001
EP 0775384 B1 10/2001
EP 1667001 A2 6/2006

OTHER PUBLICATIONS

Communication pursuant to Article 94(3) EPC dated Oct. 1, 2019 issued in related Application No. EP20190164019, pp. 1-7.
(Continued)

*Primary Examiner* — James M Perez
(74) *Attorney, Agent, or Firm* — Moore Intellectual Property Law, PLLC

(57) ABSTRACT

Demodulation circuitry includes an input terminal configured to be coupled to an analog-to-digital converter (ADC) and configured to receive a plurality of ADC outputs. The plurality of ADC outputs are generated based on resolver outputs. The demodulation circuitry also includes a rectifier configured to rectify the plurality of ADC outputs. Rectifying the plurality of ADC outputs preserves a phase of the plurality of ADC outputs. The demodulation circuitry includes amplitude determination circuitry configured to determine, based on the rectified plurality of ADC outputs, demodulated amplitude values corresponding to the resolver outputs. The demodulation circuitry further includes angle computation circuitry configured to generate position outputs based on the demodulated amplitude values.

20 Claims, 41 Drawing Sheets

(56) References Cited

U.S. PATENT DOCUMENTS

| | | | | | |
|---|---|---|---|---|---|
| 4,099,109 | A | * | 7/1978 | Abbondanti | G06F 1/025 318/603 |
| 4,151,570 | A | * | 4/1979 | Ravizza | G11B 5/588 360/77.17 |
| 4,292,577 | A | * | 9/1981 | Cesarz | H02P 27/045 318/723 |
| 4,318,617 | A | * | 3/1982 | Orsen | G01D 5/2448 250/237 G |
| 4,320,517 | A | * | 3/1982 | Godard | H04L 27/2338 333/18 |
| 4,360,813 | A | * | 11/1982 | Fitzsimmons | H01Q 21/064 342/350 |
| 4,390,826 | A | * | 6/1983 | Erdman | H02P 6/085 318/400.17 |
| 4,470,562 | A | * | 9/1984 | Hall | F41G 7/343 244/3.2 |
| 4,511,884 | A | * | 4/1985 | Serev | G05B 19/33 318/660 |
| 4,544,982 | A | * | 10/1985 | Boothman | H02H 7/0822 361/103 |
| 4,600,874 | A | * | 7/1986 | Tupper | H02J 3/1892 318/798 |
| 4,740,738 | A | * | 4/1988 | El-Antably | H02P 3/065 318/701 |
| 5,229,697 | A | * | 7/1993 | Taylor | G05B 19/33 318/563 |
| 5,249,161 | A | * | 9/1993 | Jones | E21B 47/18 367/83 |
| 5,283,679 | A | * | 2/1994 | Wedding | H04B 10/504 398/183 |
| 5,323,309 | A | * | 6/1994 | Taylor | G05B 19/33 318/563 |
| 5,329,217 | A | * | 7/1994 | Kerkman | H02M 7/53875 318/811 |
| 5,347,277 | A | * | 9/1994 | Nondahl | G01D 5/208 341/112 |
| 5,430,362 | A | * | 7/1995 | Carr | F02N 11/04 318/139 |
| 5,493,200 | A | * | 2/1996 | Rozman | H02P 9/08 322/10 |
| 5,506,484 | A | * | 4/1996 | Munro | B60L 3/0069 318/599 |
| 5,565,752 | A | * | 10/1996 | Jansen | H02K 17/165 310/169 |
| 5,668,678 | A | * | 9/1997 | Reed | G11B 5/59655 360/51 |
| 5,689,248 | A | * | 11/1997 | Esfahani | E21B 47/12 340/853.1 |
| 5,796,535 | A | * | 8/1998 | Tuttle | G11B 5/012 360/51 |
| 6,195,220 | B1 | * | 2/2001 | Ellis | G11B 5/5552 360/77.08 |
| 6,285,719 | B1 | * | 9/2001 | Sobel | G01R 19/2506 329/361 |
| 6,304,014 | B1 | * | 10/2001 | England | G01D 5/2073 310/68 B |
| 6,385,067 | B2 | * | 5/2002 | Galbiati | H02M 7/53873 363/132 |
| 6,492,911 | B1 | * | 12/2002 | Netzer | G01D 5/2415 318/662 |
| 6,597,836 | B2 | * | 7/2003 | Johnson | G02B 27/0087 385/33 |
| 6,606,046 | B2 | * | 8/2003 | Kanno | G06F 1/025 341/144 |
| 6,681,649 | B2 | * | 1/2004 | Hyde | B64G 1/286 244/165 |
| 7,187,148 | B2 | * | 3/2007 | Okita | G05B 19/404 318/432 |
| 7,449,854 | B2 | * | 11/2008 | Tsubota | H02M 7/53873 318/400.06 |
| 8,861,947 | B2 | * | 10/2014 | Webb | H04N 5/2253 396/55 |
| 9,043,165 | B2 | * | 5/2015 | Oowada | G01D 5/24461 702/35 |
| 9,100,037 | B2 | * | 8/2015 | Aue | H03M 1/129 |
| 9,249,780 | B2 | * | 2/2016 | Ibendorf | F03D 7/0224 |
| 9,342,057 | B2 | * | 5/2016 | Kira | H02P 6/28 |
| 9,641,367 | B2 | * | 5/2017 | Shimizu | H04L 27/2053 |
| 9,774,809 | B2 | * | 9/2017 | Song | H04N 5/3765 |
| 9,848,152 | B1 | * | 12/2017 | Lin | H03M 1/0639 |
| 10,095,244 | B2 | * | 10/2018 | Otsuji | G05B 19/19 |
| 10,132,661 | B2 | * | 11/2018 | Falabella | G02B 27/46 |
| 10,308,278 | B2 | * | 6/2019 | Tsubaki | H02P 23/0027 |
| 10,323,960 | B2 | * | 6/2019 | Maki-Ontto | G01D 5/2086 |
| 10,414,519 | B1 | * | 9/2019 | Cameron | B64G 1/286 |
| 10,500,602 | B2 | * | 12/2019 | Griffin | B05B 17/0653 |
| 10,594,227 | B1 | * | 3/2020 | Blasko | H02M 3/33592 |
| 10,673,368 | B2 | * | 6/2020 | Cameron | G01P 15/08 |
| 2003/0130814 | A1 | * | 7/2003 | Mednikov | G01D 3/036 702/130 |
| 2004/0019446 | A1 | * | 1/2004 | Kim | G01D 5/242 702/106 |
| 2004/0046519 | A1 | * | 3/2004 | Leonardi | B60W 50/00 318/432 |
| 2005/0073279 | A1 | * | 4/2005 | Fenley | B60K 6/48 318/717 |
| 2005/0285582 | A1 | * | 12/2005 | Azuma | H02M 7/53873 323/282 |
| 2007/0241741 | A1 | * | 10/2007 | Pirozzi | H02P 25/03 324/160 |
| 2007/0296368 | A1 | * | 12/2007 | Woodland | G05B 21/02 318/609 |
| 2008/0218764 | A1 | * | 9/2008 | Chen | G01C 19/721 356/460 |
| 2008/0265831 | A1 | * | 10/2008 | Imai | H02P 21/06 318/801 |
| 2009/0167580 | A1 | * | 7/2009 | Hutchinson | H03M 3/41 341/143 |
| 2010/0109766 | A1 | * | 5/2010 | Nilsson | G01D 1/16 329/304 |
| 2010/0188277 | A1 | * | 7/2010 | Aruga | H03M 1/1215 341/158 |
| 2011/0106469 | A1 | * | 5/2011 | Kim | G01D 3/08 702/58 |
| 2012/0010849 | A1 | * | 1/2012 | Yamada | G01D 5/2073 702/151 |
| 2013/0229137 | A1 | * | 9/2013 | Takahashi | H02P 21/0003 318/616 |
| 2015/0137728 | A1 | * | 5/2015 | Wand | G01R 19/175 318/605 |
| 2015/0207445 | A1 | * | 7/2015 | Yasuda | B60L 3/0084 318/400.04 |
| 2015/0318705 | A1 | * | 11/2015 | Lucas | H02J 3/381 307/129 |
| 2016/0138946 | A1 | * | 5/2016 | Grau | G01D 5/48 342/361 |
| 2016/0268951 | A1 | * | 9/2016 | Cho | H02M 7/483 |
| 2017/0086281 | A1 | * | 3/2017 | Avrahamy | A01G 7/045 |
| 2017/0174085 | A1 | * | 6/2017 | Rozman | H02P 9/009 |
| 2018/0118040 | A1 | * | 5/2018 | Kim | H02J 7/025 |
| 2018/0145621 | A1 | * | 5/2018 | Aliprantis | H02P 21/22 |
| 2018/0172485 | A1 | * | 6/2018 | Lechner | G01D 18/00 |
| 2018/0183378 | A1 | * | 6/2018 | Tsubota | H02M 1/08 |
| 2019/0025052 | A1 | * | 1/2019 | Nee | G01D 5/00 |
| 2019/0052083 | A1 | * | 2/2019 | Lucas, Jr. | H02J 3/18 |
| 2019/0291898 | A1 | * | 9/2019 | Cameron | B64G 1/366 |
| 2019/0291899 | A1 | * | 9/2019 | Cameron | G01C 21/18 |
| 2019/0293429 | A1 | * | 9/2019 | Cameron | H02P 6/17 |
| 2019/0294200 | A1 | * | 9/2019 | Cameron | G06F 1/025 |
| 2019/0296761 | A1 | * | 9/2019 | Cameron | B64G 1/288 |
| 2020/0011708 | A1 | * | 1/2020 | Hess | H01F 21/06 |

OTHER PUBLICATIONS

Communication pursuant to Article 94(3) EPC dated Sep. 26, 2019 issued in related EP Application No. 19164022.6, pp. 1-5.

Cypress Semiconductor: "PSoC 5 TRM", Sep. 26, 2012, pp. 1-384.

(56) References Cited

OTHER PUBLICATIONS

Cypress: "Pulse Width Modulator (PWM) Component Datasheet", Rev. Oct. 18, 2018 (Oct. 18, 2018), pp. 1-5.
European Search Report dated Sep. 16, 2019 issued in related EP Application No. 19164022.6, pp. 1-3.
European Search Report dated Sep. 19, 2019 issued in related Application No. EP19164019, pp. 1-3.

* cited by examiner

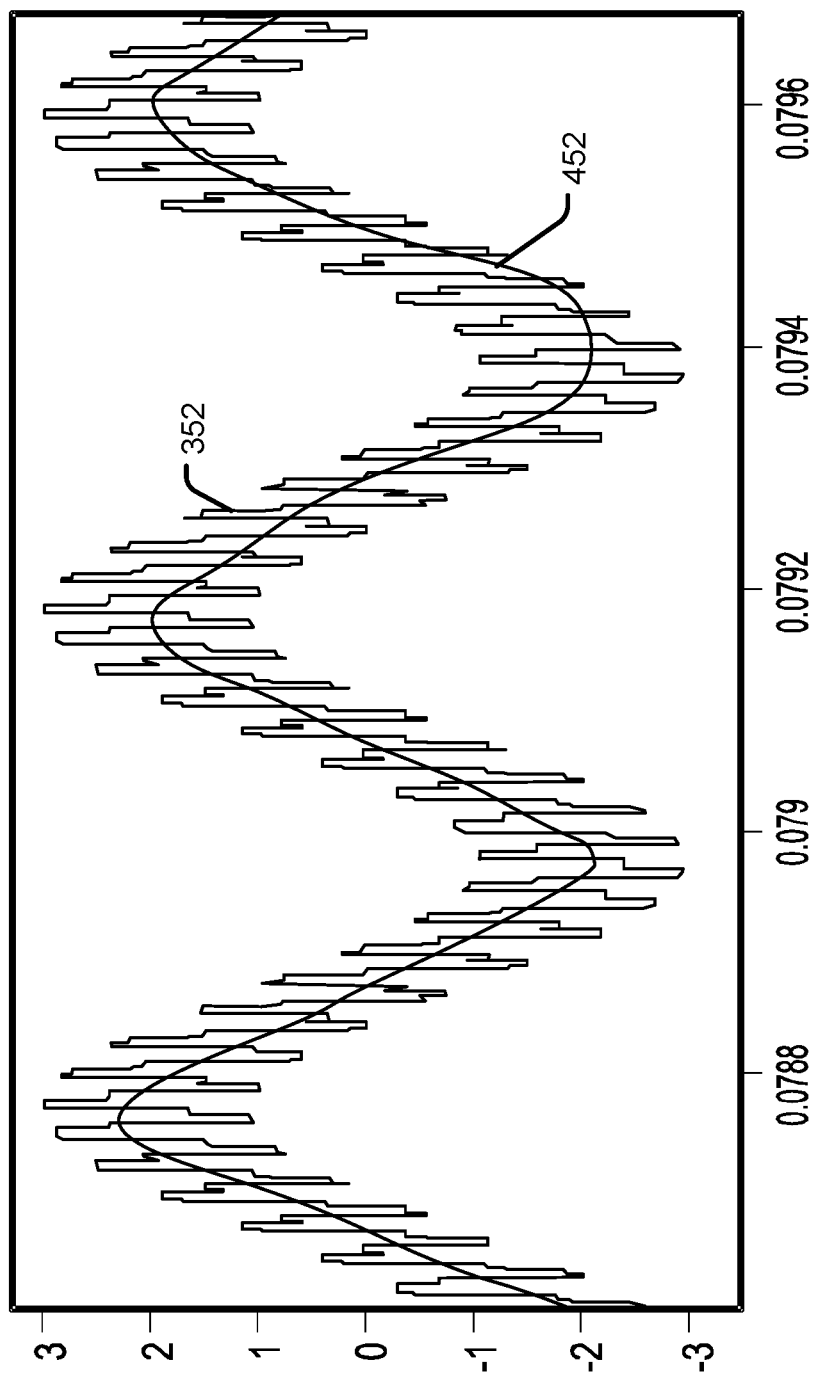
FIG. 23

SYSTEM AND METHOD FOR DEMODULATION OF RESOLVER OUTPUTS

FIELD OF THE DISCLOSURE

The present disclosure is generally related to demodulation of resolver outputs and gimbaled inertial measurement units.

BACKGROUND

A gimbaled inertial measurement unit is used for vehicle navigation and object tracking. The gimbaled inertial measurement unit includes multiple gimbals that each rotate along a single axis to position sensors along the vehicle's path. By using multiple gimbals, such as three or four gimbals, a vehicle's inertia can be monitored in multiple axes by the sensors and used for inertial navigation. Inertial navigation continuously calculates by dead reckoning the position, the orientation, and the velocity of a moving object without the need for external reference. Dead reckoning (or deductive reckoning) involves calculating the vehicle's current position by using a previously determined position and advancing that position based upon estimated speeds and headings.

Gimbaled inertial measurement units include additional sensors, such as resolvers, to determine a position of a motor that drives each of the multiple gimbals and positions the sensors that track the vehicle's inertia. A resolver is an analog sensor that is used to determine rotational position, such as an angle. The resolver receives an excitation signal and generates analog output signals which are converted to digital samples. The digital samples are used to determine a position of the motor and the gimbal. The position outputs determined from the output analog signals may lose precision during the conversion from analog to digital or from processing the digital samples into the angle outputs. Additionally, interference from current switching during operating the gimbal motors can add noise and errors. Reduced precision and errors accumulate over time in inertial navigation and can lead to incorrect data or navigation.

Complicated discrete solutions are often used to increase precision or bandwidth of the gimbaled inertial measurement units needed for mission or design requirements. However, these solutions do not generally provide increased precision and increased bandwidth simultaneously. Additionally, these solutions add complexity, cost, weight, and volume to vehicle design. In the context of flying vehicles (aircraft, spacecraft, etc.), weight and volume greatly increase cost and reduce performance.

SUMMARY

In a particular implementation, an apparatus includes a coarse resolver configured to output coarse position signals indicative of a coarse position of a drive shaft of a motor. The apparatus also includes a fine resolver configured to output fine position signals indicative of a fine position of the drive shaft of the motor. The apparatus further includes a control circuit. The control circuit is configured to receive the coarse position signals from the coarse resolver and the fine position signals from the fine resolver and generate an initial position output, based on the coarse position signals, that indicates an initial position of the drive shaft. The control circuit is further configured to generate a subsequent position output, based on the fine position signals, that indicates a subsequent position of the drive shaft.

In another particular implementation, a method of determining rotational position includes receiving coarse position signals from a coarse resolver and fine position signals from a fine resolver. The coarse position signals are indicative of a coarse position of a drive shaft of a motor, and the fine position signals are indicative of a fine position of the drive shaft of the motor. The method also includes generating an initial position output, based on the coarse position signals, that indicates an initial position of the drive shaft. The method further includes generating a subsequent position output, based on the fine position signals, that indicates a subsequent position of the drive shaft.

In yet another particular implementation, a non-transitory computer readable medium stores instructions that, when executed by a processor, cause the processor to receive coarse position signals from a coarse resolver and fine position signals from a fine resolver. The coarse position signals are indicative of a coarse position of a drive shaft of a motor, and the fine position signals are indicative of a fine position of the drive shaft of the motor. The instructions further cause the processor to generate an initial position output, based on the coarse position signals, that indicates an initial position of the drive shaft and to generate a subsequent position output, based on the fine position signals, that indicates a subsequent position of the drive shaft.

In a particular implementation, a pulse-width modulation control circuit includes a first transistor and a signal generator. The first transistor includes a first terminal coupled to a power source and a second terminal coupled to a first input of a controlled component. The signal generator includes a first node coupled to a gate of the first transistor. The signal generator is configured to receive a comparison value and a comparison criterion and to compare the comparison value to a counter value based on the comparison criterion. In response to the comparison value satisfying the comparison criterion with respect to the counter value, the signal generator is configured to send a control signal to the gate of the first transistor to generate a pulse edge of a pulse of a pulse-width modulated signal.

In another particular implementation, a system includes a motor and a pulse-width modulation control circuit coupled to the motor. The pulse-width modulation control circuit is configured to output a pulse-width modulated signal to the motor. The pulse-width modulation control circuit includes a first transistor and a signal generator. The first transistor includes a first terminal coupled to a power source and a second terminal coupled to a first input of the motor. The signal generator includes a first node coupled to a gate of the first transistor. The signal generator is configured to receive a comparison value and a comparison criterion and to compare the comparison value to a counter value based on the comparison criterion. In response to the comparison value satisfying the comparison criterion with respect to the counter value, the signal generator is configured to send a control signal to the gate of the first transistor to generate a pulse edge of a pulse of the pulse-width modulated signal.

In yet another particular implementation, a method of pulse-width modulation includes receiving a comparison value and a comparison criterion and includes comparing the comparison value to a counter value based on the comparison criterion. The method further includes, in response to the comparison value satisfying the comparison criterion with respect to the counter value, sending a control signal to a gate of a first transistor to generate a pulse edge of a pulse of a pulse-width modulated signal.

In a particular implementation, feedback control circuitry includes rate limiter circuitry configured to generate a rate limited position command based on a position command for a controlled component and based on a speed command for the controlled component. The feedback control circuitry also includes error adjustment circuitry configured to apply a control gain to an error signal to generate an adjusted error signal. The error signal is based on position feedback and the rate limited position command, and the position feedback indicates a position of the controlled component. The feedback control circuitry further includes an output terminal configured to output a current command generated based on the adjusted error signal.

In another particular implementation, a system includes a motor and feedback control circuitry coupled to the motor. The feedback control circuitry includes rate limiter circuitry configured to generate a rate limited position command based on a position command for the motor and based on a speed command for the motor. The feedback control circuitry also includes error adjustment circuitry configured to apply a control gain to an error signal to generate an adjusted error signal. The error signal is based on position feedback and the rate limited position command, and the position feedback indicates a position of the motor. The feedback control circuitry further includes an output terminal configured to output a current command generated based on the adjusted error signal.

In yet another particular implementation, a method for feedback control includes receiving a position command for a controlled component and a speed command for the controlled component and includes generating a rate limited position command based on the speed command and the position command. The method also includes receiving position feedback indicating a position of the controlled component and applying a control gain to an error signal to generate an adjusted error signal. The error signal is based on the position feedback and the rate limited position command. The method further includes outputting a current command based on the adjusted error signal.

In a particular implementation, demodulation circuitry includes an input terminal configured to be coupled to an analog-to-digital converter (ADC) and configured to receive a plurality of ADC outputs. The plurality of ADC outputs are generated based on resolver outputs. The demodulation circuitry also includes a rectifier configured to rectify the plurality of ADC outputs. Rectifying the plurality of ADC outputs preserves a phase of the plurality of ADC outputs. The demodulation circuitry includes amplitude determination circuitry configured to determine, based on the rectified plurality of ADC outputs, demodulated amplitude values corresponding to the resolver outputs. The demodulation circuitry further includes angle computation circuitry configured to generate position outputs based on the demodulated amplitude values.

In another particular implementation, a system includes a resolver, an ADC coupled to the resolver, and demodulation circuitry coupled to the ADC. The demodulation circuitry is configured to generate demodulated resolver outputs and includes an input terminal configured to be coupled to the ADC and configured to receive a plurality of ADC outputs. The plurality of ADC outputs are generated based on resolver outputs. The demodulation circuitry also includes a rectifier configured to rectify the plurality of ADC outputs. Rectifying the plurality of ADC outputs preserves a phase of the plurality of ADC outputs. The demodulation circuitry includes amplitude determination circuitry configured to determine, based on the rectified plurality of ADC outputs, demodulated amplitude values corresponding to the resolver outputs. The demodulation circuitry further includes angle computation circuitry configured to generate position outputs based on the demodulated amplitude values.

In yet another particular implementation, a method of demodulating resolver outputs includes receiving, from an ADC, a plurality of ADC outputs. The plurality of ADC outputs are generated based on the resolver outputs. The method also includes rectifying the plurality of ADC outputs and rectifying the plurality of ADC outputs preserves a phase of the plurality of ADC outputs. The method includes determining, based on the rectified plurality of ADC outputs, demodulated amplitude values corresponding to the resolver outputs. The method further includes generating position outputs based on the demodulated amplitude values.

In a particular implementation, dither circuitry includes harmonic signal generation circuitry configured generate a high order even harmonic of a base excitation signal. The dither circuitry also includes a combiner configured to generate a dithered excitation signal based on the high order even harmonic and the base excitation signal. The dither circuitry further includes an output terminal configured to output the dithered excitation signal to a sensor device.

In another particular implementation, a system includes a resolver, a digital-to-analog converter (DAC) coupled to the resolver, and dither circuitry coupled to the DAC. The dither circuitry is configured to output a dithered excitation signal to the DAC. The dither circuitry includes harmonic signal generation circuitry configured generate a high order even harmonic of a base excitation signal. The dither circuitry also includes a combiner configured to generate the dithered excitation signal based on the high order even harmonic and the base excitation signal. The dither circuitry further includes an output terminal configured to output the dithered excitation signal to the resolver.

In yet another particular implementation, a method of generating an excitation signal for a sensor device includes generating a high order even harmonic of a base excitation signal. The method further includes generating a dithered excitation signal based on combining the high order even harmonic and the base excitation signal and outputting the dithered excitation signal to the sensor device.

BRIEF DESCRIPTION OF THE DRAWINGS

FIG. 23 is a diagram that illustrates an example of a dithered excitation signal;

DETAILED DESCRIPTION

Figure 1:
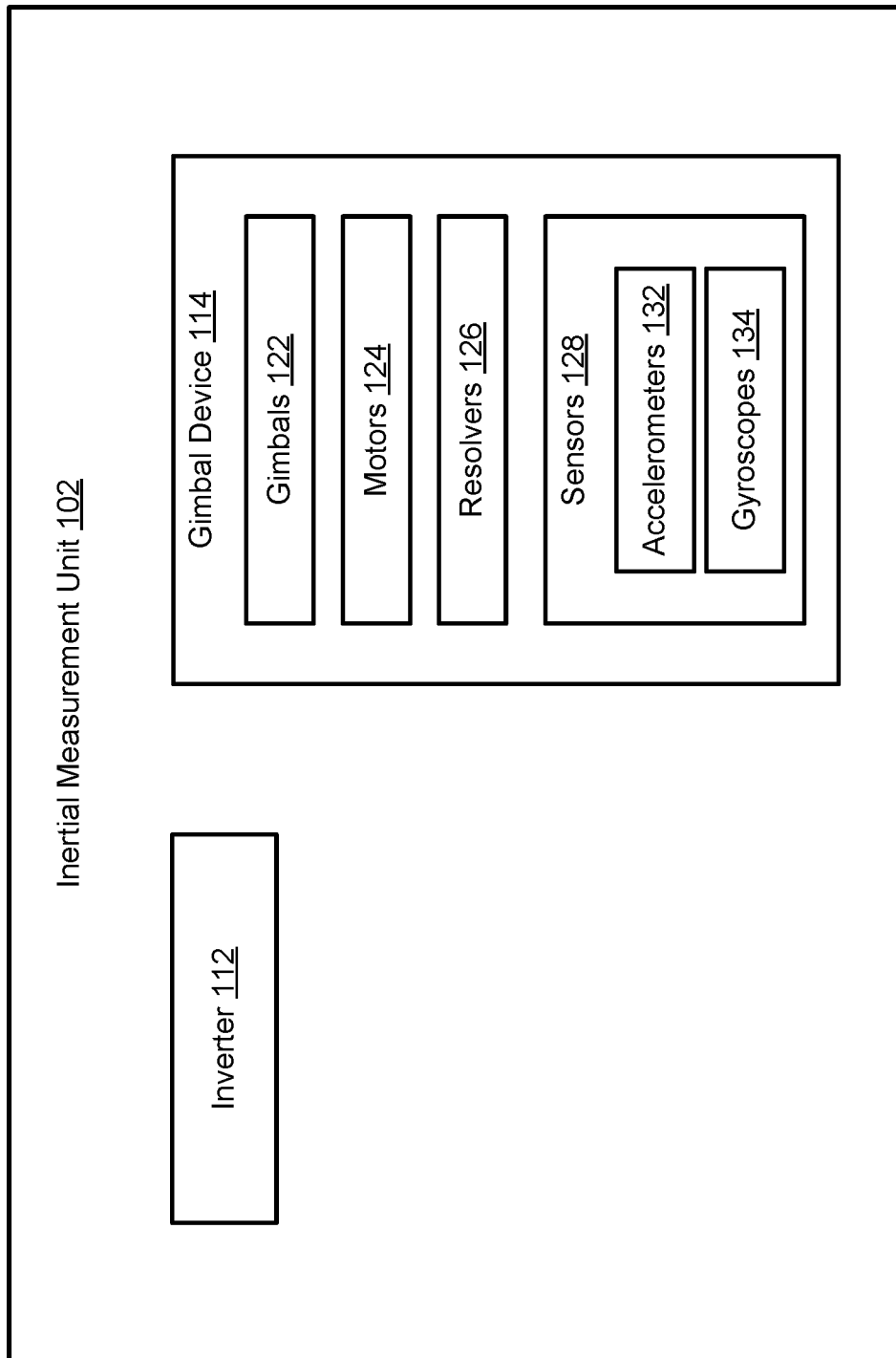
FIG. 1 is a diagram that illustrates an example of an inertial measurement unit.

Implementations disclosed herein are directed to gimbaled inertial measurement units. A gimbaled inertial measurement unit includes sensors, such as accelerometers and gyroscopes, to determine vehicle inertia data, such as linear acceleration and angular velocity. In a gimbaled inertial measurement unit, an inertial measurement unit is mounted on a multi-axis gimbal device. The gimbal device includes multiple gimbals each with a corresponding motor. The motors are used to drive and position the gimbals such that the sensors are oriented along the vehicle's path. A control system of the vehicle tracks the position of the vehicle based on outputs from the sensors as the gimbals move based on changes in inertia of the vehicle. The control system then outputs commands to the gimbaled inertial measurement unit to adjust (readjust) the sensors such that the sensors are oriented along the vehicle's updated path.

In some implementations, the gimbaled inertial measurement unit uses a dual speed resolver for determining a position of the motor (e.g., a drive shaft of the motor) and thereby a position the sensors attached to the corresponding gimbal. The dual speed resolver determines the position of the drive shaft of the motor using two resolvers each having a different "speed". A first resolver (e.g., a coarse resolver) may have a first speed that corresponds to a speed and a position (e.g., an absolute position) of the drive shaft. A resolver speed corresponds to a number of electrical cycles (e.g., a sine wave or a cosine wave) generated by a single mechanical revolution of the resolver. In a particular implementation, the first resolver is driven or rotated at the same rotational speed as the drive shaft, and thus an electrical cycle of the first resolver corresponds to a mechanical revolution of the drive shaft. Accordingly, the absolute position of the drive shaft can be determined from the first resolver.

A second resolver (e.g., a fine resolver) has a second speed that is greater than the first speed and that corresponds to a position of the drive shaft. For example, the second resolver may include multiple poles (e.g., pairs of coils) which generate multiple electrical cycles (e.g., sine waves) for a single mechanical revolution of the resolver (and the drive shaft). Alternatively, the second resolver may complete multiple mechanical revolutions for each revolution of the drive shaft. As compared to the first resolver (e.g., the coarse resolver), the second resolver (the fine resolver) has increased precision at the expense of not being able to determine a starting position (e.g., an absolute starting position). The second resolver can determine a more precise location of the drive shaft, but is unable to determine in which quadrant of a 360 degree rotation the drive shaft is in.

Dual speed resolvers (or dual resolvers) use outputs of both resolvers to determine a position of the drive shaft. For example, in conventional dual speed resolvers, outputs of both resolvers are input into a Kalman Filter to increase precision over a single resolver. However, the output of the coarse resolver has less accuracy and precision than the fine resolver and utilizing both the coarse and fine outputs reduces the accuracy and precision of the dual resolver to less than the accuracy of the fine resolver. By using the coarse resolver outputs to determine a starting position (e.g., during an initialization process or time period) and the fine resolver outputs to determine subsequent positions (e.g., positions after the initialization process or time period), the accuracy and precision of the dual speed resolver is increased over conventional dual speed resolvers. Such a dual speed resolver can be used to determine the absolute starting position and have the accuracy and precision of the fine resolver. Additionally, the fine resolver outputs can further be used to correct for a starting offset (error) of the coarse resolver. Furthermore, other methods described herein can be combined to further increase the accuracy and precision of the dual speed resolver.

As explained above, a resolver receives excitation signals and in response generates an output signal. By adding dither (e.g., zero mean dither) to the excitation signal, the precision of the angle determined from the resolver output is increased without increasing a speed of the resolver (e.g., a number of poles of the resolver) or a bandwidth (e.g., a sampling frequency of outputs of the resolver or a number of bits of the resolver outputs) of the processing circuitry. Zero mean dither includes or corresponds to noise that does not alter a median amplitude value of the base excitation signal. Additionally, by time coordinating the dithered excitation signal with current drive switching signals of the gimbal motors, the dithered excitation signal can produce outputs that have less noise and interference. Accordingly, the precision of the angle determined from the resolver output is increased without increasing a speed of the resolver or a bandwidth of the processing circuitry.

As explained above, resolver outputs are converted to digital samples by an analog-to-digital converter (ADC) and the digital samples are demodulated during processing to determine the angle of the resolver and the drive shaft. During demodulation, the digital samples are rectified to produce a rectified signal. In some implementations, the digital samples are rectified such that a phase of the excitation signal is preserved in the rectified signal. For example, conventional demodulators multiply the digital samples by the excitation signal to preserve the phase of when rectifying the digital samples. However, multiplying the digital samples by the excitation signal generates noise. To illustrate, multiplying sine values of angles together reduces accuracy of the data between peaks of the sine waves, i.e., it squares any noise or errors.

Rectifying the digital samples with a square wave improves a signal to noise ratio of off the data between peaks of the sine waves i.e., off peak voltages. Additionally, by flipping a sign of the square wave in accordance with the phase of the excitation signal, the phase of the digital samples and excitation signal can be preserved without imparting additional noise or reducing the signal to noise ratio. Accordingly, the precision of the angle determined from the resolver output is increased without increasing a speed of the resolver or a bandwidth of the processing circuitry.

Additionally, recursive median value analysis and masking portions of the data further increases precision during demodulation. Recursive median value analysis may be applied to the input digital samples and to the output amplitudes of the demodulator to further increase precision. For example, the demodulator may use a median value (a midvalue) of the last n input samples as the input value, where n is any integer greater than 1. As another example, the demodulator may output a midvalue of the last m output samples, where m is any integer greater than 1. Additionally or alternatively, the demodulator may output a midvalue of 3 different signals as the output value. The output value is used to determine the angle of the resolver and the drive shaft.

In some implementations, the demodulator masks portions of the data to eliminate noise and interference, which further increases precision of the gimbaled inertial measurement. The masked portion includes noisy data (data occurring during current drive switching and including current drive interference), data corresponding to a transition between peak amplitudes, or both. Thus, the demodulation improves results by using data near peak amplitudes of the excitation signal. Additionally or alternatively, demodulation outputs are based on a synced (synced with the excitation signal) accumulator output to further increase precision and reduce errors. For example, by synching the accumulator with the excitation signal that is time coordinated with current drive signals, the outputs of the accumulator can mask at least a portion of the current drive interference, average out the effects of the current drive interference, or both, leading to increased precision and accuracy.

The gimbaled inertial measurement unit also includes a feedback control system to control the gimbal motors. Gimbal motors are usually commanded or controlled by a direct rate command or a position command and a rate command. These commands may be received from user input or a vehicle's controller (e.g., a flight computer). Feedback control systems generally use a cascaded (e.g., multi-loop) tracking control law to process the position command and the rate command and to provide feedback. By using a combined rate and position feedback system (e.g., a single loop feedback system), lightly damped gimbal motors can be used with tight rate gains to achieve greater precision.

A pulse-width modulator (PWM) is used to drive the gimbal motors. The PWM controls activation of the gimbal motors based on the feedback control system. For example, when the gimbal motors correspond to 3-phase motors, the PWM controls the power delivery to the gimbal motors based on current commands generated by the feedback control system. To illustrate, the current commands are converted in a duty cycle value or signal. For example, the current commands are indicative of an amount of current to be provided to the motor. The duty cycle value (e.g., 50 percent) is determined based on the amount of current and a voltage of the power supply or motor. The duty cycle signal (e.g., a set point signal) indicates the duty cycle value. To illustrate, for an 8 bit duty cycle signal a value of 31 or 32 may indicate 50 percent duty cycle depending on which comparison condition is used. The duty cycle signal is sent to the PWM which generates pulses. A width of the pulses controls power delivery to the gimbal motors.

The PWM generates the pulses based on comparing a counter value to a comparison value (indicative of a duty cycle value, such as 50 percent, 51 percent, etc.). For example, the PWM generates pulses based on determining whether the counter value is greater than or less than the comparison value. To illustrate, the PWM generates a first pulse edge (e.g., activates a gate of a transistor) of a pulse when the counter value is greater than the comparison value and generates a second pulse edge (e.g., deactivates the gate of the transistor) of the pulse when the counter value is no longer greater than (does not exceed) the comparison value.

In conventional PWMs, increasing a precision or reducing granularity of control adjustment requires increasing an operating frequency of PWM components.

By utilizing an adjustable comparison criterion, PWM precision of control can be increased and control granularity can be reduced without increasing the operating frequency of the PWM components. The adjustable comparison criterion may be indicated by a set point signal. The adjustable comparison criterion includes other comparison conditions or rules, such as a greater than or equal to condition and a less than or equal to condition. PWM's utilize up-down counters which generate a counter signal that is a triangle wave. Thus, when adjusting the comparison value by one counter value (clock pulse), the PWM generate a first pulse one clock pulse earlier and a second pulse one clock pulse later, leading to an increase in pulse-width of two clock pulses. However, when adjusting the comparison criterion, the PWM can generate a first pulse one clock pulse earlier and a second pulse at the same time, leading to an increase in pulse-width of one clock pulse. Accordingly, by using an adjustable comparison criterion, a PWM has increased precision and reduced granularity of control adjustment of the motor without increasing an operating frequency of PWM components.

By utilizing one or more of the above improvements, a gimbaled inertial measurement unit can offer greater precision in a smaller footprint over conventional gimbaled inertial measurement units. Additionally, the gimbaled inertial measurement unit can achieve the increased precision without increasing hardware capability. Accordingly, the gimbaled inertial measurement unit enables a vehicle to inertial navigate safer due to the increased precision. Additionally, vehicles using the gimbaled inertial measurement unit may be smaller and lighter, leading to lower costs.

Figure 2:
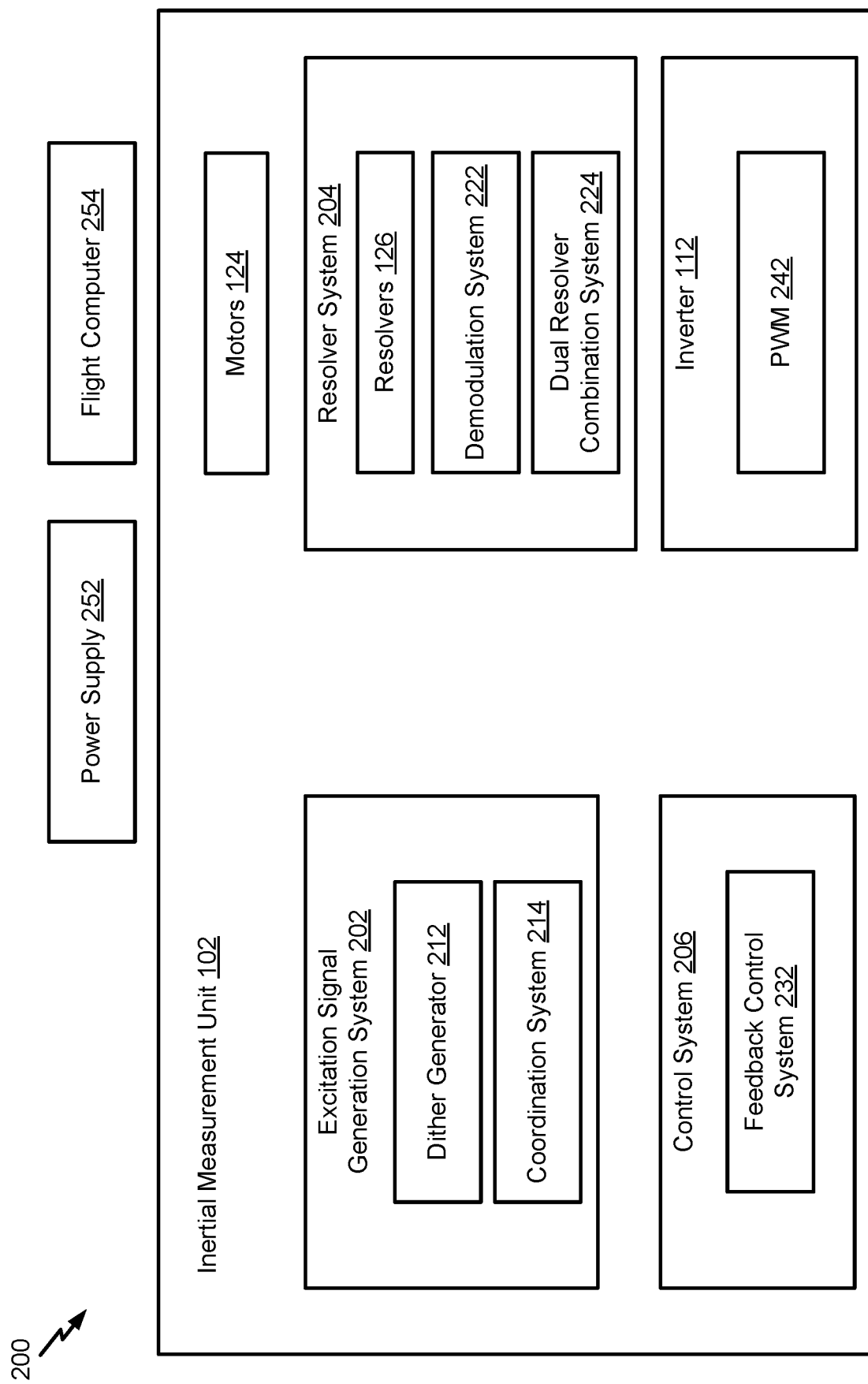
FIG. 2 is a diagram that illustrates an example of systems of the inertial measurement unit.
Figure 41:
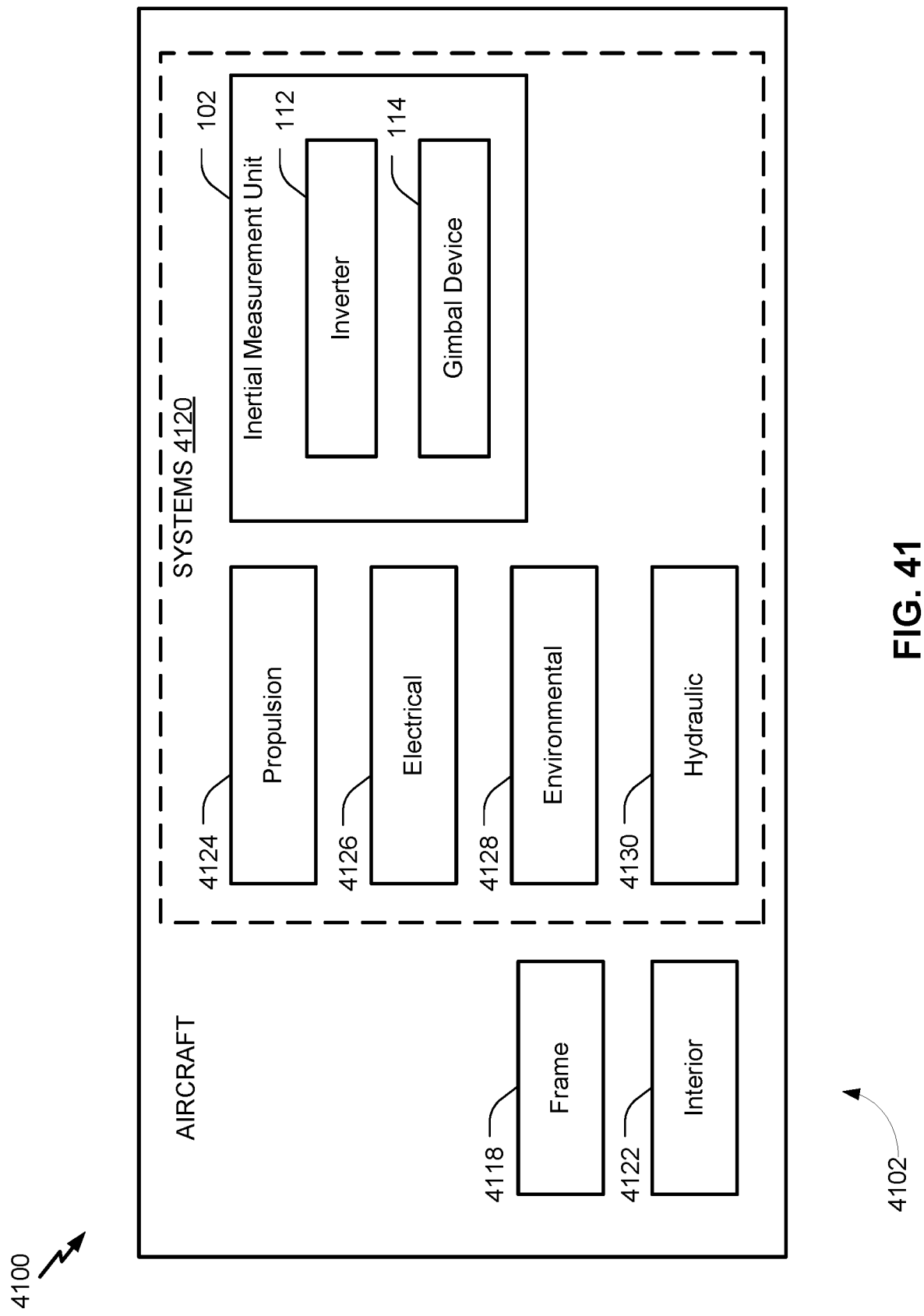
FIG. 41 is a block diagram that illustrates an example of an aircraft including an inertial measurement unit.

FIG. 1 is a diagram 100 that illustrates an example of an inertial measurement unit 102, such as a gimbaled inertial measurement unit. In some implementations, the inertial measurement unit 102 is included in a vehicle (e.g., a ship, a submarine, an aircraft, a rocket, a satellite, a spacecraft, etc.) and is coupled to control system thereof, as shown in FIGS. 2 and 41.

The inertial measurement unit 102 includes an inverter 112 and a gimbal device 114. The inverter 112 includes inverter electronics and firmware. The inverter 112 is configured to receive direct current (DC) power, convert the DC power to alternating current (AC) power, and provide the AC power to the gimbal device 114. For example, the inverter 112 is configured to provide power to control operation of the motors 124 of the gimbal device 114. The inverter electronics may include or correspond to a processor, a field programmable gate array (FPGA), an application specific integrated circuit (ASIC), or a combination thereof. The firmware is configured to control operation of the inverter electronics. In some implementations, the inverter electronics and firmware include or correspond to a PWM, such as the PWM 242 of FIG. 2, configured to control power delivery (e.g., current drive switching) to the motors 124.

The gimbal device 114 includes or corresponds to a multi-axis gimbal or a set of gimbals 122. The gimbal device 114 is configured to point the sensors 128 relative to a path of the vehicle. In some implementations, the gimbal device 114 includes a three axis gimbal. In a particular implementation, the three axis gimbal includes a ball (e.g., a first axis gimbal 122), an inner shell (e.g., a second axis gimbal 122), and an outer shell (e.g., a third axis gimbal 122). In other implementations, the gimbal device 114 includes a two gimbal system or a four gimbal system.

The gimbal device 114 includes the motors 124. Each motor 124 is configured to drive or control a position of a corresponding gimbal 122 of the gimbal device 114 to orient the sensors 128 attached to the corresponding gimbal 122 in line with the path of the vehicle. The motors 124 may include or correspond to electric motors, such as a brushed electric motor or brushless electric motor.

The gimbal device 114 includes multiple resolvers 126. Each resolver 126 is configured to determine a position of a corresponding gimbal 122 of the gimbal device 114 such that the sensors 128 attached to the corresponding gimbal 122 can be oriented in line with the path of the vehicle. For example, each resolver 126 is coupled to a drive shaft of a corresponding motor 124 and outputs of each resolver 126 are used to determine a position of the drive shaft, and thus the position of the corresponding gimbal 122 and set of sensors 128.

The sensors 128 include accelerometers 132 and gyroscopes 134. The accelerometers 132 are configured to determine linear acceleration and the gyroscopes 134 are configured to determine angular velocity. For example, the accelerometers 132 and gyroscopes 134 generate sensor data indicative of linear acceleration and angular velocity or changes in linear acceleration and angular velocity. In some implementations, each gimbal 122 includes a set of sensors 128. Each set of sensors 128 includes one or more accelerometers 132 and one or more gyroscopes 134.

In some implementations, the sensors 128 further include magnetometers. In a particular implementation, each gimbal 122 of the gimbal device 114 further includes a magnetometer. The magnetometers are configured to detect a direction, a strength, or relative change of a magnetic field. Outputs of the magnetometers can be used to determine heading and/or position of the vehicle.

During operation of the vehicle, the vehicle may change its direction (e.g., a path, heading, or course). For example, the vehicle may change its direction from a first direction (e.g., an original direction) to a second direction (e.g., an updated direction). In response to the vehicle changing directions to the second direction, the inertial measurement unit 102 positions (e.g., repositions) the gimbals 122 of the gimbal device 114 to orient (e.g., point) the sensors 128 attached to the gimbals 122 along the second direction (e.g., the vehicle's current path or heading). The inertial measurement unit 102 positions the gimbals 122 of the gimbal device 114 based on the sensor data generated by the sensors 128 when the vehicle changed from the first direction to the second direction.

The vehicle may change its direction again. For example, the vehicle may change its direction from the second direction to a third direction. In response to the vehicle changing direction for the second time, the inertial measurement unit 102 positions (e.g., repositions) the gimbals 122 of the gimbal device 114 to orient (e.g., point) the sensors 128 attached to gimbals 122 along the third direction (e.g., the vehicle's current path). The inertial measurement unit 102 positions the gimbals of the gimbal device 114 based on the sensor data generated by the sensors 128 when the vehicle changed from the second direction to the third direction. Although, the above examples utilize a change in direction, the gimbal device 114 can sense any change in inertia (such as a change in speed along the same direction or heading) of the vehicle and the inertial measurement unit 102 can position the gimbal device 114 responsive to the change in inertia of the vehicle. The inertial measurement unit 102 and components thereof are described further with respect to subsequent figures.

FIG. 2 illustrates a diagram 200 of an example of systems of the inertial measurement unit 102 of FIG. 1. In the diagram 200, the gimbal device 114 is not shown for clarity. In the particular example illustrated in FIG. 2, the inertial measurement unit 102 includes an excitation signal generation system 202, a resolver system 204, and a control system 206. Each of these systems, or subsystems thereof, improve the function of the inertial measurement unit 102 individually and in combination with the other systems, as will be described in more detail in subsequent figures. Additionally, the inertial measurement unit 102 includes the inverter 112 and the motors 124 described with reference to FIG. 1.

The inertial measurement unit 102 and components thereof may be coupled to other equipment of the vehicle. As illustrated in FIG. 2, the inertial measurement unit 102 and components thereof are coupled to a power supply 252 and a flight computer 254. In some implementations, the power supply 252 corresponds to a DC power supply of the vehicle, such as a battery or a generator. In other implementations, the power supply 252 may be included in the inertial measurement unit 102, e.g., as an internal battery. The flight computer 254 may include or correspond to a flight control computer (FCC) or a guidance system configured to control the vehicle, such as cause a change in the course or direction of the vehicle responsive to user input or autonomously.

The excitation signal generation system 202 is configured to generate excitation signals and to output the excitation signals to the resolver system 204. The excitation signals are configured to cause the resolvers 126 to generate output signals indicative of a position of a drive shaft of the corresponding motor 124, as described further with reference to FIG. 4.

The excitation signal generation system 202 includes a dither generator 212 and coordination system 214. The dither generator 212 is configured to generate and add dither to the excitation signal (base excitation signal) to generate a dithered excitation signal. The dithered excitation signal enables more precise demodulation and more precise gimbal/motor control, which leads to better sensor outputs and increased precision of the inertial measurement unit 102, as described further with reference to FIGS. 22-29.

The coordination system 214 is configured to coordinate the excitation signal (or dithered excitation signal) with current drive switching of the motors 124 to generate a coordinated excitation signal (or coordinated dithered excitation signal). To illustrate, turning on and off transistors which provide power to the motors 124 may generate spikes, positive and negative spikes respectively. Waves of the excitation signal may be coordinated with (e.g., offset from) current drive switching such that a same number of transitions from off to on and from on to off occur during each wave. Additionally, the current drive switching may be offset from peak amplitudes of the waves of the excitation signal. The coordinated excitation signal reduces noise and contamination of resolver outputs, which leads to better sensor outputs and increased precision of the inertial measurement unit 102.

The resolver system 204 is configured to generate resolver outputs indicative of a position of the drive shafts of the motors 124 responsive to the excitation signals. The resolver outputs are analog signals which are converted to digital samples by an ADC and processed to determine a position (an angle) of the drive shaft. The resolver system 204 includes the resolvers, 126, a demodulation system 222, and a dual resolver combination system 224.

The demodulation system 222 is configured to demodulate the digital samples output by the ADC, as described further with reference to FIGS. 7-17. In some implementations, the demodulation system 222 performs recursive median value analysis to reduce or eliminate spikes in the digital samples input to the demodulation system 222, such as spikes caused by current drive switching and other interference. Additionally or alternatively, the demodulation system 222 includes an accumulator to reduce or eliminate spikes in the demodulation output of the demodulation system 222. The accumulator may also preform recursive median value analysis and masking (e.g., filtering) noisy data to reduce or eliminate spikes in the demodulation output.

Figure 18:
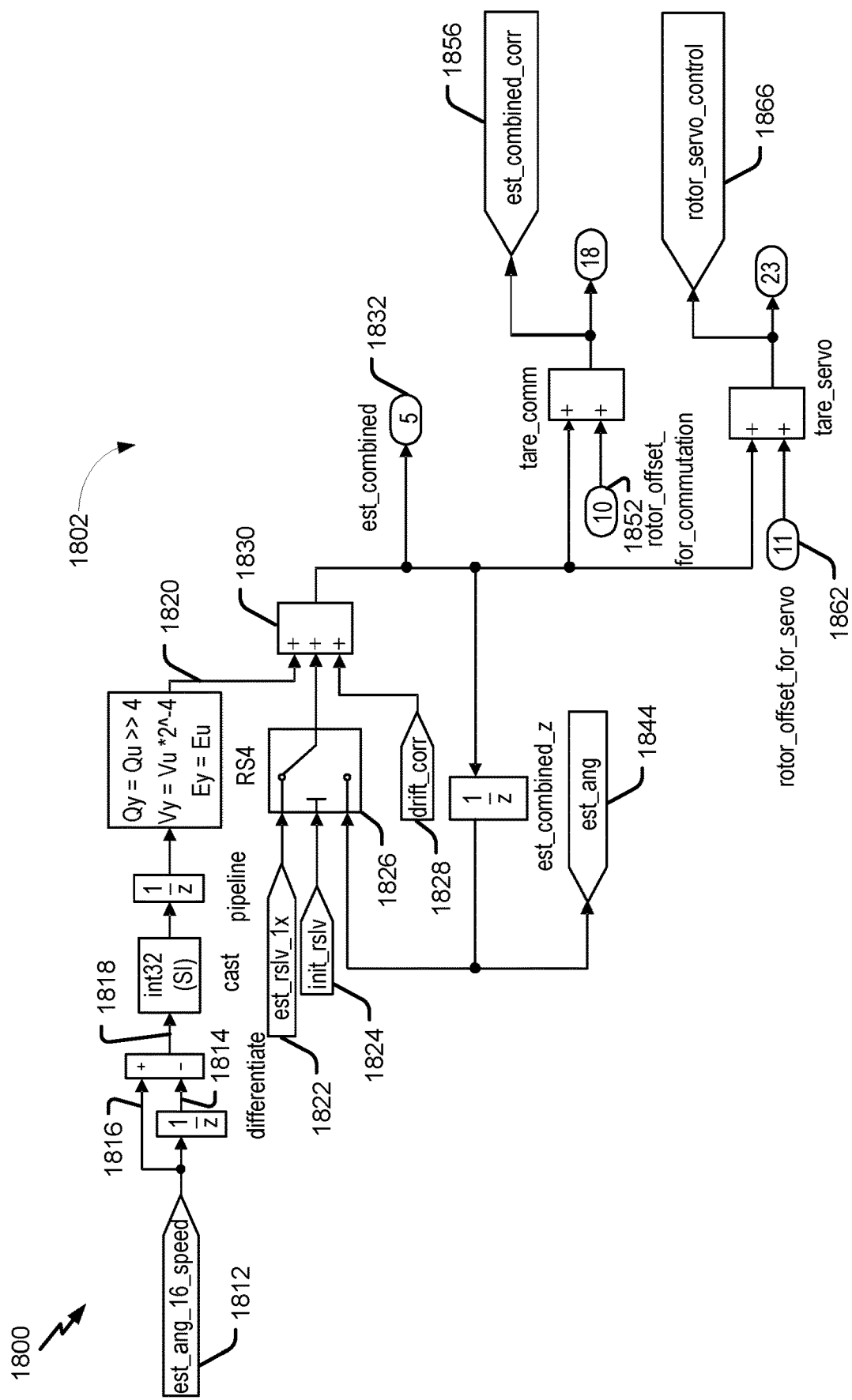
FIG. 18 is a logic diagram that illustrates an example of logic for combining resolver outputs of a dual speed resolver.
Figure 19:
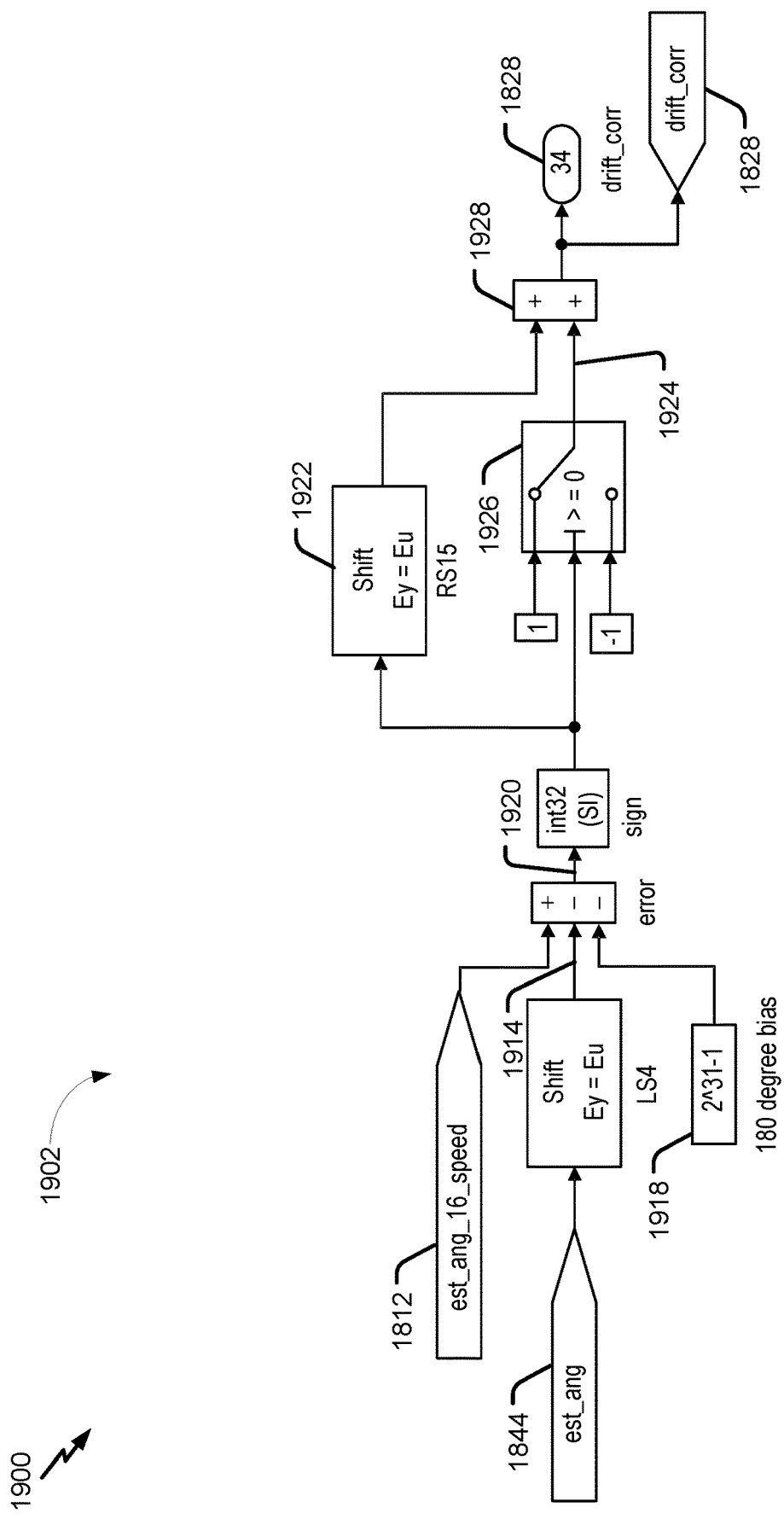
FIG. 19 is a logic diagram that illustrates an example of logic for a drift corrector of a dual speed resolver.

The dual resolver combination system 224 is configured to generate angle estimations based on the demodulation outputs and to combine angle estimations from each resolver to determine the positions of the drive shafts, as described further with reference to FIGS. 18 and 19. The dual resolver combination system 224 uses the coarse resolver to determine a starting position of the drive shaft during an initialization process (e.g., an initialization mode). The starting position corresponds to an initial position of the drive shaft in absolute terms (0 to 360 degrees). The dual resolver combination system 224 uses the more accurate and precise fine resolver outputs for determining subsequent positions of the drive shafts after the initialization process. In some implementations, the dual resolver combination system 224 includes a drift corrector to correct for drift. The drift corrector may use the fine resolver outputs to correct for an initial error (offset) of the starting position determined by the coarse resolver and to correct for integration errors of the fine resolver outputs.

The control system 206 includes a feedback control system 232. The feedback control system 232 is configured to receive flight control inputs from the flight computer 254, position feedback from the resolver system 204, and speed feedback (e.g., revolutions per minute (RPM) feedback) from the resolver system 204. The position feedback is indicative of a position (angle) of the motors 124 and the speed feedback is indicative of a rate, such as a rate of the motor in RPM.

The flight control inputs include a speed command (e.g., RPM command), a position command, or both. The feedback control system 232 generates a current command based on the flight control inputs, the position feedback, and the speed feedback, as described further with reference to FIGS. 30 and 31. The control system 206 converts the current command into a duty cycle setting or value used to control the motors 124. In some implementations, the duty cycle setting is indicated by a set point signal that indicates a comparison value and a comparison criterion.

The inverter 112 includes a PWM 242 configured to apply adjustable comparison criteria. The PWM is configured to receive the comparison value and one or more comparison criteria and to generate pulses of a pulse-width modulated signal based on the comparison value and one or more comparison criteria, as described with reference to FIGS. 33-35. The pulse-width modulated signal has increased precision or reduced granularity of control and is used to more precisely provide power from the power supply 252 to the motors 124. Operation of the inertial measurement unit 102 of FIG. 2 is described with reference to FIG. 3.

Figure 3:
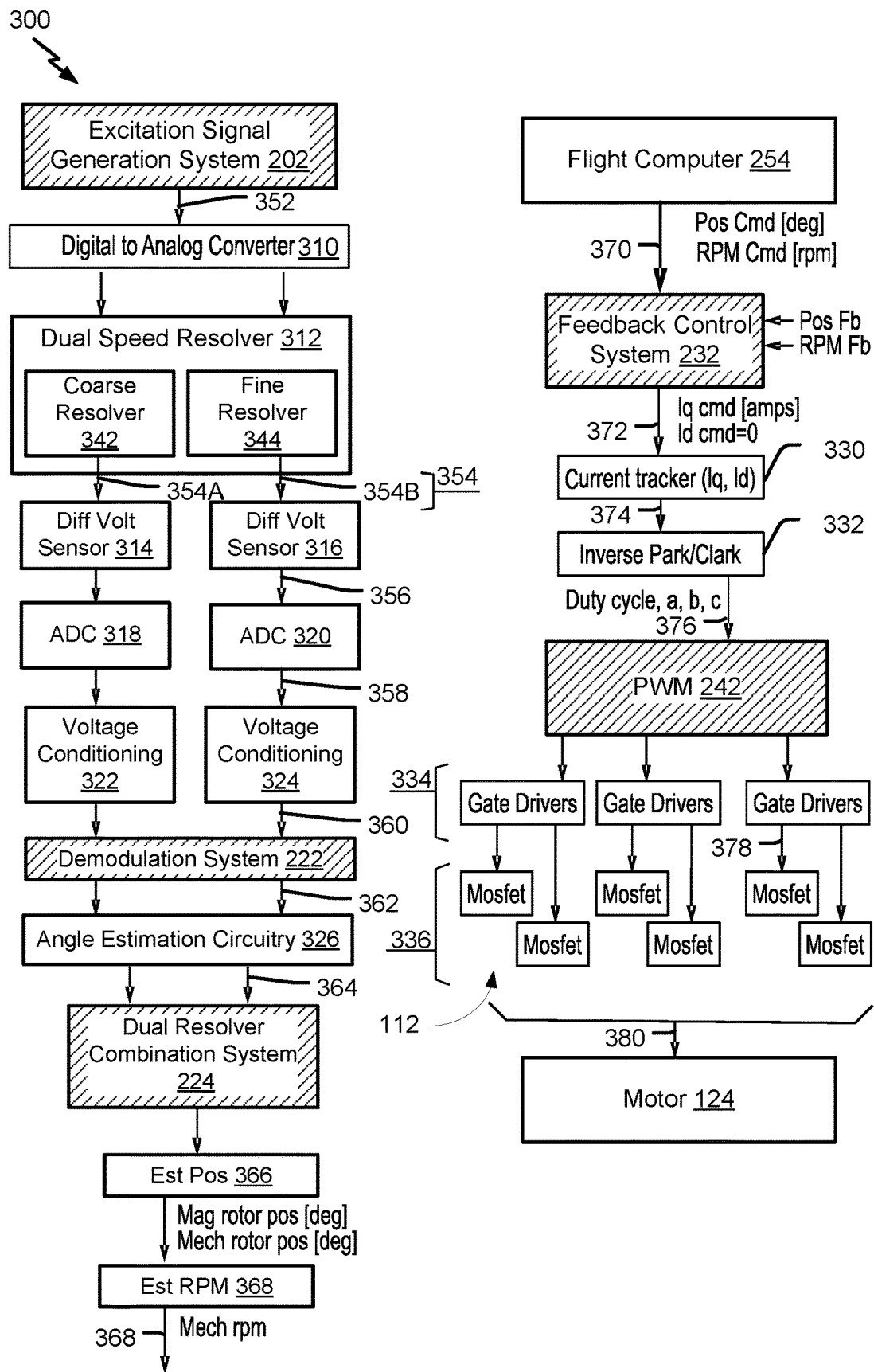
FIG. 3 is a diagram that illustrates an example of operation of the inertial measurement unit.

FIG. 3 is a diagram 300 that illustrates an example of operation of the inertial measurement unit 102. Diagram 300 corresponds to operation of a single motor 124 of the inertial measurement unit 102 and which positions the sensors 128 of a particular gimbal 122 (corresponding to the motor 124) of the gimbal device 114. In FIG. 3, cross hatching denotes operations or steps that may be time coordinated with each other. The time coordination can be achieved by using the same clock or counter, by synchronizing two or more clocks or counters, by offsetting two or more clocks or counters, or a combination thereof, as described further with reference to FIGS. 27 and 28.

During operation of the inertial measurement unit 102, the excitation signal generation system 202 generates a dithered excitation signal 352, coordinates the dithered excitation signal with other components of the inertial measurement unit 102 (such as one or more cross hatched components), and provides the dithered excitation signal 352 to a digital-to-analog converter (DAC) 310. The DAC 310 converts the dithered excitation signal 352 into an analog signal and provides the analog dithered excitation signal 352 to each resolver 342, 344 of the dual speed resolver 312. For example, the dual speed resolver 312 includes a 1 speed resolver and 16 speed resolver. Each resolver 342, 344 generates an output, such as a differential voltage output 354. For example, as illustrated in FIG. 3, the coarse resolver 342 outputs differential voltage output 354A (i.e., coarse position signals indicative of a course position) and the fine resolver outputs differential voltage output 354B (i.e., fine position signals indicative of a fine position).

The differential voltage outputs 354 are measured by corresponding differential voltage sensors 314, 316 to generate differential voltage signals 356. The differential voltage signals 356 generated by the differential voltage sensors 314, 316 are sampled by corresponding ADCs 318, 320. The ADCs 318, 320 output digital samples of voltage values (referred to as ADC outputs 358) to voltage conditioning circuitry 322, 324 which correct for a voltage bias of the inertial measurement unit 102. The conditioned voltage values 360 are demodulated by the demodulation system 222 to generate demodulated outputs 362. Angle estimation circuitry 326 generates angle estimates 364 for both resolvers from the demodulated outputs 362. The angle estimates 364 are used to generate an estimated position 366 of the motor, such as an initial position and subsequent positions of the motor, based on the demodulated outputs 362. One or more estimated positions 366 are used to determine an estimated RPM 368 of the motor. Additionally, the estimated positions 366 may be adjusted (tared) to account for the motor 124, such as to account for commutation and servo offset. Adjusting (taring) the estimated positions 366 generates a magnetic rotor position and a mechanical rotor position, such as tared position outputs. The estimated RPM 368 may be determined based further on the magnetic rotor position and the mechanical rotor position. The estimated position 366 and the estimated RPM 368 of the motor 124 are provided to the feedback control system 232 to be used as feedback, i.e., position feedback and RPM feedback, for controlling the motor 124.

The feedback control system 232 receives commands 370 from the flight computer 254, such as a position command and an RPM command. The feedback control system 232 generates a rate limited position command based on the position command and the RPM command. The feedback control system 232 generates a current command 372 based on the rate limited position command, the position feedback, and the RPM feedback. The current command 372 may correspond to a torque command or indicate an amount of torque of the motor 124. The current command 372 is provided to a current tracker 330 to generate a duty cycle value 374. The duty cycle value 374 may be in terms of a two phase reference frame (e.g., a two phase reference frame of direct and quadrature, with quadrature corresponding to torque). An inverse Park/Clark transformation 332 can be applied to the duty cycle value 374 to convert the duty cycle value 374 to one or more duty cycle settings 376 for a three phase motor, such as a duty cycle in terms of A, B, and C lanes (phases) of the three phase motor. The one or more duty cycle settings 376 (e.g., set point signals) are sent to the PWM 242.

The PWM 242 receives the one or more duty cycle settings 376, each duty cycle setting 376 indicating a comparison value and two comparison criteria. The PWM 242 may receive one duty cycle setting 376 for each lane (A, B, and C) or may receive one duty cycle setting 376 for a particular lane and generate duty cycle settings 376 for each other lane based on the received duty cycle setting 376. The PWM 242 controls gate drivers 334 of transistors 336 (metal-oxide-semiconductor field-effect transistors (MOSFETs)) of the inverter 112 based on the comparing the comparison value to a counter value based on the two comparison criteria for each lane.

The PWM 242 is configured to generate (or cause the gate drivers 344 to generate) pulse-width modulated signals 378. The PWM 242 generates pulses (a pulse for each comparison criteria) of the pulse-width modulated signals 378 for each lane, and the pulses activate and deactivate the transistors 336 (i.e., current drive switching). By activating the gate drivers 334, the PWM 242 controls power delivery from the power supply 252 to the motors 124. The PWM 242 and the inverter 112 convert the DC power from the power supply 252 into three phase AC power signals 380 with increased precision for controlling the motors 124.

FIGS. 4A-4C illustrate example operation of a resolver. FIG. 4A illustrates a diagram of an example of a transformer 402, two coils 412, 414 of wire (referred to as "windings") wrapped around a magnetic core. A change in current applied to an input coil 412 creates a varying magnetic flux and varying magnetic field at an output coil 414. The varying magnetic field at the output coil 414 induces voltage in the output coil 414. A resolver operates using a rotatable transformer and outputs induced voltage.

FIG. 4B illustrates a diagram of an example of a resolver 404. The resolver 404 is an analog sensor configured to determine rotational position of a rotating component. The resolver 404 is an active sensor, i.e., it receives an excitation signal, such as the dithered excitation signal 352 of FIG. 3, which causes (induces) an output signal.

The resolver 404 includes three coils 422-426 forming a rotatable transformer. The resolver 404 includes a rotatable primary coil 422 (first coil) and two secondary coils 424, 426 (sine and cosine coils). The secondary coils 424, 426 may include or correspond to pairs of poles, e.g., 2n poles. Each pole is angularly offset from the other pole, such as by 90 degrees. Each pair of poles has a pole configured to deliver a sine output and another pole configured to deliver a cosine output. As the primary coil 422 rotates, the primary coil 422 receives the excitation signal 352 and induces voltage in the secondary coils 424, 426. Each of the secondary coils 424, 426 may output a differential output, such as the differential voltage outputs 354 of FIG. 3. The ratio between the voltages of the secondary coils 424, 426 represents an angle 430 of the resolver 404 (which indicates an angle of the motor 124). The resolver 404 in FIG. 4B is a two pole resolver and is a single speed resolver, e.g., the coarse resolver 342 of FIG. 3.

In multispeed resolvers, the multispeed resolver (e.g., the fine resolver 344) has a higher number of electrical cycles per rotation of the multispeed resolver (and the component being tracked). For example, the multispeed resolver can be a multipole resolver and extra pairs of poles (coils) can be added to the resolver 404 to produce more electrical cycles per one mechanical rotation of the primary coil 422 (and the component being tracked). As another example, the primary coil 422 of the multispeed resolver can be geared relative to the component being tracked such that one mechanical rotation for of the component being tracked causes more than one rotation of the primary coil 422.

Figure 4:
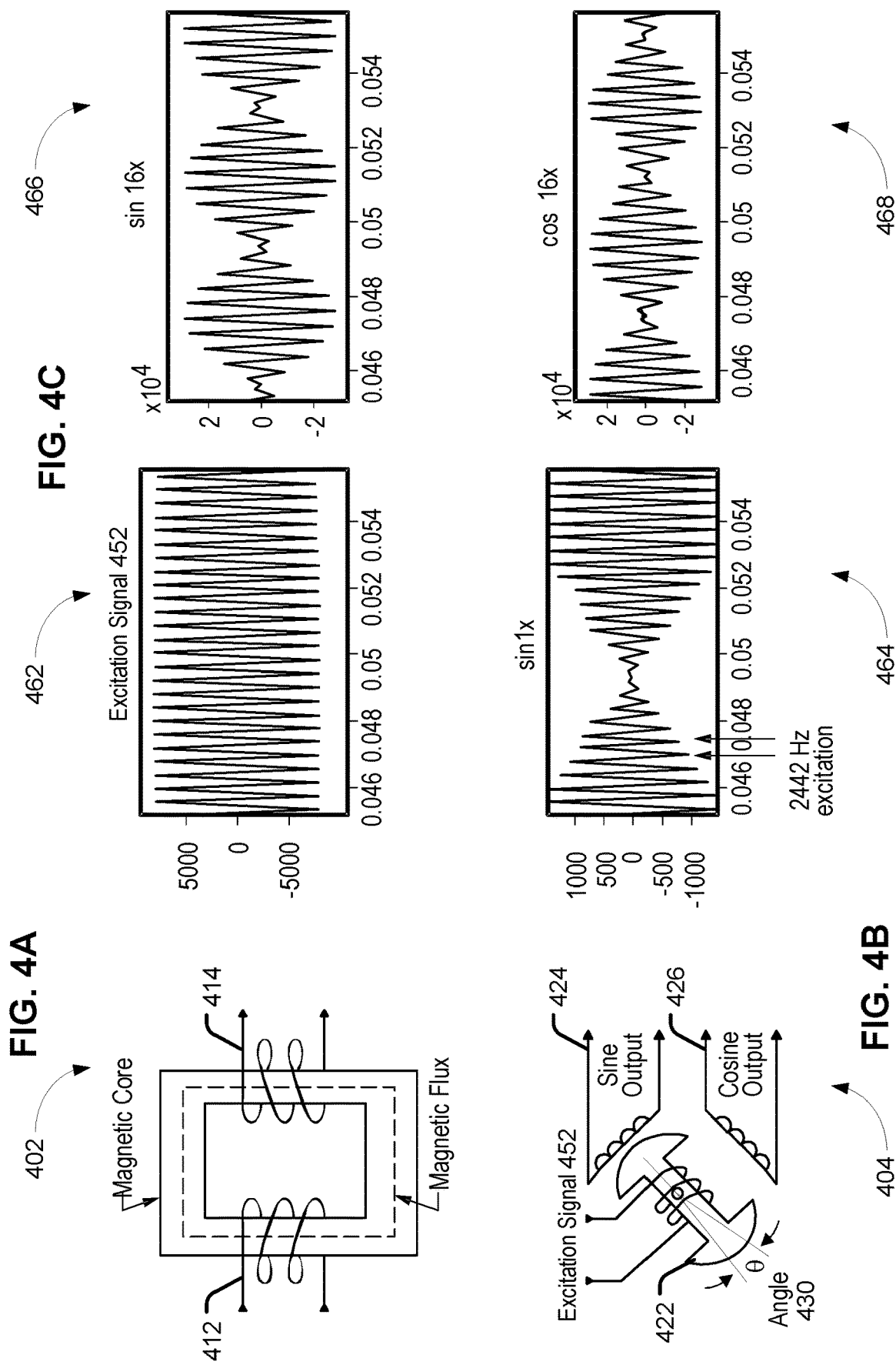
FIG. 4A illustrates a diagram of an example of a transformer.
FIG. 4B illustrates a diagram of an example of a resolver.
FIG. 4C illustrates exemplary graphs of signals of a dual speed resolver.

FIG. 4C illustrates exemplary graphs 462-468 of signals of the dual speed resolver 312 of FIG. 3. Each of the graphs 462-468 of FIG. 4C corresponds to the same interval of time, which corresponds to a partial rotation of the resolvers 342, 344 of the dual speed resolver 312. A first graph 462 depicts voltages of an excitation signal 452 (an AC signal) over the interval of time supplied to both resolver 342, 344. As illustrated in FIG. 4C, the excitation signal 452 has a frequency of 2442 Hertz. In other implementations, the excitation signal is a dithered excitation signal, such as the dithered excitation signal 352 of FIG. 3 and illustrated in FIG. 23. The excitation signal 452 (base excitation signal) is depicted in FIG. 4 for illustrative purposes.

A second graph 464 depicts voltage outputs of the sine secondary coil 424 of the coarse resolver 342 (e.g., the resolver 404) over the interval of time. A third graph 466 and a fourth graph 468 depict voltage outputs of the fine resolver 344 over the interval of time. As illustrated in FIG. 4C, the fine resolver 344 is a 16 speed resolver and the third graph 466 depicts voltage outputs of the sine secondary coil 424 and the fourth graph 468 depicts voltage outputs of the cosine secondary coil 426 of the fine resolver 344. As compared to the voltage outputs of the sine secondary coil 424 of the coarse resolver 342 of the second graph 464, the voltage outputs of the sine secondary coil 424 of the fine resolver 344 of the third graph 466 have higher voltages, a higher cycle frequency, and complete multiple electrical cycles over the interval of time. As compared to the voltage outputs of the sine secondary coil 424 of the fine resolver 344 of the third graph 466, the voltage outputs of the fine resolver 344 of the cosine secondary coil 426 of the fourth graph 468 have the same cycle frequency but are offset (e.g., out of phase) relative to the third graph 466. The voltage outputs of the cosine secondary coil 426 of the fine resolver 344 of the fourth graph 468 are also offset from the excitation signal 452 of the first graph 462. Processing of resolver outputs, e.g., demodulation and angle combination, are described with reference to FIGS. 5-21. Generation of excitation signals for the resolver 404 are described with reference to FIGS. 22-28.

Figure 5:
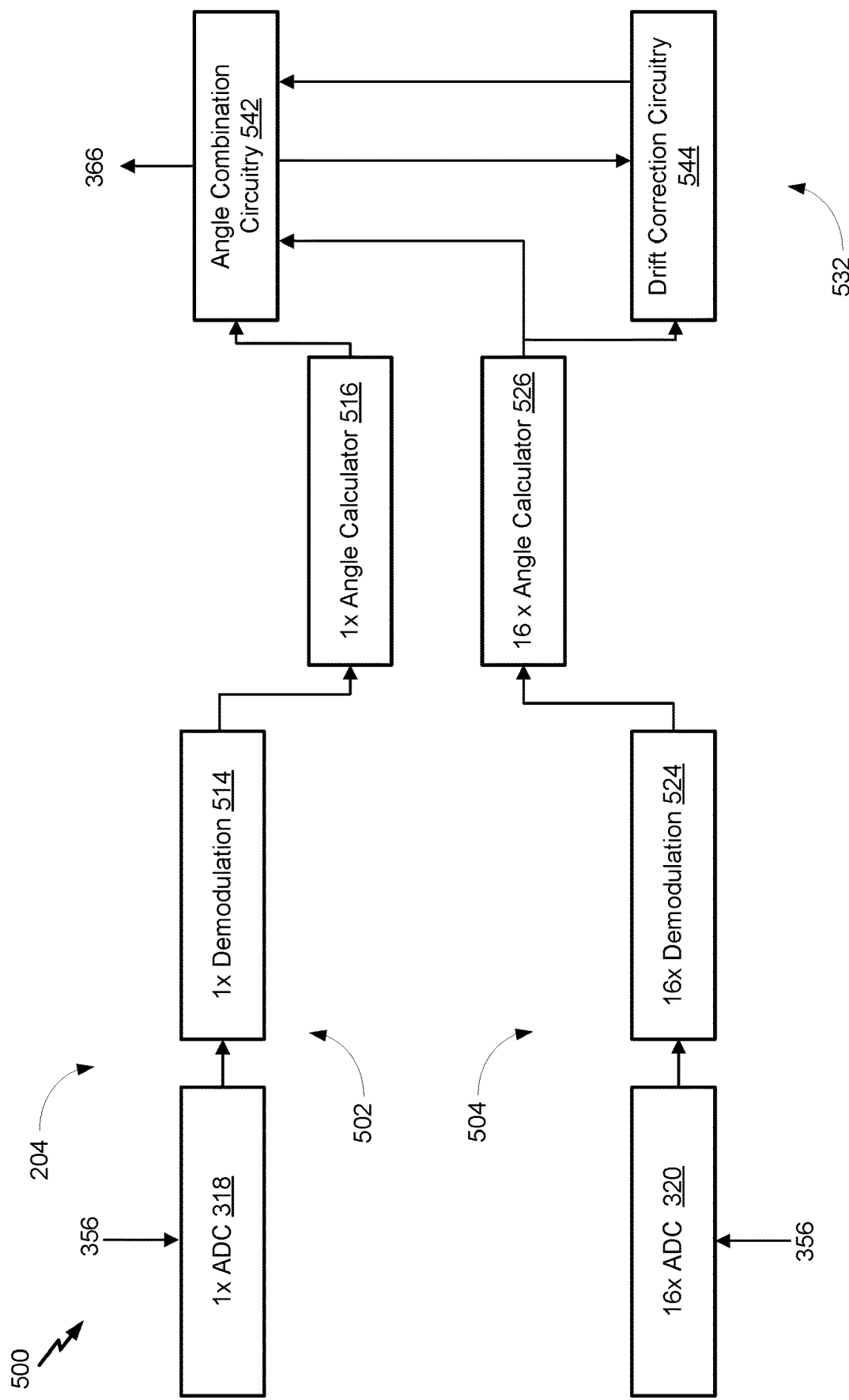
FIG. 5 is a diagram that illustrates an example of flow processing for processing resolver outputs for the dual speed resolver.

FIG. 5 is a diagram 500 that illustrates an example of flow processing for processing resolver outputs for the dual speed resolver 312 of FIG. 3. As illustrated in FIG. 5, the resolver system 204 includes two processing chains 502, 504, one for each resolver of the dual speed resolver 312. The processing chains 502, 504 include the ADCs 318, 320, demodulation circuitry 514, 524, and angle calculation circuitry 516, 526. Outputs from each processing chain 502, 504 are input into output circuitry 532.

As illustrated in FIG. 5, the output circuitry 532 includes angle combination circuitry 542 and drift correction circuitry 544. A position of the drive shaft of the motor can be determined based on outputs from the angle combination circuitry 542 and the drift correction circuitry 544.

During operation, the coarse resolver 342 (e.g., a first resolver or one speed resolver) of FIG. 3 outputs coarse position signals to an input of the first ADC 318, and the fine resolver 344 (e.g., a second resolver or a multi-speed resolver) of FIG. 3 outputs fine position signals to an input of the second ADC 320. In the example illustrated in FIG. 5, the ADCs 318, 320 receive the differential voltage signals 356 of FIG. 3. In a particular implementation, the fine position signals are 16 speed. The coarse and fine position signals include analog sine and cosine waves. In a particular implementation, the coarse and fine position signals each include a differential sine signal and a differential cosine signal.

The ADCs 318, 320 convert the analog outputs of the resolvers into digital samples. The digital samples output by the ADCs 318, 320 are received by the corresponding demodulation circuitry 514, 524. The demodulation circuitry 514, 524 demodulates the digital samples to produce amplitudes of the sine and cosine waves. In a particular implementation, the amplitudes include sign information, i.e., are "signed" and indicate whether the sample is positive or negative. Details of the demodulation are described further with reference to FIGS. 6-17.

The amplitude outputs of the demodulation circuitry 514, 524 are received by the corresponding angle calculation circuitry 516, 526. The angle calculation circuitry 516, 526 calculates estimated angles of the drive shaft using the sine and cosine amplitudes. In a particular implementation where the amplitudes include sign information, the angle calculation circuitry 516, 526 calculates the estimated angles of the resolvers 342, 344 (which are indicated of angles of the drive shaft) using arctan 2 (commonly abbreviated as atan 2). The atan 2 function is a four quadrant inverse arc tangent function capable of determining which quadrant the drive shaft is in based on the signed amplitudes.

The estimated angles of the drive shaft from each of the angle calculation circuitry 516, 526 are provided to output circuitry 532. In the example illustrated in FIG. 5, the angle combination circuitry 542 receives both estimated angle outputs, and the drift correction circuitry 544 receives the multispeed estimated angle output.

The angle combination circuitry 542 combines the estimate angles (e.g., the angle estimates 364 of FIG. 3) from each angle calculation circuitry 516, 526 to determine a starting position (an initial estimated position 366 of FIG. 3) of the drive shaft and subsequent positions of the drive shaft. In a particular implementation, the angle combination circuitry 542 uses estimated angle outputs from the first angle calculation circuitry 526 to determine the starting position and uses estimated angle outputs from the second angle calculation circuitry 526 to determine the subsequent positions of the drive shaft. Alternatively, the angle combination circuitry 542 uses both estimated angle outputs to determine the starting position and uses estimated angle outputs from the second angle calculation circuitry 526 to determine the subsequent positions of the drive shaft.

The drift correction circuitry 544 corrects for errors that are produced when combining the two estimated angles. For example, when determining the starting and subsequent positions of the drive shaft includes differentiation of the multispeed estimated angles, noise and integer error may be introduce into outputs of the angle combination circuitry 542. To correct for the noise and integer error, the angle combination circuitry 542 receives, an estimated position from the angle combination circuitry 542. The drift correction circuitry 544 generates a drift correction output based on the multispeed estimated angles from the second angle calculator. The drift correction circuitry 544 provides the drift correction output to the angle combination circuitry 542. The angle combination circuitry 542 adjusts subsequent outputs (subsequent estimated positions 366 of FIG. 3) based on the drift correction output. Details of the angle combination circuitry 542 are described further with reference to FIGS. 6, 7, and 18, and details of the drift correction circuitry 544 are described further with reference to FIGS. 6, 7, and 19.

Figure 6:
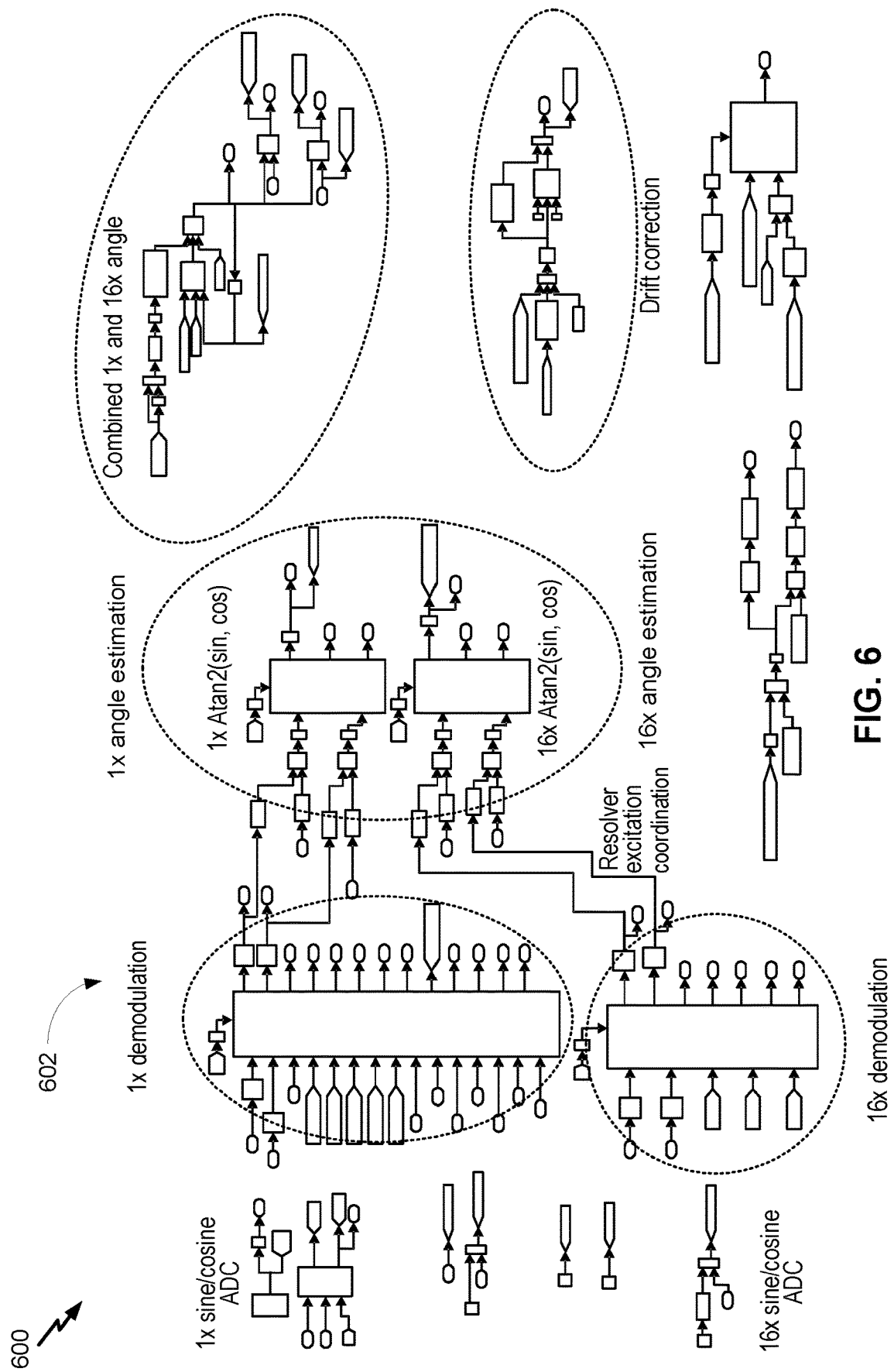
FIG. 6 is a logic diagram that illustrates an overview of an example of logic for processing resolver outputs of the dual speed resolver.

FIG. 6 is a logic diagram 600 that illustrates an overview of an example of logic 602 for processing resolver outputs of the dual speed resolver 312 of FIG. 3. The logic diagram 600 depicts an overview of conversion of resolver outputs to ADC outputs, demodulation of the ADC outputs, angle estimation based on the demodulated outputs, and a combined position output based on the angle estimations. Each circled portion of the logic diagram 600 is described in further detail with respect to FIGS. 7-19. Logic or portions thereof of FIG. 6 and subsequent FIGS. may be performed by one or more application specific circuits (circuitry), an FPGA, firmware (such as firmware of an FPGA), software executed by a processor, or a combination thereof. Additionally, the logic (or portions thereof) disclosed herein may be replaced by equivalent logic. For example, any logic gate can be represented by one or more NOR logic gates.

Figure 7:
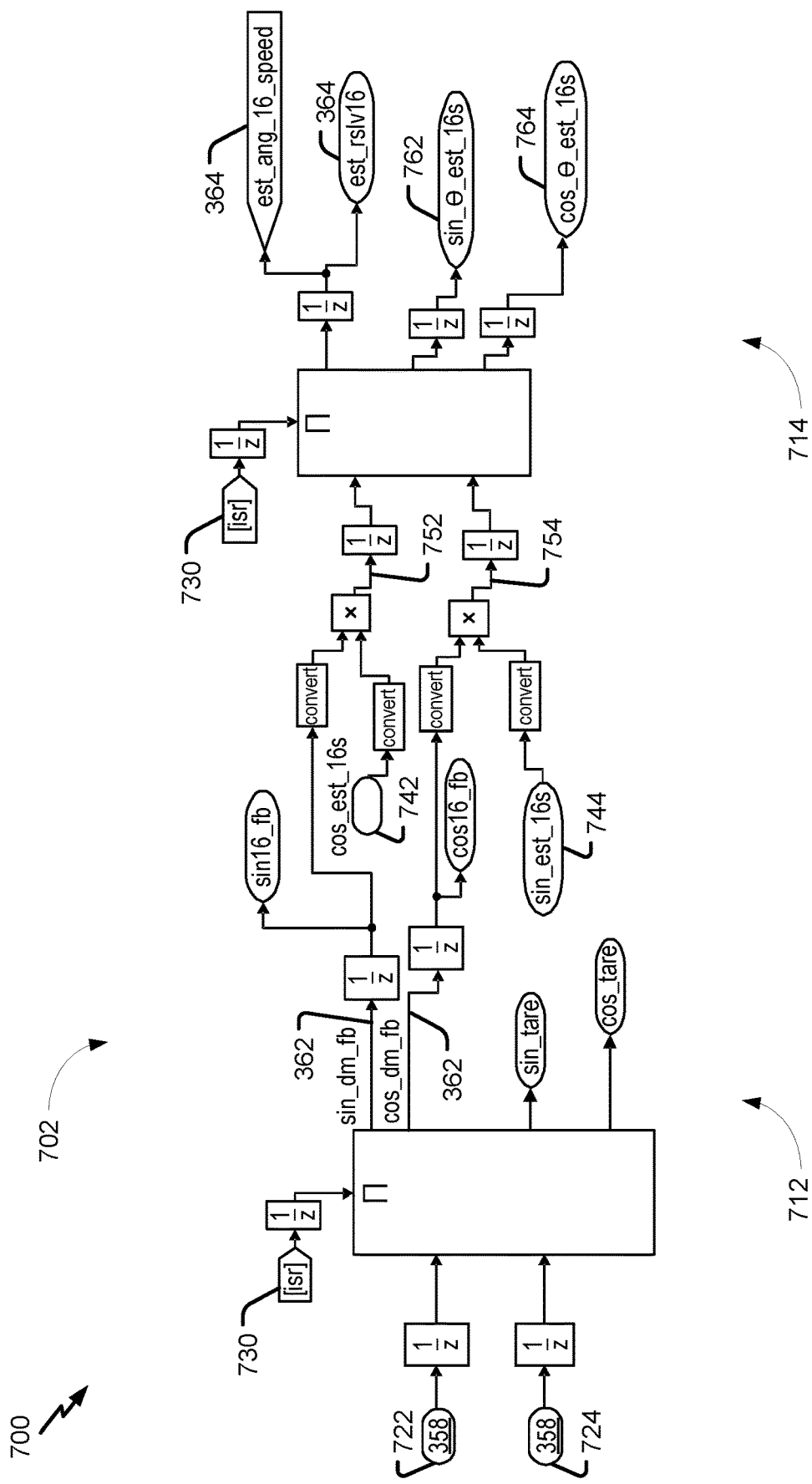
FIG. 7 is a logic diagram that illustrates an overview of logic for demodulation and angle estimation.

FIG. 7 is a logic diagram 700 that illustrates an overview of an example of logic 702 for demodulation and angle estimation. The logic 702 depicts demodulation and angle estimation for a single resolver of the dual speed resolver 312. As illustrated in FIG. 7, the logic 702 corresponds to logic for demodulation and angle estimation for the fine resolver 344 (e.g., 16 speed) of FIG. 3.

The logic 702 includes demodulation logic 712 and angle estimation logic 714. The demodulation logic 712 is configured to the receive the resolver outputs (e.g., the differential voltage outputs 354) via the ADC 320 as the ADC outputs 358 and to output the demodulated outputs 362 to the angle estimation logic 714, as described further with reference to FIGS. 8-17. The angle estimation logic 714 is configured to receive the demodulated outputs 362 (demodulated amplitude values) and calculate the angle estimates 364 for the resolvers, as described further with reference to FIGS. 18 and 19.

In some implementations, the angle estimation logic 714 is configured to calculate the angle estimates 364 based on a function of atan 2 (e.g., four quadrant inverse arc tangent). For example, the angle estimation logic 714 is configured to generate angle estimates 364 based on a product of the demodulated outputs 362 (demodulated amplitude values) and based on sine and cosine feedback angle values 742, 744.

By calculating the angle estimates 364 based on a function of atan 2, the angle estimates 364 indicate which quadrant the motor is in. To illustrate, an angle output by atan 2 is from 0-360 degrees (as opposed to 0 to 90 degrees). The function atan 2 uses signed input angles to determine the specific quadrant (i.e., 0-90, 90-180, 180-270, or 270-360 degrees).

Figure 8:
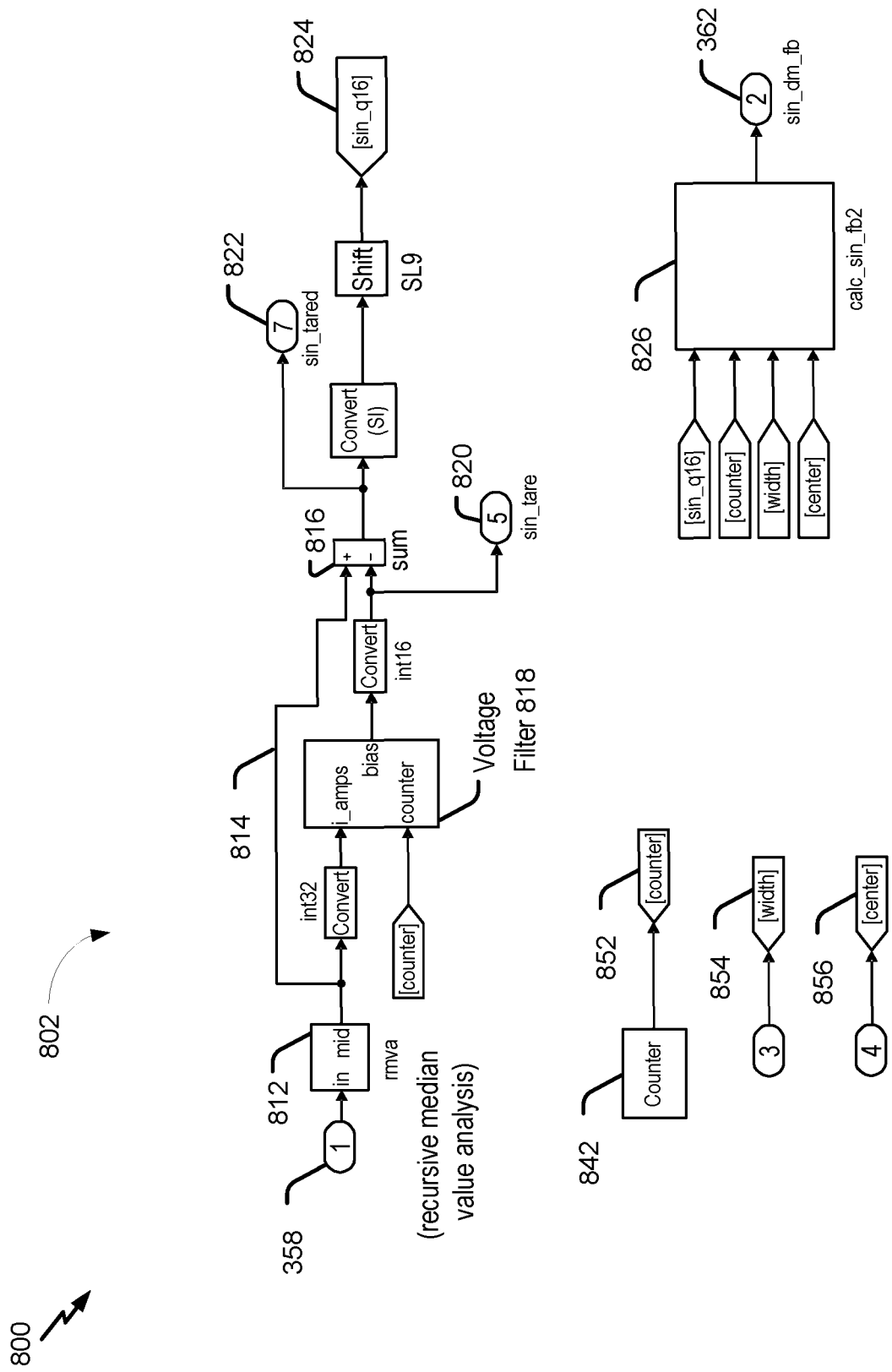
FIG. 8 is a logic diagram that illustrates an example of logic for voltage conditioning.

In some implementations, the demodulation logic 712 is further configured to adjust (tare) for voltage bias and other biases of the hardware, as described further with reference to FIG. 8. In some implementations, the angle estimation logic 714 is further configured to output estimated angle outputs for the sine and cosine values in addition to the angle estimates 364.

During operation, the demodulation logic 712 receives digital samples from an ADC. For example, the demodulation logic 712 receives the ADC outputs 358 from the one of the ADCs 318, 320. The digital samples represent voltages of the sine and cosine coils 424, 426 of the resolvers 342, 344 of the dual speed resolver 312. As illustrated in FIG. 7, the digital samples correspond to sine and cosine inputs from the fine resolver 344. The digital samples are demodulated to produce demodulated sine and cosine outputs 362. Multiple demodulated outputs 362 may be referred to as demodulated feedback or a demodulated feedback signal. In a particular implementation, the demodulation logic 712 generates a median value of the past three demodulated outputs 362 and outputs the median value as next the demodulated output 362 of the demodulated feedback signal. Detailed operation of the demodulation logic 712 is described further with reference to FIGS. 8-16.

The demodulated outputs 362 are multiplied by the sine and cosine feedback angle values 742, 744 to generate products 752, 754. To illustrate, the sine demodulated outputs 362 are multiplied by the cosine feedback angle values 744 to generate first products 752. The cosine demodulated outputs 362 are multiplied by the sine feedback angle values 746 to generate second products 754. The sine and cosine feedback angle values 742, 744 may be generated by the angle estimation logic 714 as sine and cosine estimated angle values 762, 764 and provided to the logic 702. For example, the sine and cosine estimated angle values 762, 764 are generated based on the demodulated outputs 362. To illustrate, the sine estimated angle values 762 are calculated based on the first product 752 of the sine feedback angle values 742 and values (amplitudes) of the sine demodulated outputs 362.

The angle estimation logic 714 receives the products 752, 754 of the demodulated outputs 362 and the sine and cosine feedback angle values 742, 744 and generates the angle estimates 364 based on the demodulated outputs 362. For example, the angle estimation logic 714 generates the angle estimates 364 based on the function atan 2 (i.e., four quadrant inverse arc tangent). To illustrate, a particular angle estimate 364 is calculated by applying the function atan 2 to a value (angle) of an integral of the product 752 minus the product 754, i.e., integral (sine amplitude*cos(θ)–cosine_amplitude*sin(θ)–0). In such implementations, the demodulated outputs 362 are signed, i.e., include sign information. As explained with reference to FIGS. 7, 18, and 19, the angle estimates 364 indicated by the fine resolver 344 may be used in combination with the angle indicated by the coarse resolver 342 to generate an initial position and subsequent positions of the drive shaft of the motor 142.

In some implementations, the demodulation logic 712, the angle estimation logic 714, or both, are configured to receive an interrupt service routine (ISR) input 730. The ISR input 730 is a Boolean value indicating an interrupt service routine mode. The demodulation logic 712, the angle estimation logic 714, or both, stop generating outputs responsive to receiving the ISR input 730.

FIG. 8 is a logic diagram 800 that illustrates an example of logic 802 for voltage conditioning. The logic 802 is configured to receive voltage values from a sensor, condition the voltage values to remove hardware bias, and output demodulated output values. In the particular example illustrated in FIG. 8, the logic 802 receives a voltage value measured by the differential voltage sensor 316 corresponding to the sine coils 424 of the fine resolver 344 and calculates the demodulated output 362 for the fine resolver 344.

The logic 802 includes recursive midvalue analysis (RMVA) logic 812, a voltage filter 818, and a combiner 816. The RMVA logic 812 is configured to determine a median (midvalue) of the last n number of input values or samples, where n is an integer of greater than 1. The RMVA logic 812 is described further with reference to FIG. 9.

During operation, the logic 802 receives multiple voltage values from the ADC 320 corresponding to the voltage at the sine coils 424 of the fine resolver 344 (e.g., a 16 speed resolver) measured by the differential voltage sensor 316. The RMVA logic 812 receives the multiple voltage values and outputs a midvalue voltage value 814 to the combiner 816. The voltage filter 818, such as a low pass filter, generates a voltage bias output 820, sin tare as illustrated in FIG. 8, based on the midvalue voltage value 814 and the counter input 852. The voltage bias output 820 corresponds to a voltage bias of or imparted by the hardware of the inertial measurement unit 102. For example, the voltage bias output 820 may correct for a voltage drop associated with an FPGA of the inertial measurement unit 102.

In a particular implementation, the midvalue voltage value 814 is converted to a higher bit value, such as from a 16 bit value to a 32 bit value. Converting from 16 bit to 32 bit (increasing a number of bits) reduces or eliminates a loss of precision caused by the voltage filter 818. For example, any right shifts by the voltage filter 818 do not cause a loss of precision.

The combiner 816 generates an adjusted voltage value 822 (e.g., the conditioned voltage value 360 of FIG. 3) based on the midvalue voltage value 814 and the voltage bias output 820. As illustrated in FIG. 8, the adjusted voltage value 822 is a difference of the midvalue voltage value 814 and the voltage bias output 820. The adjusted voltage value 822 may be converted to a signed integer and shifted before demodulation. The adjusted voltage value 822 may be output to the demodulation logic 826 and stored as an input voltage value 824.

The demodulation logic 826 generates the demodulated output 362 based on the input voltage value 824, the counter input 852, the width input 854, and the center input 856. Generation of the demodulated output 362 and examples of the RMVA logic 812 demodulation logic 826 are described further with reference to FIGS. 9-17.

Figure 9:
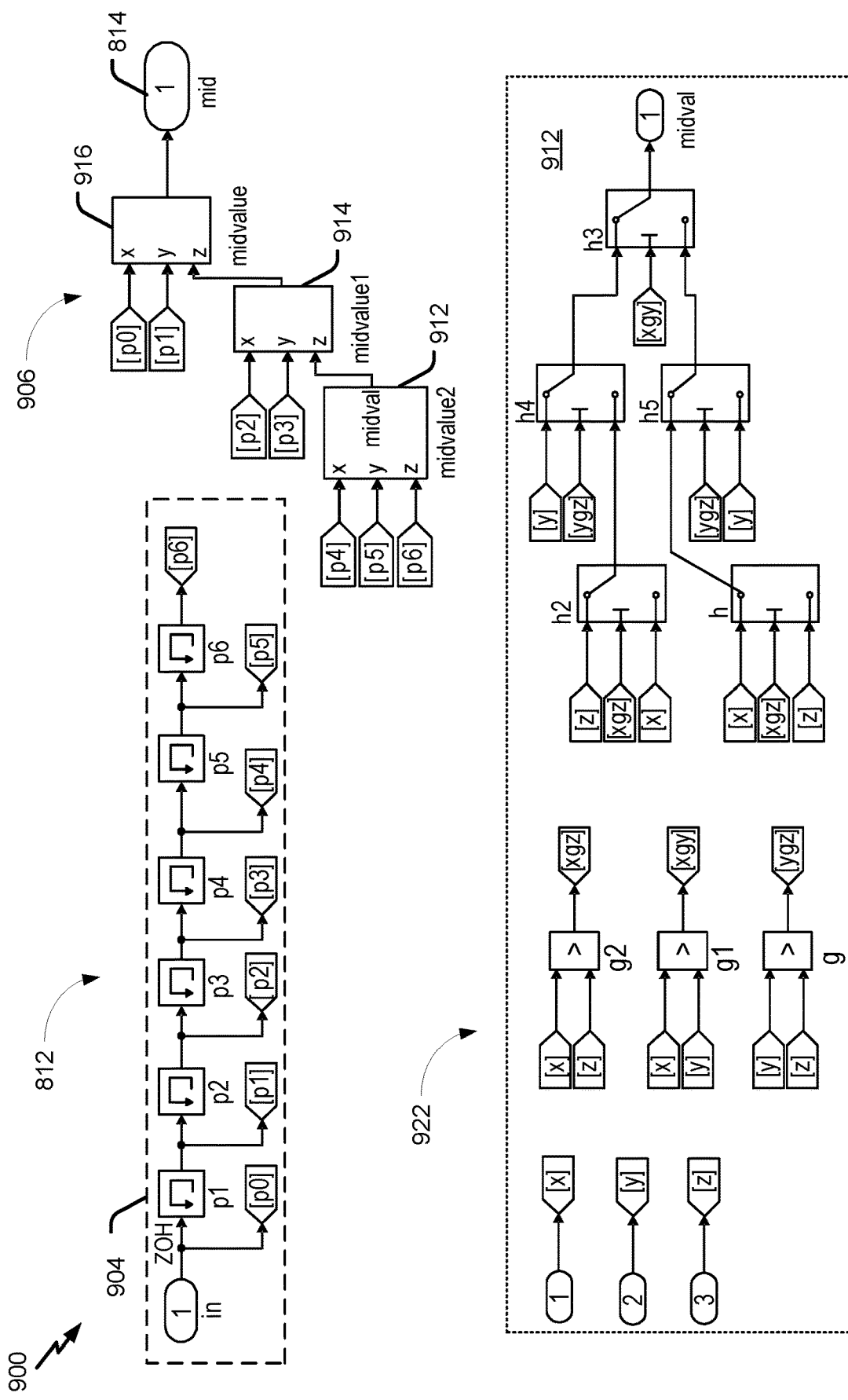
FIG. 9 is a logic diagram that illustrates an example of recursive median value analysis logic for recursive median value analysis.

FIG. 9 is a logic diagram 900 that illustrates an example of RMVA logic 812 for recursive median value analysis of inputs, such as the ADC outputs 358 of FIGS. 7 and 8. The RMVA logic 812 includes sliding window logic 904 configured to receive inputs and to store a last n number of inputs. The sliding window logic 904 may include one or more registers (e.g., memories, caches, buffers, etc.) to store the last n number of inputs. The sliding window logic 904 may perform a zero-order hold (ZOH) to store the last n number of inputs. The zero-order hold (ZOH) holds each sample value for one sample interval. As new samples are received, each stored sample moves back one place and a last stored sample is pushed out. In the example illustrated in FIG. 9, the sliding window logic 904 stores the last seven inputs (p0-p6).

The RMVA logic 812 includes cascaded midvalue logic 906 configured to determine a midvalue of the last n number of inputs, the midvalue voltage value 814 of FIG. 8. The cascaded midvalue logic 906 includes multiple logic blocks 912-916 each configured determine a midvalue for a subset of the last n number of inputs. An output of a first logic block 912 is used as an input of the second logic block 914, and an output of the second logic block 914 is used an input for a third logic block 916, and so on. An output of a final logic block (i.e., the third logic block 916 in the implementation illustrated in FIG. 9) is the median value for the last n number of samples. FIG. 9 illustrates a particular example of the RMVA logic 812 where the multiple logic blocks 912-916 each determine a midvalue of three inputs and three logic blocks 912-916 are used. In other implementations, more than three logic blocks or less than three logic blocks may be used and/or each logic block may process a different number of inputs from another logic block. Additionally or alternatively, each of the logic blocks 912 and 914 can determine a midvalue of 3 samples and the logic block 916 can determine a midvalue of the two outputs and a single sample.

FIG. 9 further illustrates an example of logic 922 for a 3 value midvalue determination, such as the first logic block 912. The logic 922 allows parallel processing and faster determination of the median value for larger values of n. The first logic block 912 receives three inputs corresponding to a combination of samples and midvalue outputs. In the first logic block 912 illustrated in FIG. 9, the first logic block receives samples five, six, and seven (p4-p6) at inputs 1, 2, and 3 respectively. The samples are compared to each other by a Boolean condition, illustrated as a greater than condition in FIG. 9. Three comparison are used because three samples are used in the illustrated example. These comparisons produce Boolean outputs that are used to control switch outputs. To illustrate, the logic 922 compares the first input ([x]) to the third input ([z]) to generate a first Boolean condition ([xgz]) indicating whether or not the first input ([x]) is greater than the third input.

The logic 922 uses a series of switches (h-h5) to determine the midvalue output. Each switch (h-h5) receives two input sample values and the corresponding Boolean condition. For example, a first switch (h2) receives the first input ([x]) and the third input ([z]) and the corresponding Boolean condition generated by comparing the first and third inputs, i.e., the first condition ([xgz]). The first switch (h2) outputs the third input ([z]) based on the first condition indicating false, i.e., x is not greater than z. A second switch (h4) receives the second input ([y]), the output (the third input ([z])) of the first switch (h2), and a Boolean condition that corresponds to the second input (e.g., the second Boolean condition or the third Boolean condition). The second switch (h4) compares the second input to the third input based on one of the Boolean conditions that corresponds to the second input, i.e., the second condition ([ygz]) in FIG. 9. The second switch (h4) outputs the second input ([y]) to a fifth switch ((h3) e.g., an output switch) based on the first condition indicating true, i.e., y is greater than z.

Operation of a third switch (h) and a fourth switch (h5) mirror operation of the first switch (h2) and the second switch (h4). For example, the third switch (h) receive the same inputs and condition in opposite order and accordingly, the third switch (h) outputs the opposite output value based on the first condition to the fourth switch (h5). To illustrate, the third switch (h) will output the first output ([x]) if the first switch (h2) outputs the third output ([z]). One of the second switch (h4) and the fourth switch (h5) will always output the second input ([y]).

The fifth switch (h3) receives the output of the second and fourth switches (h4 and h5) and compares them based on the other Boolean condition that corresponds to the second input ([y]). The fifth switch (h3) outputs the midvalue based on the second input ([y]), when the first input ([x]) is greater than the second input ([y]), the top switches (h2 and h4) will output the midvalue. When the second input ([y]) is greater than the first input ([x]), the bottom switches (h and h5) output will be the midvalue (given that a Boolean condition of true or high selects the top input at each switch). As compared to sorting (e.g., by a sort function) the last n number of inputs, the RMVA logic 812 and the logic 922 reduce firmware, circuit area, and processing speed.

Figure 10:
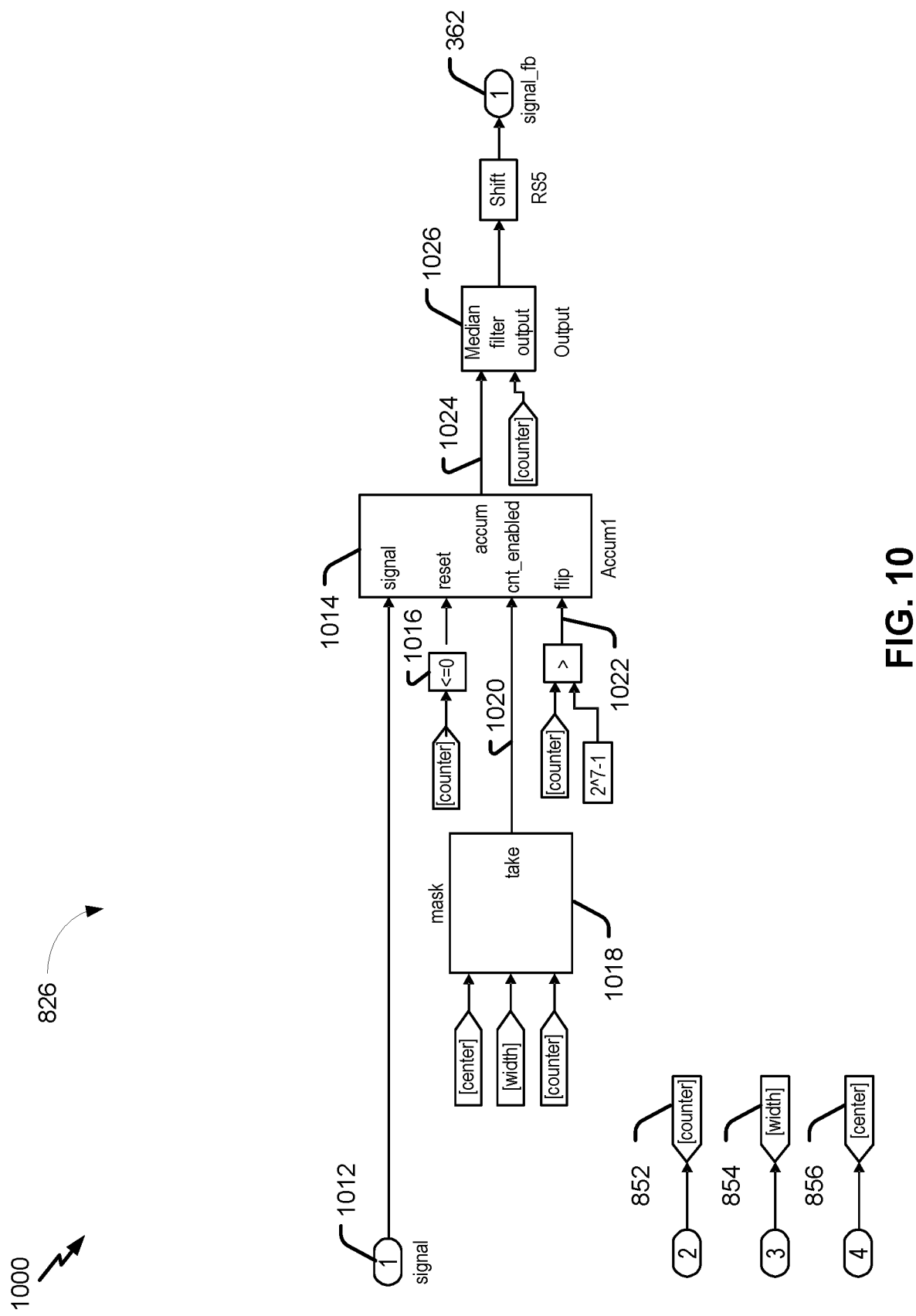
FIG. 10 is a logic diagram that illustrates an example of demodulation logic of FIG. 8.

FIG. 10 is a logic diagram 1000 that illustrates an example of the demodulation logic 826 of FIG. 8. The demodulation logic 826 is configured to generate the demodulated output 362 based on the input voltage value 824 of FIG. 8 (included in a signal 1012), the counter input 852, the width input 854, and the center input 856. The demodulation logic 826 includes an accumulator logic 1014, mask logic 1018, and output logic 1026.

The accumulator logic 1014 is configured to output an accumulated output 1024 based on the input voltage values 824. For example, the accumulator logic 1014 is configured to accumulate values of the input voltage values 824 and output an accumulated output 1024 as an accumulation of the input voltage values 824. To illustrate, accumulation includes adding a current voltage value 824 to a sum of previous voltage values 824. Additionally, the accumulator logic 1014 is configured to determine and adjust a sign of the accumulated output 1024 based on a flip input 1022.

In some implementations, the accumulator logic 1014 adjusts and filters multiple input voltage values 824 to determine a particular accumulated output 1024. For example, the accumulator logic 1014 is configured to determine which input voltage values 824 of multiple input voltage values 824 to consider (or filter) based on a count enabled input 1020. Selected input voltage value 824 are accumulated and filtered input voltage values 824 are discarded (not accumulated). Additionally, the accumulator logic 1014 is further configured to be reset responsive to receiving a reset input 1016. Details of the accumulator logic 1014 are described in further detail with respect to FIG. 11.

The mask logic 1018 is configured to generate the count enable input 1020 based on the counter input 852, the width input 854, and the center input 856. Details of the mask logic 1018 are described in further detail with respect to FIG. 14.

The output logic 1026 is configured to generate the demodulated output 362 based on the accumulated output 1024 and the counter input 852. For example, the output logic 1026 is configured to determine the demodulated output 362 as a midvalue of the accumulated outputs 1024 based on to the counter input 852. Details of the output logic 1026 are described in further detail with respect to FIG. 16.

During operation, the mask logic 1018 generates a take data output (i.e., a count enabled input 1020) based on the counter input 852, the width input 854, and the center input 856. Generation of the mask take data output (the count enabled input 1020) and an example of mask logic 1018 is described further with reference to FIGS. 14 and 15.

The accumulator logic 1014 receives the signal 1012 including multiple input voltage values 824. The accumulator logic 1014 also receives the reset input 1016, the mask take data output (the count enabled input 1020), and the flip input 1022. The accumulator logic 1014 generates the accumulated output 1024 based on the multiple input voltage values 824, the reset input 1016, the mask take data output (the count enabled input 1020), and the flip input 1022. The accumulator logic 1014 rectifies the multiple input voltage values 824 based on the flip input 1022 to generate rectified values. The rectified values are output as accumulated outputs 1024 based on the reset input 1016 and the mask take data output (the count enabled input 1020). Generation of the accumulated output 1024 and an example of accumulator logic 1014 is described further with reference to FIGS. 11 and 12.

The flip input 1022 is a Boolean value indicating when to change a sign of a square wave used in rectification. The flip input 1022 is configured to change the sign of the square wave used to rectify the multiple input voltage values 824. The flip input 1022 tracks the behavior of the sine wave of the excitation signal of the resolver, such as one of the excitation signals 352, 452 of FIGS. 3 and 4. For example, the sign of the square wave is positive when the counter input 852 value is less than half of the counter period (illustrated as $2^7-1$ in FIG. 10), because a sine wave is positive for the first half of the sine wave (i.e., 0 to 180 degrees). The sign of the square wave is negative when the counter input 852 value is greater than half of the counter period, because a sine wave is negative for the second half of the sine wave (i.e., 181 to 360 degrees).

Figure 11:
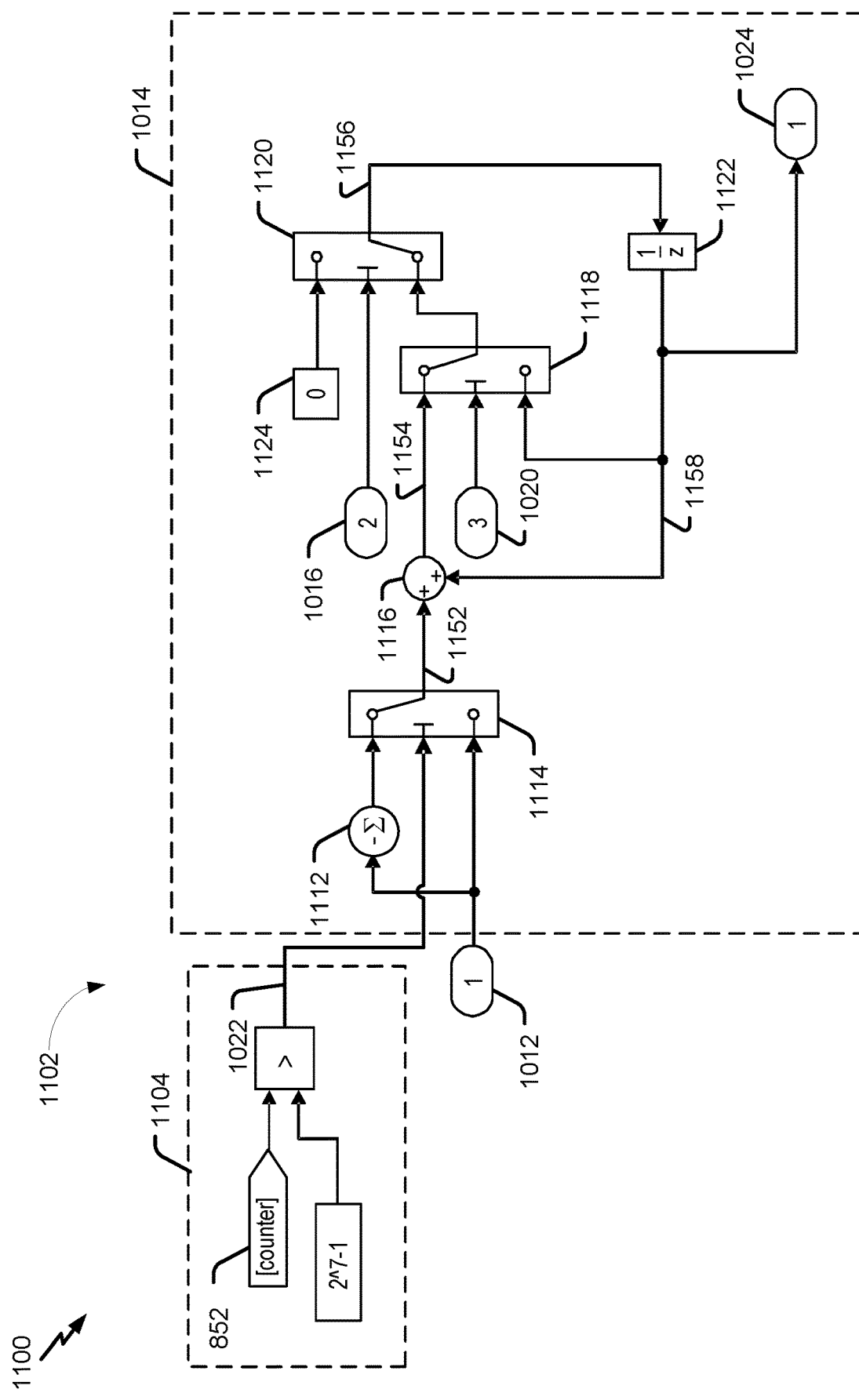
FIG. 11 is a logic diagram that illustrates an example of logic for rectification with phase preservation.

FIG. 11 is a logic diagram 1100 that illustrates an example of logic 1102 for rectification with phase preservation. The logic 1102 includes flip generation logic 1104 and the accumulator logic 1014 of FIG. 10. The flip generation logic 1104 is configured to generate the flip input 1022 as described with reference to FIG. 10.

The accumulator logic 1014 is configured to rectify the multiple input voltage values 824 based on the flip input 1022 to generate rectified values. The accumulator logic 1014 is configured to accumulate the rectified values to generate the accumulated outputs 1024. As illustrated in FIG. 11, the accumulator logic 1014 includes an inverter 1112, multiple switches 1114, 1118, and 1120, and a summer 1116.

The inverter 1112 is configured to invert the multiple input voltage values 824. For example, the inverter 1112 is configured to multiply the multiple input voltage values 824 by −1. The multiple switches 1114, 1118, and 1120 are configured to output values based on control inputs, i.e., the flip input 1022, the count enabled input 1020, and the reset input 1016 respectively. The summer 1116 is configured to add an output of the first switch 1114 and a delayed output of the third switch 1120. A unit delay 1122 is configured to delay the output of the third switch 1120 for one sample. For example, the unit delay 1122 performs a zero-order hold.

During operation, the flip generation logic 1104 generates the flip input 1022 based on comparing the counter input 852 to a counter mid value (e.g., $2^7-1$ for an 8 bit counter 842). When the counter input 852 is greater than the counter mid value, the flip generation logic 1104 generates the flip input 1022 indicating true (e.g., 1) or to flip the sign of the input voltage values 824.

The first switch 1114 receives the input voltage values 824 of the signal 1012, inverted input voltage values 824 from the inverter 1112, and the flip input 1022. The first switch 1114 outputs the inverted input voltage values 824 based on the flip input indicating 1, which corresponds to a second half of a sine wave of the excitation signal where the amplitude of the sine wave is negative. Thus, the flip generation logic 1104, the inverter 1112, and the first switch 1114 act to rectify the input voltage values 824 and preserve a phase of the excitation signal. The flip generation logic 1104, the inverter 1112, and the first switch 1114 function to multiply the input voltage values 824 by a square wave of [1,−1] that is in phase with the excitation signal.

The summer 1116 receives the rectified input voltage values 1152 from the first switch 1114 and combines the rectified input voltage values 1152 with a delayed output 1158 of the unit delay 1122 to generate a combined output 1154. The combined output 1154 is provided to the second switch 1118. The second switch 1118 outputs the combined output 1154 or the delayed output 1158 based on the count enabled input 1020. When the count enabled input 1020 indicates true or to take data, the second switch 1118 outputs the combined output 1154, as shown in FIG. 11. Alternatively, the second switch 1118 outputs the delayed output 1158 when the count enabled input 1020 indicates false or to not take data.

The output of the second switch 1118 is provided to the third switch 1120. The third switch 1120 outputs a null value 1124 (e.g., 0) when the reset input 1016 indicates true or to reset the accumulator logic 1014. The third switch 1120 outputs the output of the second switch 1118 as an output 1156 of the third switch when the reset input 1016 indicates false or not to reset the accumulator logic 1014. The output 1156 of the third switch 1120 is provided to the unit delay 1122. The unit delay 1122 delays the output 1156 of the third switch 1120 and provides the delayed output 1158 to the summer 1116 and the second switch 1118. The delayed output 1158 is also output as the accumulated output 1024.

Providing the delayed output 1158 to the summer 1116 and the second switch 1118 outputting the combined output 1154 responsive to the count enabled input 1020 indicating true, function to increase the delayed output 1158 iteratively when new input voltage values 824 are received. Thus, when the delayed output 1158 is output as the accumulated output 1024 (i.e., before the accumulator logic 1014 is reset), the accumulated output 1024 represents an accumulation of input voltage values 824 that correspond to periods of time when the mask logic 1018 outputs the count enabled input 1020 indicating to take or accumulate data. As illustrated in FIG. 10 and further described with reference to FIGS. 16 and 17, the output logic 1026 generates the demodulated outputs 362 based on the accumulated outputs 1024 and outputs the demodulated outputs 362 based the counter input 852.

Although many inputs have been described as Boolean inputs to control logic gates or switches, the logic gates or switches may be implemented as transistors and receive logical high and low signals (e.g., high and low voltages) representing the Boolean inputs.

Figure 12:
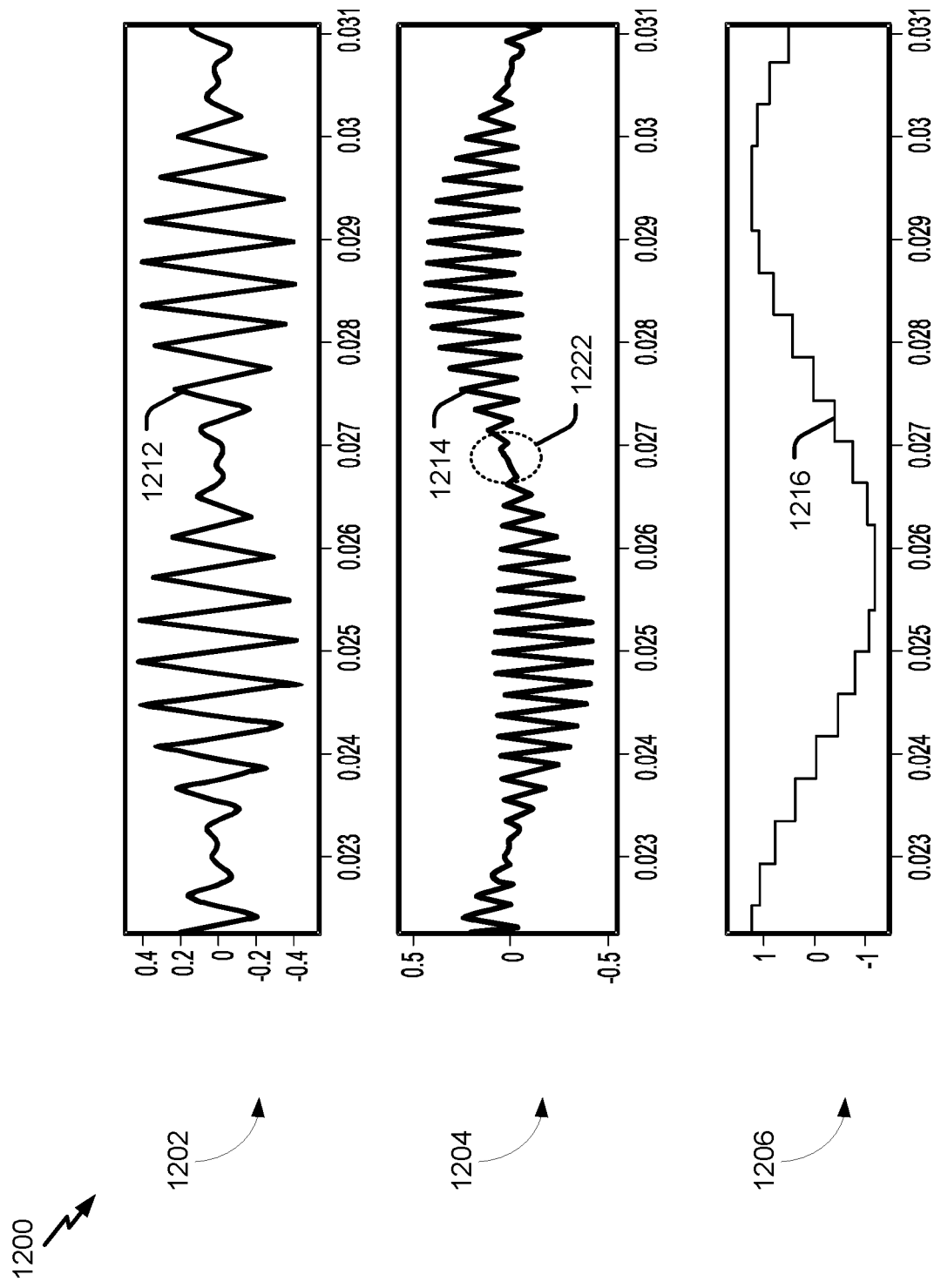
FIG. 12 illustrates a diagram of exemplary signals generated during demodulation.

FIG. 12 illustrates a diagram 1200 of exemplary signals generated during demodulation. Diagram 1200 includes three graphs 1202-1206. A first graph 1202 illustrates an ADC output signal 1212 (demodulator inputs) corresponding to sine wave outputs of a resolver, such as the fine resolver 344 of FIG. 3. The ADC output signal 1212 includes the ADC outputs 358 (or the conditioned voltage values 360) of FIG. 3. A second graph 1204 illustrates a rectified ADC output signal 1214 corresponding to the first graph 1202. In the second graph, the rectified ADC output signal 1214 has the same phase as the ADC output signal 1212. The ADC output signal 1212 is rectified (e.g., multiplied) by a square wave, instead of the excitation signal (e.g., a sine wave), to preserve the phase of the ADC output signal 1212 during rectification and to increase precision. The rectified ADC output signal 1212 includes or corresponds to the rectified input voltage values 1152 of FIG. 11, such as multiple rectified ADC outputs. A third graph 1206 illustrates a demodulation output signal 1216 of demodulated sine amplitude values. The demodulated sine amplitude values (including the sign information, i.e., positive or negative) are used to calculate the position of the drive shaft of the motor and correspond to the demodulated outputs 362 of FIG. 3. As illustrated in the third graph, the demodulation output signal 1216 has a delay (is out of phase) from the ADC output signal 1212 and the rectified ADC output signal 1214. The delay is shown and explained in greater detail with respect to FIG. 13.

Rectification with a square wave may introduce error in an area 1222 where the amplitudes of the excitation signal changes from positive to negative values (i.e., crosses zero) and the amplitudes of the ADC output signal 1212 approach zero. Accumulation of voltage values, masking voltage values, outputting median accumulated values, or a combination thereof reduces or eliminates this error or drawback, as shown by the demodulation output signal 1216 not including error in an area corresponding to the area 1222.

Figure 13:
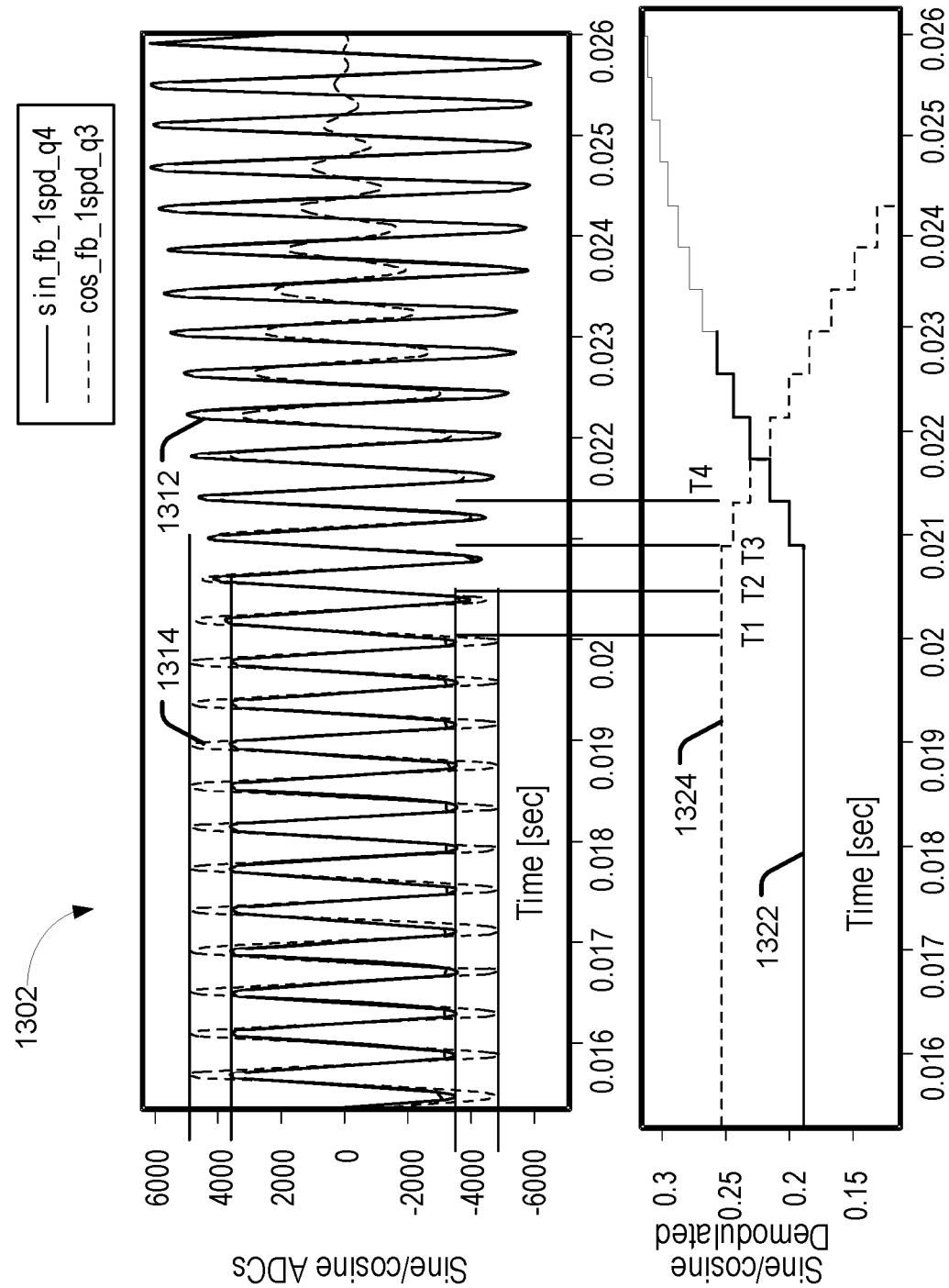
FIG. 13 illustrates exemplary graphs of signals of the resolver of FIG. 4B.

FIG. 13 illustrates exemplary graphs 1302 and 1304 of signals of the coarse resolver 342 of FIG. 3. A first graph 1302 includes representations of sine and cosine values output by the coarse resolver 342. The first graph 1302 may represent the sine and cosine values 1312, 1314 sampled by the ADCs 318, 320 from differential voltage outputs of the coarse resolver 342 of FIG. 3. Prior to a first time T1, the coarse resolver 342 is not moving. After the first time T1, the coarse resolver 342 begins moving and causes changes in the sine and cosine values 1312, 1314.

A second graph 1304 includes representations of demodulated sine and cosine values 1322, 1324 corresponding to the sine and cosine values 1312, 1314 of the first graph 1302. Demodulation of the sine and cosine values 1312, 1314 to generate the demodulated sine and cosine values 1322, 1324 involves removing or deemphasizing the excitation signal, such as one of the excitation signals 352, 452 of FIGS. 3 and 4. The sine and cosine values 1312, 1314 correspond to the ADC outputs 358 (or the conditioned voltage values 360) of FIG. 3 associated with the coarse resolver 342. The demodulated sine and cosine values 1322, 1324 correspond to the demodulated outputs 362 of FIG. 3 associated with the coarse resolver 342. As compared to the signals 1212-1216 of FIG. 12, the values 1312, 1314, 1322, and 1324 correspond to the coarse resolver 342 (as opposed to the signals 1212-1216 which correspond to the fine resolver 344).

As illustrated in the second graph 1304, changes in the sine and cosine values 1312, 1314 are reflected two cycles later in the demodulated sine and cosine values 1322, 1324, i.e., the changes are delayed by two cycles. It takes one cycle (e.g., from peak amplitude to peak amplitude of sine or cosine wave) to measure the sine and cosine values 1312, 1314 and a second cycle to process a midvalue of the measured values during demodulation. To illustrate, a change in value (due to movement of the coarse resolver 342) of the sine and cosine values 1312, 1314 occurring during a first cycle from a first time T1 to a second time T2, is not reflected in the demodulated sine and cosine values 1322, 1324 until a third cycle from a third time T3 to a fourth time T4. Accordingly, the demodulation logic 826 imparts a relatively small delay (two cycles) and enables a relatively large increase in precision (multiple orders of magnitude) as compared to conventional demodulation systems, further described with respect to FIGS. 20-25.

Figure 14:
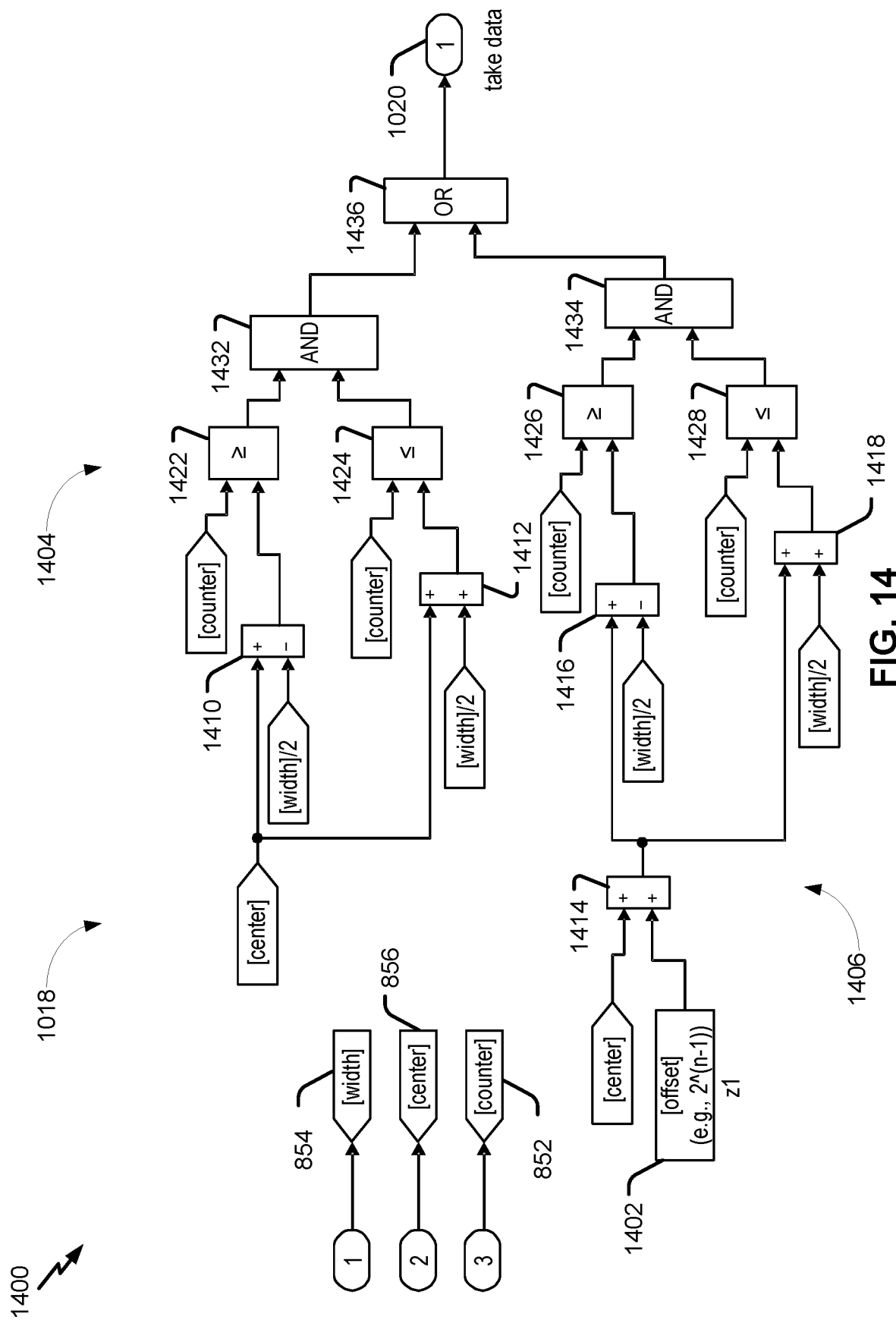
FIG. 14 is a logic diagram that illustrates an example of mask logic of FIG. 10.

FIG. 14 is a logic diagram 1400 that illustrates an example of the mask logic 1018 of FIG. 10. The mask logic 1018 is configured to generate the count enable input 1020 based on the counter input 852, the width input 854, and the center input 856. As illustrated in the example of FIG. 14, the mask logic 1018 includes multiple combiners 1410-1418, comparison conditions 1422-1428, and logic gates 1432-1436.

During operation, the mask logic 1018 receives the width input 854, the center input 856, and the counter input 852. The mask logic 1018 also receives or determines an offset input 1402. The offset input 1402 may be determined based on a number of bits of the inputs 852-856. For example, when the inputs 852-856 correspond to 8 bit values, a value of the offset input 1402 is 128, i.e., $2^{(8-1)}$. In a particular implementation, the inputs 852-856 are 8 bit unsigned integer values. The difference between the center input 856 and the width input 854 represents half of the width input 854.

The mask logic 1018 includes two logic chains 1404, 1406 configured to generate Boolean outputs. The mask logic 1018 generates an output based on a logical operation of the Boolean outputs from the two logic chains 1404, 1406. As illustrated in FIG. 14, the mask logic 1018 generates a take data Boolean output based on an "OR" logic operation of the Boolean outputs from the two logic chains 1404, 1406. In other implementations, other logical operations, such as NOR, AND, etc., may be used. A value of the take data Boolean output (i.e., the count enable input 1020) indicates to the accumulator logic 1014 to take data or not take data, as described with reference to FIG. 10.

During operation, the mask logic 1018 receives the three inputs 852-856. A value of the counter input 852 may change each time a counter value of the counter 842 is increased, such as based on a clock pulse. The counter input 852 is reset based on a reset pulse or reaching a maximum counter value. The width and center inputs 854, 856 may be constant and input by a user or fixed before operation. The offset input 1402 may be input by a user, fixed before operation, or determined based on one or more of the inputs 852-856.

Figure 15:
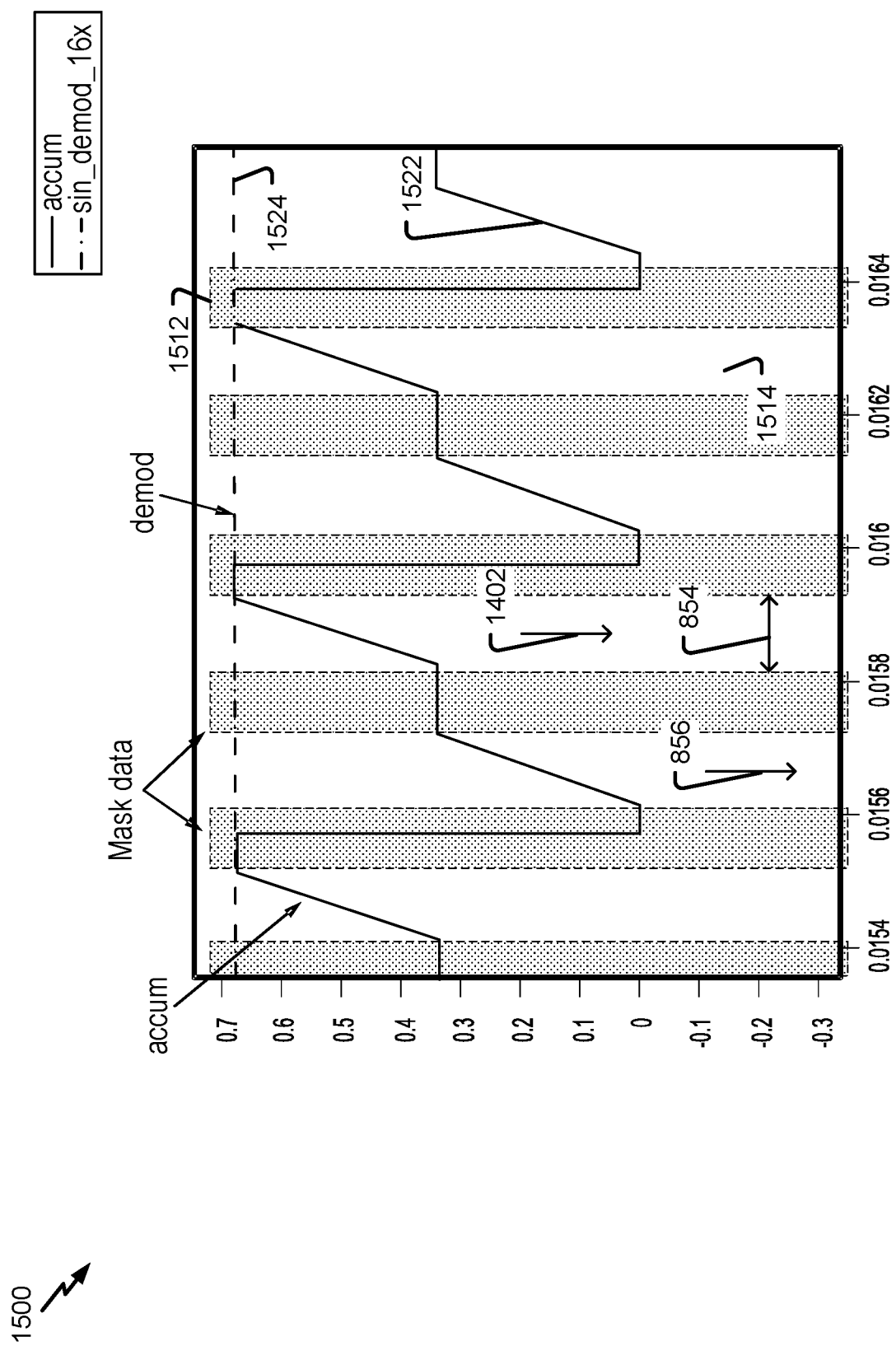
FIG. 15 is a diagram that illustrates an example of masked data and accumulated data for demodulation.

A first combiner 1410 of the first logic chain 1404 generates a difference between the center input 856 and half of the width input 854 (i.e., a [width]/2 input indicating a deviation or delta from the center input 856 that defines a data window 1514, as illustrated in FIG. 15). A first comparator 1422 compares the counter input 852 to the difference between the center input 856 and half of the width input 854 based on a first comparison condition. A second combiner 1412 generates a sum of the center input 856 and half of the width input 854. A second comparator 1424 compares the counter input 852 is compared to the sum of the center input 856 and half of the width input 854 based a second comparison condition. As illustrated in FIG. 14, the first comparison condition is a greater than or equal to condition and the second comparison condition is a less than or equal to condition. In other implementations, other comparison conditions may be used. Outputs of the comparators 1422, 1424 are input to a first logic gate 1432. The first logic gate 1432 outputs a first intermediary output to a third logic gate 1436 (the output logic gate) based on a logic rule of the first logic gate 1432.

A third combiner 1414 of the second logic chain 1406 generates a sum of the center input 856 and the offset input 1402. A fourth combiner 1416 generates a difference between, the sum of the center input 856 and the offset input 1402, and half of the width input 854. A third comparator 1426 compares the counter input 852 to the difference between the sum and half of the width input 854 based a third comparison condition. As illustrated in FIG. 14, the third comparison condition is the same as the first comparison condition. A fifth combiner 1418 generates a sum of the center input 856, the offset input 1402, and half of the width input 854. A fourth comparator 1428 compares the counter input 852 to the sum of the inputs 854, 856, and 1402 (i.e., the sum of the center input 856 and the offset input 1402 plus half of the width input 854) based a fourth comparison condition. As illustrated in FIG. 14, the fourth comparison condition is the same as the second comparison condition. Outputs of the comparators 1426, 1428 are input to a second logic gate 1434. The second logic gate 1434 outputs a second intermediary output to the third logic gate 1436 (output logic gate) based on a logic rule of the second logic gate 1434.

The third logic gate 1436 generates the take data output (the count enabled input 1020) based on a logic rule of the third logic gate 1436 and provides the take data output (the count enabled input 1020) to the accumulator logic 1014 of FIG. 10. As illustrated in FIG. 14, the logic rules of the first and second logic gates include AND logic and the logic rule of the third logic gate 1436 includes OR logic. In other implementations, other logic rules, additional logic gates, or both, may be used to regenerate the take data output (the count enabled input 1020).

FIG. 15 is a diagram 1500 that illustrates an example of masked data and accumulated data for demodulation. Diagram 1500 illustrates an example graph depicting accumulator signal 1522 (representing outputs 1156 of the third switch 1120), and a demodulated output signal 1524 (representing the accumulated outputs 1024) of the accumulator logic 1014, and masked regions 1512. Diagram 1500 also illustrates the width input 854 and the center input 856 in data windows 1514 between two particular masked regions 1512. In the diagram 1500, the center input 856 is positioned in a first data window 1514 of a cycle corresponding to (generated by outputs of) the first logic chain 1404 of FIG. 14, and the width and offset inputs 854, 1402 are position in a second data window 1514 of the cycle corresponding to (generated by outputs of) the second logic chain 1406 of FIG. 14. The cycle corresponds to a period of the sine wave and the counter input 852 being reset.

The accumulator signal 1522 increases when the count enabled input 1020 indicates to take or accumulate data filtered data, i.e., in the data windows 1514 between masked regions 1512. The accumulator signal 1522 does not increase during masked regions 1512 when the count enabled input 1020 indicates to refrain from taking or accumulating data. The accumulator logic 1014 outputs the demodulated output signal 1524 (values thereof) during the masked regions 1512 (i.e., every second masked region 1512) after stopping taking data in the masked regions 1512. After outputting a value of the demodulated output signal 1524, the accumulator logic 1014 is reset (i.e., a value of the accumulator signal 1522 reverts to 0) during the masked regions 1512. Thus, in the example illustrated in FIG. 15, the accumulator logic 1014 accumulates data during two data windows 1514 of a cycle and outputs the accumulated outputs 1024 once per cycle.

Figure 16:
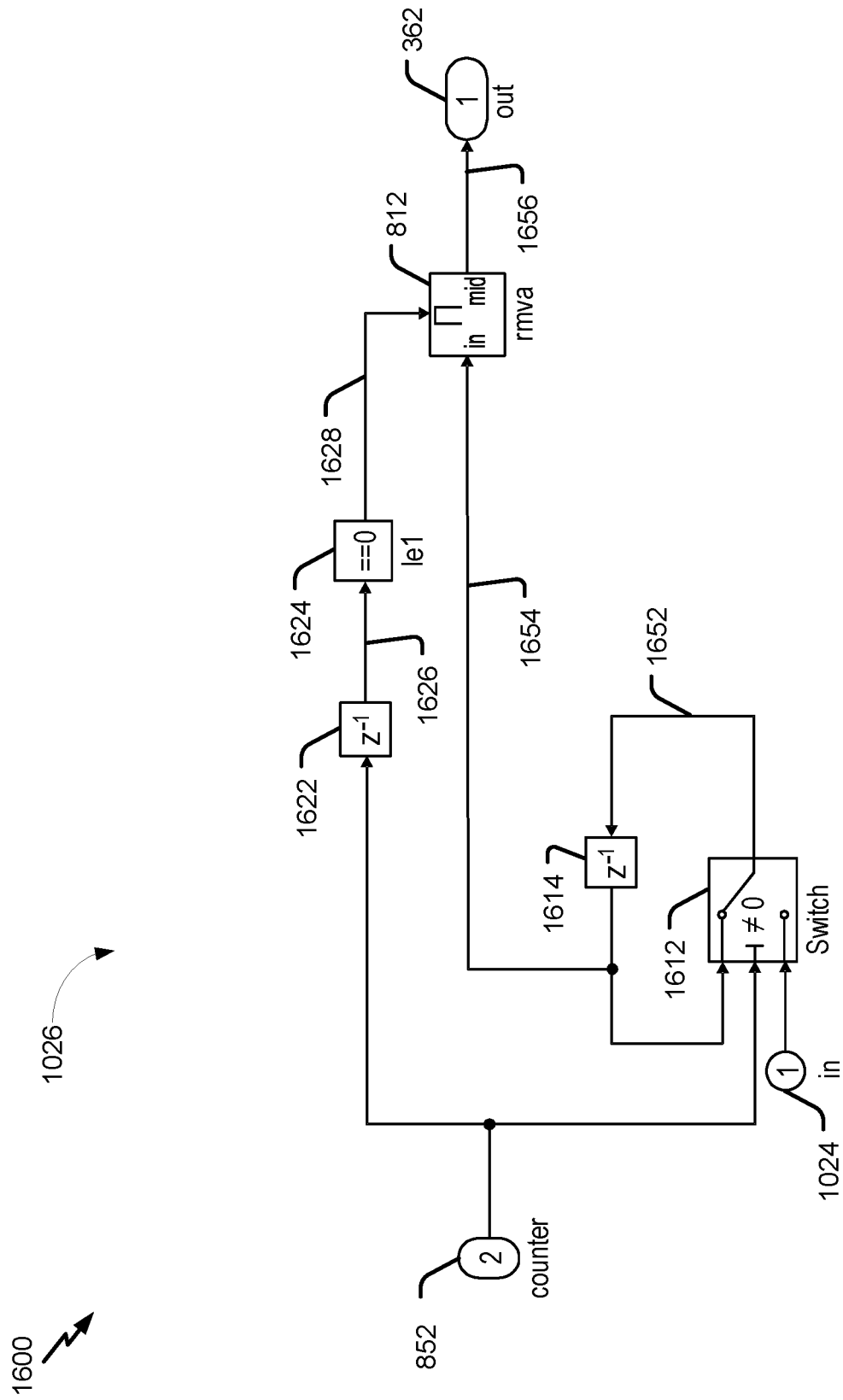
FIG. 16 is a logic diagram that illustrates an example of output logic of FIG. 10.

FIG. 16 is a logic diagram 1600 that illustrates an example of the output logic 1026 of FIG. 10. The output logic 1026 is configured to output a median value of the accumulated output 1024 values determined by the accumulator logic 1014 as the demodulated output 362 based on the accumulated output 1024 and the counter input 852. Operations of the accumulator logic 1014 and the output logic 1026 may be performed by an accumulator (e.g., accumulator circuitry).

As illustrated in the example of FIG. 16, the output logic 1026 includes a switch 1612 and the RMVA logic 812. As compared to the RMVA logic 812 of FIGS. 8 and 9, the RMVA logic 812 is configured to output values responsive to or based on a Boolean input value 1628. The RMVA logic 812 outputs the demodulated output 362 responsive to the Boolean input value 1628 indicating true.

The output logic 1026 is further configured to generate the Boolean input value 1628 based on the counter input 852. As illustrated in FIG. 16, a unit delay 1622 delays the counter input 852 by one sample to synchronize timings with inputs to the RMVA logic 812. The Boolean input value 1628 is generated based on a comparison of a delayed counter value 1626 to a comparison condition 1624. As illustrating in FIG. 16, the comparison condition 1624 is an equal to zero condition, and the Boolean input value 1628 indicates true when the delayed counter value 1626 satisfies the comparison condition 1624 (i.e., is equal to zero). The Boolean input value 1628 indicates false when the delayed counter value 1626 does not satisfy the comparison condition 1624 (i.e., not equal to zero).

During operation, the output logic 1026 receives the counter input 852. The counter input 852 is provided to the switch 1612, and the switch 1612 outputs the accumulated output 1024 or a delayed accumulator output 1654 based on the counter input 852. As illustrated in FIG. 16, the switch 1612 outputs the delayed accumulator output 1654 based on the counter input 852 satisfying a condition of not equal to zero. An output 1652 of the switch 1612 is provided to a unit delay 1614. The unit delay 1614 holds the output 1652 for a time period corresponding to one or more samples to generate the delayed accumulator output 1654. The delayed accumulator output 1654 is provided to the switch 1612 and the RMVA logic 812.

When the counter input 852 is equal to zero, the value of the accumulated output 1024 is reset to zero, as explained with reference to FIG. 11. While the counter input 852 is not equal to zero, the output logic 1026 stores the delayed accumulator output 1654 value until the accumulated output 1024 is received by the delay unit 1614 again i.e., when the counter input 852 is equal to 0. Thus, the unit delay 1614 (e.g., a register or shadow register) holds the value of the delayed accumulator output 1654 for one cycle, i.e., until a new accumulated output 1024 is received at the start of the next resolver excitation signal cycle, i.e., when the counter input 852 is equal to 0. The value of the delayed accumulator output 1654 corresponds to the previous final accumulator value of the accumulated output 1024 before the accumulated output 1024 was reset to zero. Because the RMVA logic 812 takes the value of the delayed accumulator output 1654 while the delayed accumulator output 1654 is being held by the switch 1612 and the delay unit 1614 (i.e., sampled by the RMVA logic 812 one sample after the counter input 852 is zero), the RMVA logic 812 receives the previous final accumulator value of the accumulated output 1024 before it was reset to zero.

The RMVA logic 812 determines a midvalue of the last n delayed accumulator outputs 1654 and outputs the midvalue of the last n delayed accumulator outputs 1654 as the demodulated output 362 responsive to the Boolean input value 1628 indicating true. In some implementations, the RMVA logic 812 of FIG. 8 uses the same number n for the last n inputs as the RMVA logic 812 of FIG. 16. In other implementations, the RMVA logic 812 of FIG. 8 uses a different number n for the last n inputs as the RMVA logic 812 of FIG. 16. In a particular implementation, the RMVA logic 812 determines a median demodulated output 1656 based on the last three delayed accumulator outputs 1654.

Figure 17:
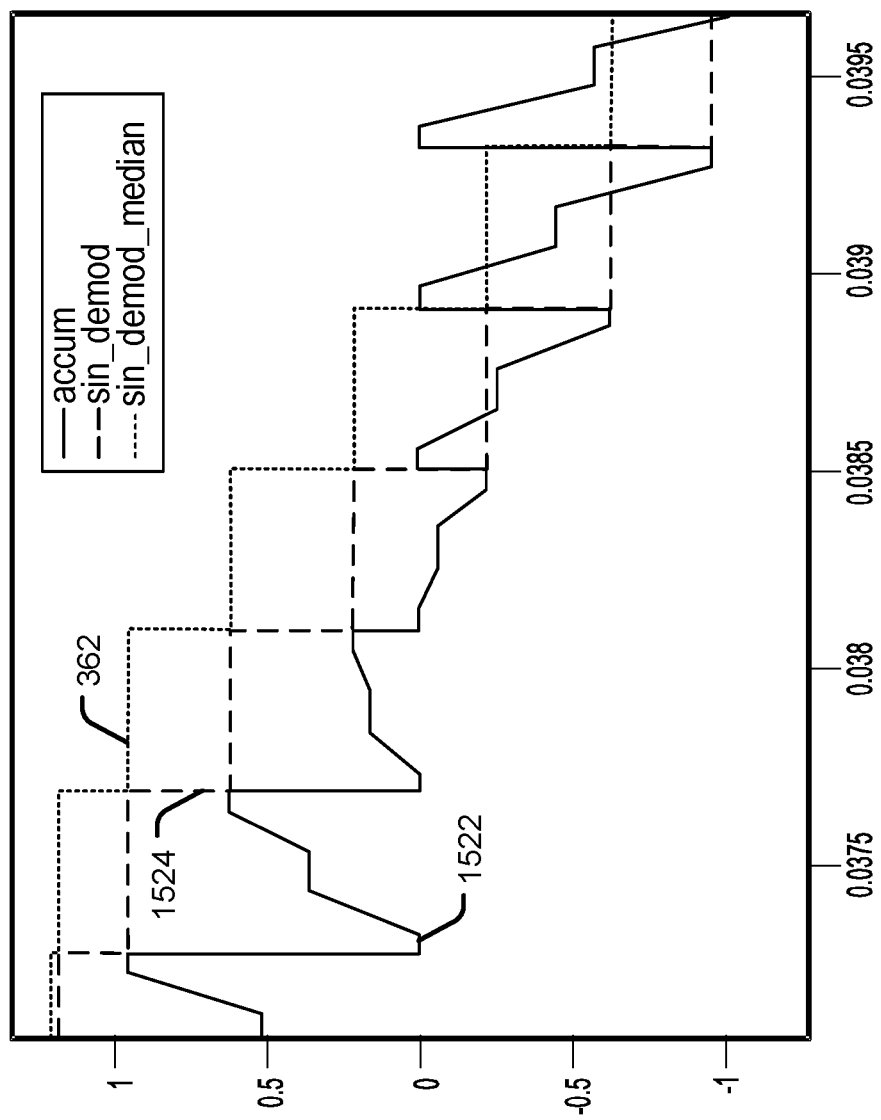
FIG. 17 is a diagram that illustrates an example of accumulator inputs and accumulator outputs for demodulation.

FIG. 17 is a diagram 1700 that illustrates an example of accumulator outputs for the demodulation circuitry. The accumulator, such as the accumulator logic 1014 and the output logic 1026 of FIG. 10, may generate multiple intermediary values and an output value. As illustrated in FIG. 17, the accumulator generates the accumulator signal 1522 (by accumulating values corresponding to outputs 1156 of the third switch 1120), generates the demodulated output signal 1524 (corresponding to accumulated outputs 1024), and generates the demodulated sine outputs 362 (corresponding median values of the demodulated output signal 1524 or the median demodulated output 1656), as described with reference to FIGS. 10-16. The demodulated output signal 1524 and the demodulated sine outputs 362 include sign information (i.e., positive or negative).

FIG. 18 is a logic diagram 1800 that illustrates an example of logic 1802 for combining resolver outputs of the dual speed resolver 312. The logic 1802 is configured to combine outputs from each resolver 342, 344 of the dual speed resolver 312 to determine an initial position in the first domain or an absolute initial position and to determine subsequent positions based on the fine resolver alone. Determining subsequent positions (e.g., changes in position from the initial position) based on the fine resolver alone increases precision over dual speed resolvers that determine subsequent positions based on outputs from the coarse resolver. Operations of the logic 1802 may be performed by the angle combination circuitry 542 of FIG. 5.

The logic 1802 receives the angle estimates 364 in a second domain based on fine position signals from the fine resolver 344, referred to as second domain angle estimates 1812 in FIG. 18. The second domain angle estimates 1812 received from the fine resolver 344 are in the second domain (e.g., a 16 speed domain) associated with the fine resolver 344. The logic 1802 differentiates the second domain angle estimates 1812 to determine a change in position (speed) in the second domain. For example, a previous position value 1814 is subtracted from a current position value 1816 of the second domain angle estimates 1812 to generate a change in position value 1818. The change in position value 1818 may be converted to a 32 bit signed integer and delayed to account for a processing pipeline or flow of the circuitry used to perform the logic 1802. The change in position value 1818 is right shifted by 4 (divided by 16) to convert the change in position value 1818 into the first domain to generate a converted change in position value 1820 (e.g., transformed fine position signals of the fine resolver 344 of FIG. 3). The converted change in position value 1820 represents a change in position determined by the fine resolver 344 with respect to the first domain.

The logic 1802 receives an estimated initial position 1822 determined based on coarse position signals of the coarse resolver 342. The estimated initial position 1822 corresponds to a first or initial angle estimate of the angle estimates 364 of the coarse resolver 342. The estimated initial position 1822 represents the initial position determined by the coarse resolver 342 and is in the first domain. A switch 1826 (e.g., an initialization switch) is configured to output the estimated initial position 1822 when a Boolean input 1824 (init_rslv) indicates true, i.e., the dual speed resolver 312 is in an initialization mode. The switch 1826 is configured to output position feedback (e.g., a previously determined position, such as a delayed combined estimated angle 1844) when the Boolean input 1824 (init_rslv) indicates false, i.e., the dual speed resolver 312 is not in the initialization mode.

The converted change in position value 1820 and the estimated initial position 1822 are combined by a combiner 1830 (e.g., adder or other arithmetic circuitry) to generate a combined estimated angle 1832 (e.g., an estimated position of the motor). The combined estimated angle 1832 includes or corresponds to the estimated position 366 of FIG. 3. In some implementations, the combiner 1830 further receives a drift correction value 1828 and is configured to generate the combined estimated angle 1832 based further on the drift correction value 1828. In such implementations, the combined estimated angle 1832 is delayed, such as by a zero order hold, to generate the delayed combined estimated angle 1844. The delayed combined estimated angle 1844 is provided to the drift correction circuitry 544 of FIG. 5 to generate the drift correction value 1828. Generation of the drift correction value 1828 is described with reference to FIG. 19. For a first or initial combined estimated angle 1832 (i.e., an initial position), the drift correction value 1828 is zero because the drift correction circuitry 544 has not yet received a combined estimated angle 1832 and begun to provide the drift correction value 1828.

The combined estimated angle 1832 is provided as an output of the logic 1802. In some implementations, the logic 1802 generates one or more additional outputs based on the combined estimated angle 1832. For example, the combined estimated angle 1832 is combined with a rotor offset 1852 for commutation of the rotor. To illustrate, the rotor offset 1852 for commutation of the motor 124 accounts for the misalignment between the resolver and rotor magnets of the motor 124. Additionally or alternatively, the combined estimated angle 1832 is combined with a rotor offset 1862 for servo control of the rotor, such as a rotor servo offset. To illustrate, the rotor offset 1862 for servo control of the motor 124 accounts for an offset of a state in which the gimbal (e.g., one of the gimbals 122 of FIG. 1) is pointing upwards relative to a horizon or opposite a gravitational force. In a particular implementation, the rotor offsets 1852, 1862 are a constant values and are input by a user.

These rotor offsets 1852, 1862 are commonly referred to as taring the resolver outputs. Taring the resolver outputs helps improve precision and precision taring is often needed in conventional dual resolvers. However, taring has reduced effects (reduced improvements) and less precise taring may be used when reducing noise due to time coordination of excitation signals and current drive switching, when dither is added to the excitation signal, or both, as described with reference to FIGS. 22-28. Tared outputs 1856, 1866 may be provided to other components to adjust for commutation and servo control of the rotor. For example, the servo offset output 1866 may be provided to the feedback control system 232 of FIG. 2 for initialization of the inertial measurement unit 102, as described with reference to FIG. 32. As another example, the tared outputs 1856, 1866 may indicate the estimated position of the motor 124. To illustrate, when the combined estimated angle 1832 indicates the position of the dual speed resolver 312 of FIG. 3, the combined estimated angle 1832 may be adjusted to indicate the position of the motor 124. The combined estimated angle 1832 is adjusted/tared to indicate the estimated position of the motor or components thereof, such as the mechanical or magnetic rotor position of FIG. 3. Additionally or alternatively, the tared outputs 1856, 1866 may be used to determine the estimated RPM 368 of the motor 124.

The logic 1802 generates subsequent position outputs (outputs after an initial position is determined or after initialization process) independent of subsequent coarse resolver 342 position inputs. To illustrate, when the Boolean input 1824 indicates that initialization process is completed (e.g., when the Boolean input 1824 is equal to zero), the switch 1826 "filters out" the subsequent coarse resolver 342 position inputs (i.e., the estimated initial position 1822) and provides the previously calculated angle (the delayed combined estimated angle 1844). Said another way, the logic 1802 determines subsequent changes in position based on the subsequent fine resolver 344 outputs of the fine resolver 344 alone.

FIG. 19 is a logic diagram 1900 that illustrates an example of logic 1902 for a drift corrector of the dual speed resolver 312. Operations of the logic 1902 may be performed by the drift correction circuitry 544 of FIG. 5. The logic 1902 is configured to generate the drift correction value 1828 based on the delayed combined estimated angle 1844, the second domain angle estimates 1812 and a 180 degree bias value 1918.

The logic 1902 receives the angle estimates 364 of the fine resolver 344 of the dual speed resolver 312 as the second domain angle estimates 1812. The logic 1902 further receives the delayed combined estimated angle 1844 (e.g., a delayed version of the combined estimated angle 1832 generated by the logic 1802 of FIG. 18). The delayed combined estimated angle 1844 is in the first domain (e.g., a 1 speed domain) associated with the motor 124 and the coarse resolver 342. The logic 1902 converts the delayed combined estimated angle 1844 to the second domain (e.g., a 16 speed domain) associated with the fine resolver 344 of the dual speed resolver 312. As illustrated in FIG. 9, the delayed combined estimated angle 1844 is left shifted by 4 (multiplied by 16) to generate a converted estimated angle 1914 (e.g., transformed initial position outputs).

The converted estimated angle 1914 and the 180 degree bias value 1918 are subtracted from the second domain angle estimates 1812 to generate an error value 1920. In the implementation illustrated in FIG. 9, the logic 1902 uses 32 bit integers and the 180 degree bias value 1918 corresponds to a value of $2^{\wedge}31-1$ (or $2^{\wedge}$(number of bits-1)-1). The 180 degree bias value 1918 provides protection against noise and integer math errors which cause incorrect alignment of the resolvers 342, 344 during initialization. The noise and integer math errors may be caused by differentiation of the second domain angle estimates 1812.

The error value 1920 may be converted into a signed integer, such as a 32 bit signed integer. Proportional gain 1922 and integral gain 1924 are applied to the error value 1920 by proportional gain circuitry and integral gain circuitry. In some implementations, the proportional gain 1922 and integral gain 1924 are generated based on the error value 1920. As illustrated in FIG. 19, the proportional gain 1922 is generated by right shifting the error value 1920 by 15 (dividing by 32768), and the integral gain 1924 is generated by a switch 1926. The switch 1926 outputs the integral gain 1924 having a value of 1 or −1 based on comparing the error value 1920 to a comparison condition of greater than or equal to zero.

The proportional gain 1922 and the integral gain 1924 are combined (added) by a combiner 1928 to generate a drift correction value 1828. The drift correction value 1828 may be stored, provided to the logic 1802, or both. For example, the drift correction value 1828 is provided to the combiner 1830 of the logic 1802 to determine a next combined estimated angle 1832, as described with reference to FIG. 18. The next combined estimated angle 1832 adjusts or corrects a subsequent combined estimated angle 1832 (combined estimated angle 1832 for subsequent positions) to account for the lower precision of the coarse resolver outputs used in generating the combined estimated angle 1832 for the initial position. Accordingly, the logic 1902 may correct or reduce errors that occur when combining resolvers of different speeds in a dual speed resolver, such as the dual speed resolver 312 of FIG. 3.

Figure 20:
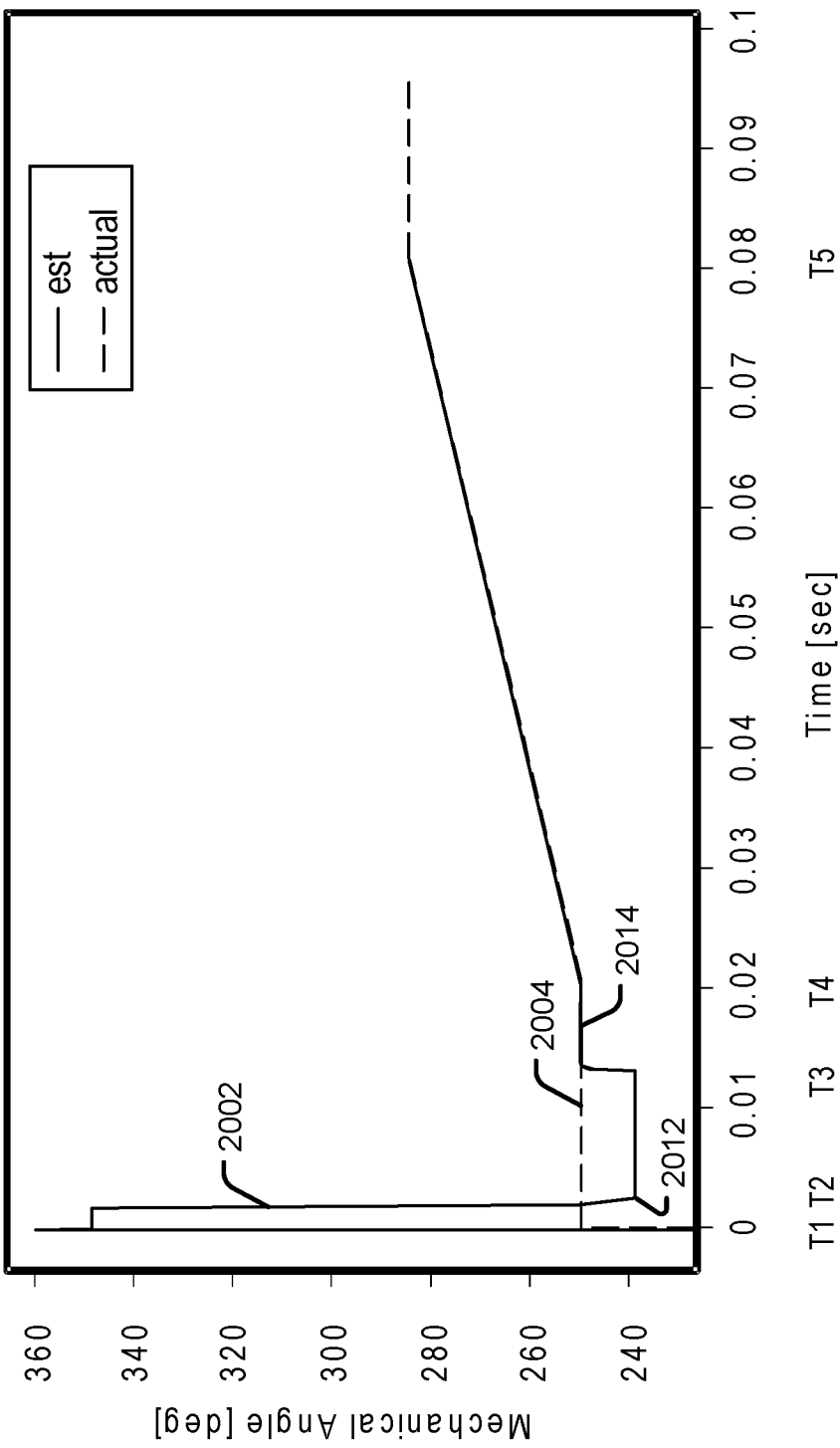
FIG. 20 includes a diagram illustrating a mechanical angle estimated by the resolver system of FIG. 2 and an actual angle of the motor.

FIG. 20 includes a diagram 2000 illustrating an estimated angle 2002 of the resolver system 204 and an actual angle 2004 of the motor. The estimated angle 2002 may include or correspond to the estimated position 366 of FIG. 3 or the combined estimated angle 1832 of FIG. 18. Alternatively, the estimated angle 2002 may include or correspond to an adjusted (tared) estimated position 366 (e.g., one of the tared outputs 1856, 1858 of FIG. 18) or the combined estimated angle 1832 of FIG. 18. Diagram 2000 illustrates the estimated angle 2002 output by the resolver system 204 during and after an initialization process or mode.

At a first time T1 of FIG. 20, the resolver system 204 is activated and begins an initialization mode or process. During the initialization mode or process, the resolver system 204 generates an initial position output 2012 of the estimated angle 2002 at a second time T2 of FIG. 20 based on the coarse resolver outputs. After the second time T2 of FIG. 20, the resolver system 204 begins to utilize the drift correction circuitry 544 to correct the estimated angle 2002. At a third time T3 of FIG. 20, the drift correction circuitry 544 has adjusted for an initial error of the coarse resolver 342 and is locked on to the position of the stationary motor. After the third time T3, the resolver system 204 generates a subsequent position output 2014 of the estimated angle 2002. At a fourth time T4 of FIG. 20, the motor begins to move. At a fifth time T5 of FIG. 20, the motor stops moving.

Figure 21:
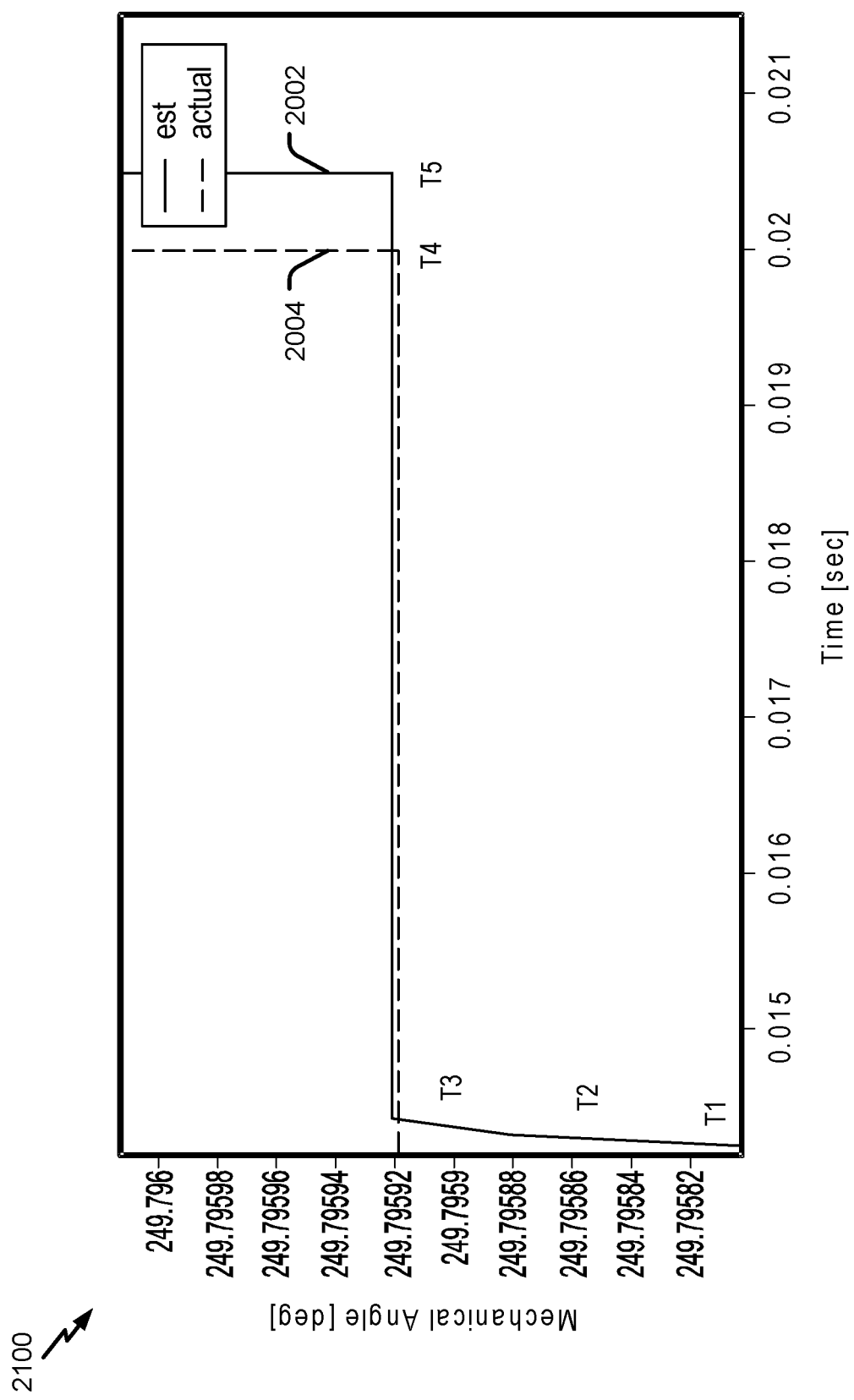
FIG. 21 include a diagram that depicts an enlarged view of the diagram of FIG. 20.

FIG. 21 includes a diagram 2100 that depicts an enlarged view of the diagram 2000 of FIG. 20. Diagram 2100 better illustrates the delay and precision of the resolver system 204. Diagram 2100 depicts a small error at the third time T3 after the drift correction circuitry 544 has adjusted for the initial error of the coarse resolver 342 and is locked on to the position of the stationary motor. As described with reference to FIG. 20, at the fourth time T4, the motor begins to move. However, the resolver system 204 does not detect the movement and output an angle estimate corresponding to the movement until a fifth time T5 of FIG. 21, because of the demodulation processing delays described with reference to FIGS. 12 and 13. After the fifth time T5, the resolver system 204 begins to track the movement of the motor that occurred at the fourth time T4. Diagram 2100 illustrates a precision of 0.01 arc-sec.

Figures 22A, 22B:
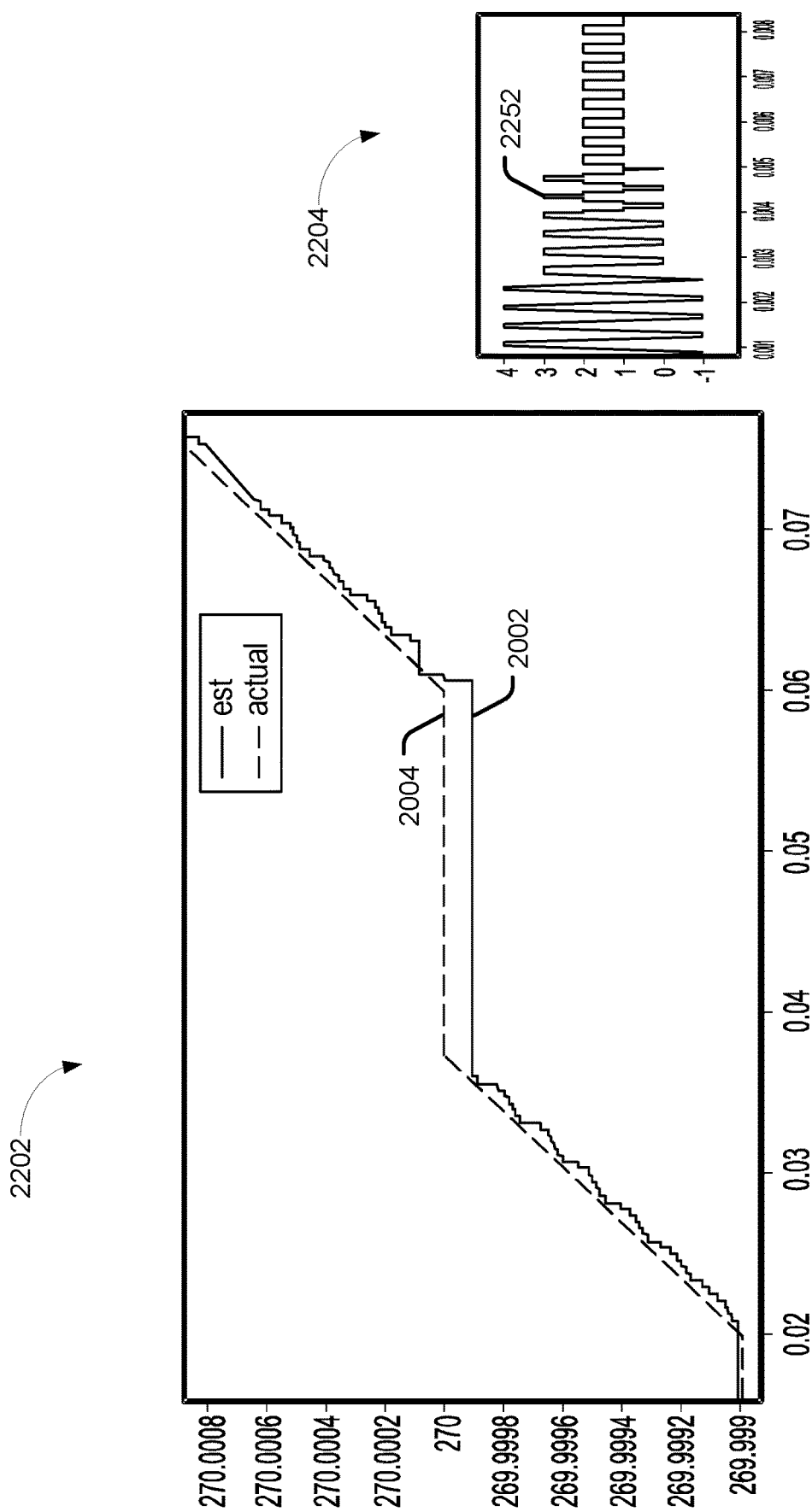
FIG. 22A is a diagram that illustrates angles determined based on resolver outputs using an excitation signal without dither.
FIG. 22B is a diagram that illustrates analog-to-digital converter (ADC) outputs generated based on resolver outputs generated by an excitation signal without dither.

FIG. 22A is a diagram 2202 that illustrates angles determined based on resolver outputs using an excitation signal without dither, such as the excitation signal 452 of FIG. 4. FIG. 22A depicts activation of the motor at about 0.02 seconds and deactivation at about 0.0375 seconds. In FIG. 22A, the estimated angle 2002 of the drive shaft of the motor tracks the actual angle 2004 of the drive shaft with a precision of about 1.23 arc-sec. The motor is reactivated and resumes moving at about 0.06 seconds and the resolver system 204 continues to track the motor.

FIG. 22B is a diagram 2204 that illustrates ADC outputs 2252 generated based on resolver outputs generated by the excitation signal without dither. The ADC outputs 2252 are substantially symmetrical and uniform and the ADC outputs 2252 latch on to single bit for relatively long periods of time. Latching onto a single bit for relatively long periods of time prevents oversampling from increasing precision because it causes the accumulated value to not be zero and/or to not change.

FIG. 23 is a diagram 2300 that illustrates an example of an excitation signal including dither, such as the dithered excitation signal 352 of FIG. 3. In FIG. 23, the dithered excitation signal 352 still repeats like a regular sine wave, but the amplitude of the dithered excitation signal 352 has local variations. For example, the amplitude of dithered excitation 352 has sinusoidal fluctuations over the course of a sine wave of the base excitation signal 452 (e.g., a first harmonic). To illustrate, the amplitude increases at times during transitions from peaks to valleys and decreases at times during transitions from valleys to peaks. As illustrated in FIG. 23, the excitation signal 452 is dithered based on a high order even harmonic of the excitation signal 452 to create the dithered excitation signal 352. Thus, the dithered excitation signal 352 includes "miniature sine wave" deviations from the excitation signal 452. Because a high order even harmonic (e.g., $16^{th}$ harmonic) is used, the dither does not affect or alter the mean amplitude of the sine wave because the base excitation signal 452 and even harmonic have the same phase and because a harmonic signal has the same function as the base excitation signal 452. Accordingly, the dither does not introduce noise that results in additional errors and a decrease in precision.

Figure 24:
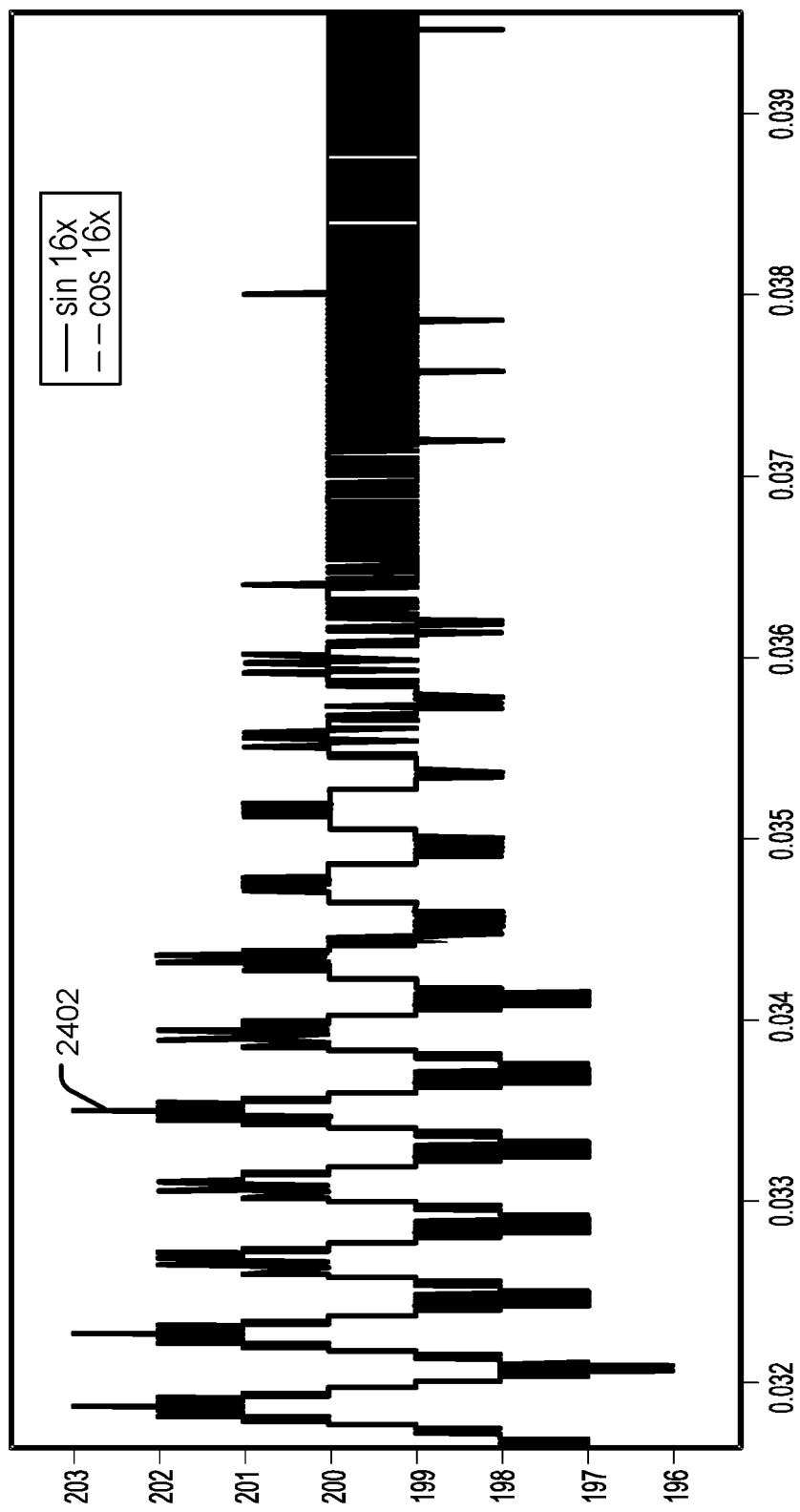
FIG. 24 is a diagram that illustrates ADC outputs generated based on a dithered excitation signal.

FIG. 24 is a diagram 2400 that illustrates ADC outputs 2402 generated based on resolver outputs generated by a dithered excitation signal. As compared to the ADC outputs 2252 generated based on the excitation signal without dither of FIG. 22B, the ADC outputs 2402 generated based the dithered excitation signal have more variability and the ADC outputs 2402 do not latch on to the same value for as long or as much. Thus, the accumulated output 1024 can fluctuate and be zero. Accordingly, the estimated angle 2002 can fluctuate from overestimating and underestimating the actual angle 2004, as shown in FIG. 25.

Figure 25:
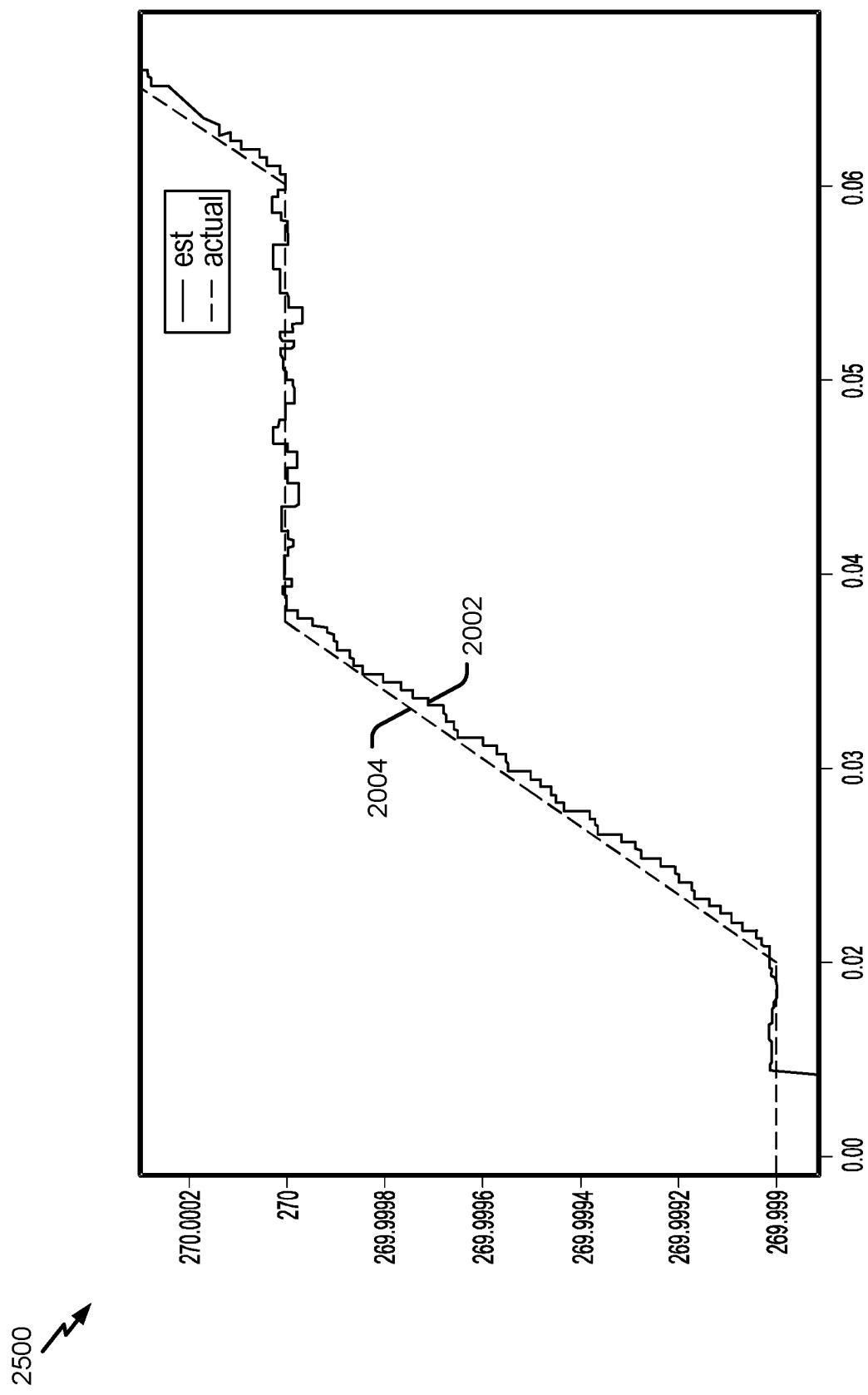
FIG. 25 is a diagram that illustrates angles determined based on a dithered excitation signal.

FIG. 25 is a diagram 2500 that illustrates angles determined based on resolver outputs generated based on the dithered excitation signal 352 of FIG. 23. In FIG. 25, the estimated angle 2002 of the drive shaft of the motor tracks the actual angle 2004 of the drive shaft. The dithered excitation signal 352 causes the estimated angle 2002 to switch between overestimating and underestimating the actual angle 2004 of the drive shaft. Thus, by averaging the estimated angle 2002 (e.g., averaging over a 1 second interval), the dithered excitation signal 352 enables the resolver system 204 to provide 0.01 arc-sec of precision. A precision of 0.01 arc-sec represents a multiple order of magnitude increase in precision as compared to the precision of the estimated angle 2002 of FIG. 22A.

Figure 26:
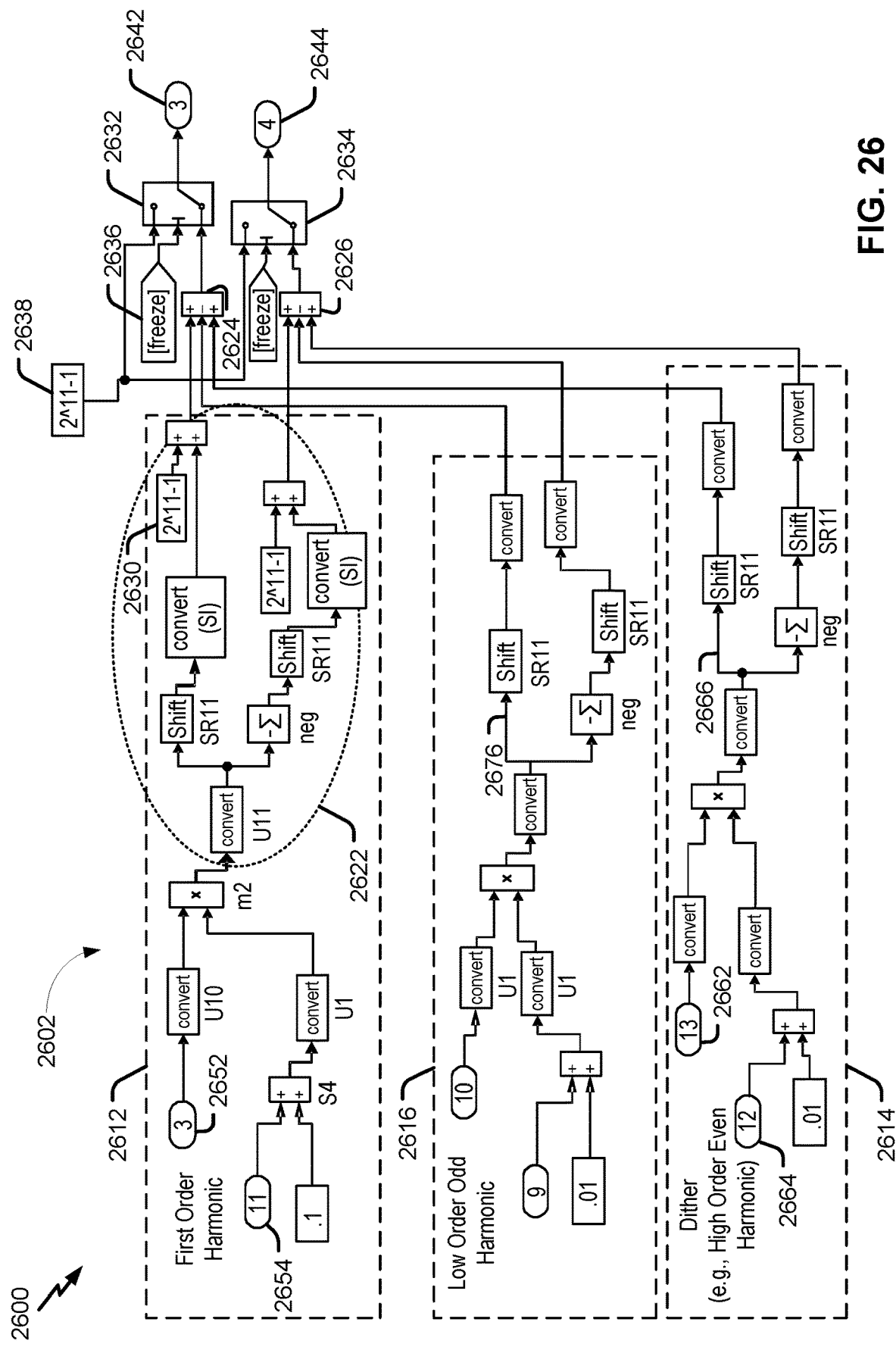
FIG. 26 is a logic diagram that illustrates an example of logic for excitation signal generation.

FIG. 26 is a logic diagram 2600 that illustrates an example of logic 2602 for excitation signal generation. The logic 2602 is configured to generate excitation signals to be provided to an active sensor, such as the dual speed resolver 312 of FIG. 3. For example, the logic 2602 outputs digital differential outputs to the DAC 310, which converts the digital differential outputs into the excitation signals provided to the rotating primary coil 422 of the resolvers 342, 344. Operations of the logic 2602 may be performed by the excitation signal generation system 202 of FIG. 2 (e.g., excitation signal generation circuitry).

The logic 2602 enables generation of different types of excitation signals, including the dithered excitation signal 352 of FIG. 3 or the excitation signal 452 of FIG. 4. The logic 2602 includes one or more logic chains configured to generate an excitation signal. As illustrated in FIG. 26, the logic 2602 includes three logic chains 2612-2616. Each logic chain 2612-2616 is directed to generating a portion of the excitation signal. In other implementations, the logic 2602 may include additional logic chains or fewer logic chains. In the example illustrated in FIG. 26, the logic 2602 includes logic chains 2612-2616, two of which (logic chains 2612 and 2614) are active.

A first logic chain 2612 is configured to generate a first order harmonic (i.e., the base excitation signal 452). A second logic chain 2614 is configured to generate dither. As illustrated in FIG. 26, the second logic chain 2614 is configured to generate a high order even harmonic of the base excitation signal. An example of a high order even harmonic is a $16^{th}$ harmonic. Other high order even harmonics may be used depending on the sampling rate of the ADC's and DAC's, the frequency of the hardware, or a combination thereof. For example, other implementations may utilize an $8^{th}$ harmonic, a $10^{th}$ harmonic, a $12^{th}$ harmonic, an 18th harmonic a 20th harmonic, a 24th harmonic, a 32nd harmonic, a 64th harmonic, etc., or a combination thereof. A third logic chain 2616 is configured to generate a low order odd harmonic of the base excitation signal. As illustrated in FIG. 26, the third logic chain 2616 is configured to generate a third harmonic of the base excitation signal 452. Addition of one or more low order odd harmonic tends to "square" the excitation signal. Other low order odd harmonics may be used, alone or in combination with the third harmonic, to square the excitation signal. Squaring the excitation signal can increase the signal to noise ratio of sensor outputs.

During operation, the first logic chain 2612 generates the base excitation signal 452. As illustrated in FIG. 26, the first logic chain 2612 generates the base excitation signal 452 as a differential signal (including positive and negative signal components) The first logic chain 2612 receives two inputs: a sine function at input 2652 and an amplitude setting for the sine function at input 2654. In some implementations, the first logic chain 2612 reduces a number of bits of the sine function, the amplitude setting, or both. Additionally or alternatively, the first logic chain 2612 shifts the amplitude setting by addition of a user defined value, e.g., 0.1 in FIG. 26. The first logic chain 2612 multiplies the sine function by the shifted amplitude setting to generate an intermediary sine wave.

The first logic chain 2612 generates differential outputs (e.g., a positive output and a negative output) based on the intermediary sine wave. For example, the first logic chain 2612 includes conversion logic 2622 configured to generate the differential outputs based on generating a positive value and a negative value for each value of the intermediary sine wave.

In some implementations, the conversion logic 2622 is further configured to convert the positive and negative outputs to unsigned values and to further reduce a number of bits of the positive and negative outputs for processing by the DAC 310 of FIG. 3. Reducing a number of bits of the positive and negative outputs does not lower the precision of inertial measurement unit 102 when the positive and negative outputs have more bits than the DAC 310 is configured to process. Additionally, the first conversion logic 2622 adjusts the positive and negative outputs based on addition of a mid-voltage bias value 2630. In FIG. 26, the mid-voltage bias value 2630 is 2^11−1, and the DAC 310 is a 12 bit DAC.

The first logic chain 2612 provides the positive and negative outputs of the first logic chain 2612 to combiners 2624, 2626. The positive and negative outputs of the first logic chain 2612 correspond to the base excitation signal 452 (or a first harmonic of the dithered excitation signal 352).

The second logic chain 2614 generates the dither to be added to (combined with) the excitation signal generated by the first logic chain 2612. The second logic chain 2614 receives two inputs: a high order even harmonic of the sine function at input 2662 and an amplitude setting for the high order even harmonic of the sine function at input 2664. In some implementations, the second logic chain 2614 reduces a number of bits of the high order even harmonic of the sine function, the amplitude setting of the high order even harmonic, or both. Additionally or alternatively, the second logic chain 2614 shifts the amplitude setting by addition of a user defined value, e.g., 0.01 in FIG. 26. The second logic chain 2614 multiplies the high order even harmonic of the sine function by the shifted amplitude setting to generate a high order even harmonic signal 2666 (i.e., an example of the dither of the dithered excitation signal 352).

The second logic chain 2614 generates differential outputs (e.g., a positive output and a negative output) based on the high order even harmonic signal 2666. For example, the second logic chain 2614 includes conversion logic 2622 configured to generate the differential outputs based on generating a positive value and a negative value for each value of the high order even harmonic signal 2666.

The second logic chain 2612 (or conversion logic 2622) may convert the positive and negative outputs to unsigned values and may further reduce a number of bits of the positive and negative outputs for processing by the DAC 310 similar to the first logic chain 2602.

Operation of the third logic chain 2606 is similar to operation of the second logic chain 2614. In the particular implementation, an amplitude setting of the third logic chain 2602 is zero, i.e., the logic 2602 does not use the third harmonic to generate the excitation signal.

The combiners 2624, 2626 combine the outputs of the logic chains 2612-2616. For example, the combiner 2624 adds the positive outputs of the first logic chain 2612 and the second logic chain 2614 to generate a positive combined output. The combiner 2624 adds the negative outputs of the first logic chain 2612 and the second logic chain 2614 to generate negative combined output. The logic 2602 provides the positive and negative combined outputs to the DAC 310 via output terminals 2642, 2644. The DAC 310 converts the combined outputs into the dithered excitation signal 352. In other implementations, the combiners 2624, 2626 may subtract the outputs of the third logic chain 2616.

In some implementations, the logic 2602 includes logic for an initialization process. As illustrated in FIG. 26, the logic 2602 includes switches 2632, 2634, a Boolean input 2636 (labeled freeze in FIG. 26), and a mid-voltage initialization value 2638. In the example illustrated in FIG. 26, the DAC 310 is a 12 bit DAC and the mid-voltage value is half of the 12 bit value (2^11−1). The switches 2632, 2634 are configured to switch between outputting the combined excitation signal output of the combiners 2624, 2626 or the mid-voltage initialization value 2638 based on the Boolean input 2636. As illustrated in FIG. 26, the logic 2602 is not operating in the initialization mode, as indicated by a position of the switches 2632, 2634.

In some implementations, the sine function inputs are generated using a table (e.g., a look-up table) of stored values. In a particular implementation, the look-up table for the sine function inputs is shared, i.e., one sine look-up table that generates the sine function inputs for the three logic chains 2612-2616. Additionally, the sine look-up table may be shared with other components and logic of the inertial measurement unit 102, as described further herein. For example, the sine look-up table may be shared with other components and logic via Round-Robin scheduling. In other implementations, the sine function inputs are calculated using a series of arithmetic logic operations (e.g., add and shift operations) or Taylor expansion.

Figure 27:
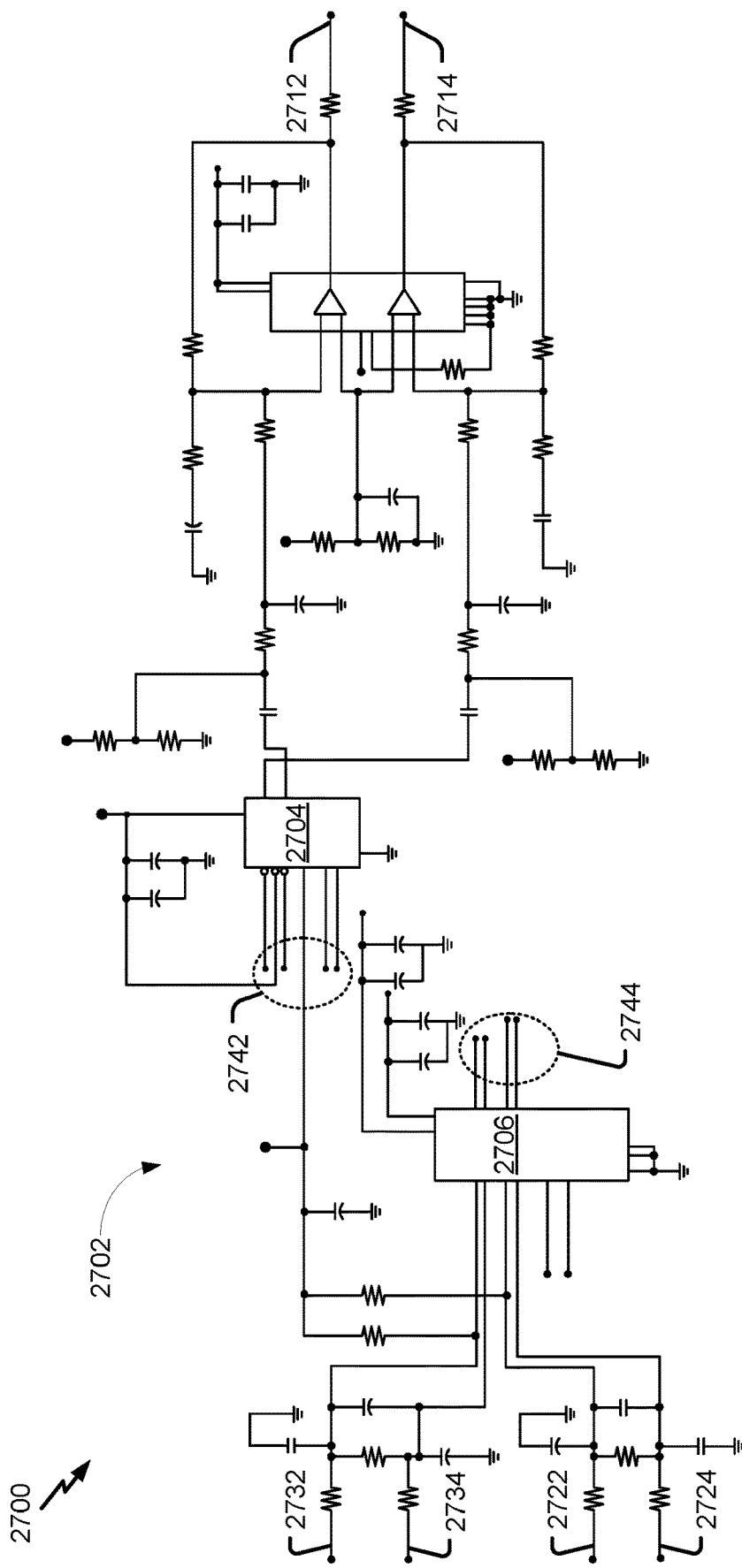
FIG. 27 is a circuit diagram that illustrates an example of a resolver driver circuit.

FIG. 27 is a circuit diagram 2700 that illustrates an example of a resolver driver circuit 2702. The resolver driver circuit 2702 generates a differential excitation signal, such as the excitation signals 352, 452 of FIGS. 3 and 4) and sends the differential excitation signal to a resolver via terminals 2712 and 2714. The resolver driver circuit 2702 may include or correspond to the excitation signal generation system 202 of FIG. 2. In some implementations, the differential excitation signal is time coordinated with the current drive switching of the motor.

The resolver driver circuit 2702 includes a low precision ADC 2704 and a high precision ADC 2706. As an example, the low precision ADC 2704 may be a 10 or 12 bit ADC and the high precision ADC 2706 is a 16 bit ADC. In other implementations, other size ADCs may be used. The low precision ADC 2704 and the high precision ADC 2706 are configured to time coordinate the excitation signal (or the dithered excitation signal 352) with the PWM 242, the ADCs 318, 320, and the demodulation system 222 of FIGS. 2 and 3.

The low precision ADC 2704 is configured to receive resolver outputs and generate the differential excitation signal. The low precision ADC 2704 provides the differential excitation signal to the resolver(s). For example, the low precision ADC 2704 provides the differential signal to a particular resolver of the dual speed resolver 312 of FIG. 3 via the terminals 2712 and 2714. The low precision ADC 2704 is also configured to generate serial peripheral interface (SPI) excitation signals 2742 and to send the SPI excitation signals 2742 to components of the inertial measurement unit 102, such as an FPGA thereof.

The high precision ADC 2706 is configured to receive resolver outputs and generate SPI feedback signals 2744. The SPI feedback signals 2744 are provided to components of the inertial measurement unit 102, such as an FPGA thereof. The SPI excitation and feedback signals 2742, 2744 enable time coordination between components of the inertial measurement unit 102. The SPI excitation and feedback signals 2742, 2744 may be generated based on the resolver feedback. For example, the SPI excitation signals 2742 are generated based on positive sine and cosine feedback (and independent of negative sine and cosine feedback) and the SPI feedback signals 2744 are based on the differential sine and cosine feedback.

During operation, the resolver driver circuit 2702 receives differential sine feedback from a particular resolver (such as one of the resolvers 342, 344) of the dual speed resolver 312 at terminals 2722 and 2724. The resolver driver circuit 2702 receives differential cosine feedback from the particular resolver at terminals 2732 and 2734. The differential sine and cosine feedback are used to generate the differential resolver excitation signal and the feedback signal. Because the differential excitation signal and the SPI excitation signals 2742 are generated based on the resolver feedback, the DAC 310, the dual speed resolver 312, the differential voltage sensors 314, 316, or a combination thereof, can be time coordinated. Because the SPI feedback signals 2744 are generated based on the resolver feedback and indicate a timing of the resolver system 204 (e.g., a timing of inputs and outputs), the demodulation system 222, the dual resolver combination system 224, the feedback control system 232, the PWM 242, or a combination thereof, can be time coordinated with each other and the components time coordinated by the SPI excitation signals 2742. To illustrate, the SPI excitation and feedback signals 2742, 2744 indicate data and clock data (e.g., when to sample the data), thereby enabling synchronization between components. Additionally or alternatively, the PWM 242 can be time coordinated with the above components by counter or clock synchronization, as described with reference to FIGS. 33-35.

Figure 28:
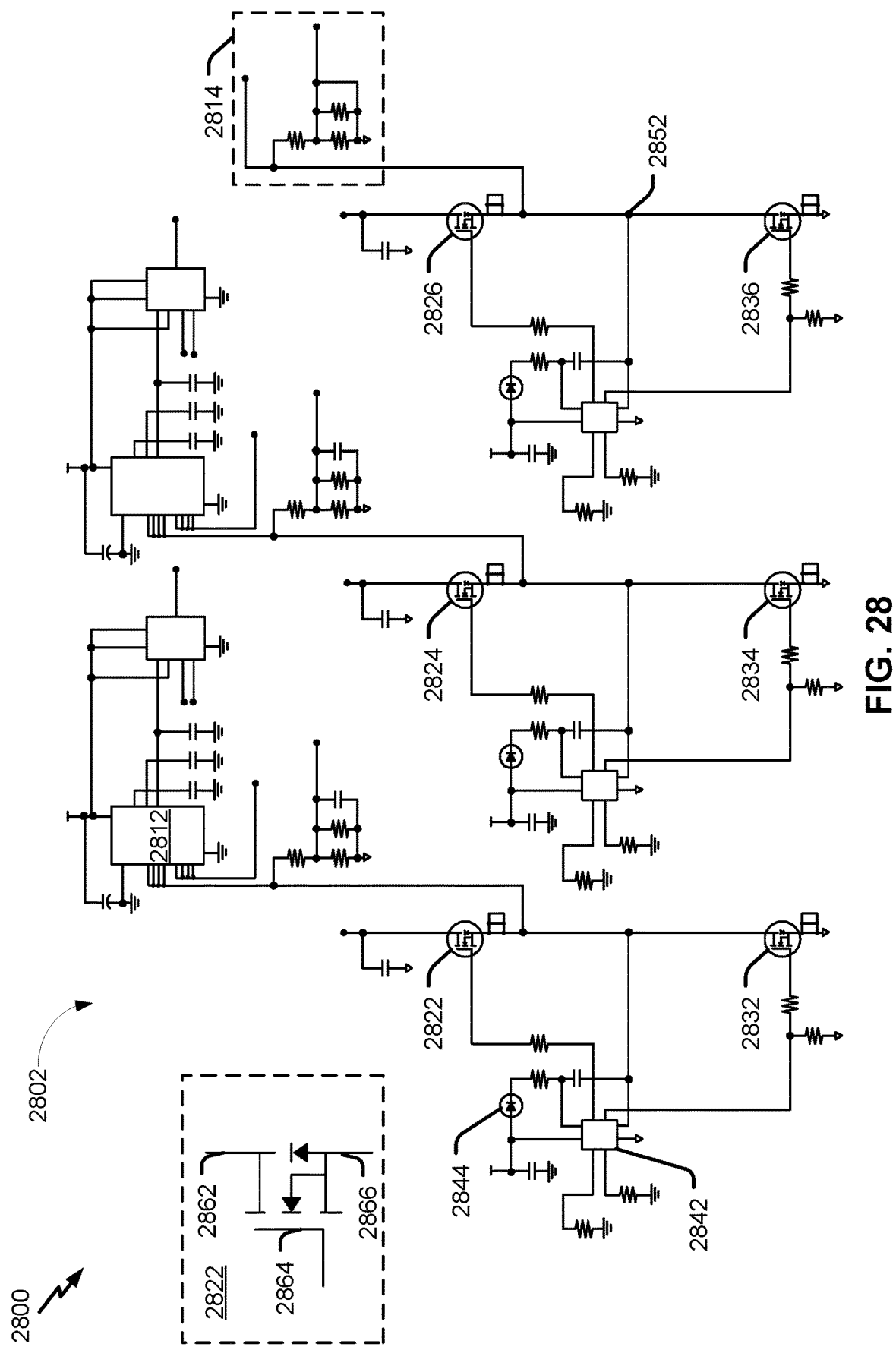
FIG. 28 is a circuit diagram that illustrates an example of a motor driver circuit.

FIG. 28 is a circuit diagram 2800 that illustrates an example of a motor driver circuit 2802. The motor driver circuit 2802 is coupled to a power supply and a motor, such as the power supply 252 and the motors 124 of FIGS. 1 and 2. The motor driver circuit 2802 illustrated in FIG. 28, corresponds to an inverter for a 3-phase motor, such as the inverter 112 of FIG. 1. In such implementations, the power supply 252 provides the motor driver circuit 2802 with DC power. The motor driver circuit 2802 converts the DC power into an AC signal and provide the AC signal to the motor, such as provides the AC power signal 380 to the motor 124 as described with reference to FIG. 3. In other implementations, the motors 124 may have more than three phases or less than three phases. For an inertial measurement unit 102 that includes the gimbal device 114 with multiple gimbals 122, the inverter 112 may have a motor driver circuit 2802 for each motor 124 that drives a corresponding gimbal 122.

The motor driver circuit 2802 includes six transistors 2822-2826, 2832-2836 arranged in three half bridges. In other implementations, the six transistors 2822-2826, 2832-2836 may be arranged in full bridges. The six transistors 2822-2826, 2832-2836 are configured to control power delivery to a particular motor 124. First, second, and third transistors 2822-2826 correspond to upper transistors, and fourth, fifth, and sixth transistors 2832-2836 correspond to lower transistors. The first and fourth transistors 2822, 2832 correspond to a first phase (first lane) of the motor. The second and fifth transistors 2824, 2834 correspond to a second phase (second lane) of the motor, and the third and sixth transistors 2826, 2836 correspond to a third phase (third lane) of the motor. In some implementations, the six transistors 2822-2826, 2832-2836 include or correspond to N-channel MOSFETs. The six transistors 2822-2826, 2832-2836 may include or corresponds the transistors 336 of FIG. 3.

In some implementations, the motor driver circuit 2802 includes one or more high bandwidth current sensors 2812 configured to determine a current of the motor driver circuit 2802. As illustrated in FIG. 28, the motor driver circuit 2802 includes two high bandwidth current sensors 2812. In other implementations, the motor driver circuit 2802 includes more than two high bandwidth current sensors 2812 or fewer than two high bandwidth current sensors 2812. In the particular example illustrated in FIG. 28, the high bandwidth current sensors 2812 include or correspond to Hall Effect current sensors. The high bandwidth current sensors 2812 are configured to perform continuous built in testing of current of the motor driver circuit 2802.

In some implementations, the motor driver circuit 2802 includes one or more voltage sensors 2814 configured to determine a voltage of the motor driver circuit 2802. As illustrated in FIG. 28, the motor driver circuit 2802 includes three voltage sensors 2814, each voltage sensor coupled to an output terminal (e.g., source) of the upper transistors 2822-2826. As illustrated in FIG. 28, the voltage sensors 2814 are configured to determine a voltage of an output of the upper transistors 2822-2826, which may correspond to a voltage provided to the motor. FIG. 28 also illustrates a schematic diagram of the first transistor 2822 of the upper transistors 2822-2826. The schematic diagram illustrates three terminals 2862-2866. The transistor 2822 includes a first terminal 2862 (e.g., a drain), a second terminal 2864 (e.g., a gate), and a third terminal 2866 (e.g., a source).

The motor driver circuit 2802 includes gate drivers 2842 to drive gates (the second terminals 2864) of the six transistors. The gate drivers 2842 are configured to generate and provide activation signals to the gates (the second terminals 2864) of the six transistors 2822-2826, 2832-2836. For example, the gate drivers 2842 generate high and low logical signals responsive to PWM pulse signals and provide the high and low logical signal to the gates (the second terminals 2864) of the six transistors 2822-2826, 2832-2836, which control the 3-phase power delivery to the motor.

The motor driver circuit 2802 may include a Bootstrap power supply circuitry 2844 for the upper transistors 2822-2826. For example, when the upper transistors 2822-2826 include N-channel MOSFETs, the Bootstrap power supply circuitry 2844 is used to drive the upper transistors 2822-2826.

The motor driver circuit 2802 is coupled to the motors 124 of FIG. 1 via outputs between the upper transistors 2822-2826 and the lower transistors 2832-2836, such as via output 2852. As illustrated in FIG. 28, the third terminals 2866 (e.g., the source) of the upper transistors 2822-2826 and the first terminals 2862 (e.g., the drain) of the lower transistors 2832-2836 are coupled to the motor.

In some implementations, the motor driver circuit 2802 is controlled by an FPGA and is time coordinated with resolver excitation. For example, the motor driver circuit 2802 is controlled by the PWM 242 of FIG. 2, as described with reference to FIGS. 32-35. Additionally or alternatively, the motor driver circuit 2802 is time coordinated with resolver sensing. Time coordination with resolver excitation and sensing reduces noise and errors in resolver outputs and increases precision of determination of a drive shaft of the motor. For example, time coordination reduces electromagnetic interference caused by motor drive switching.

Figure 29:
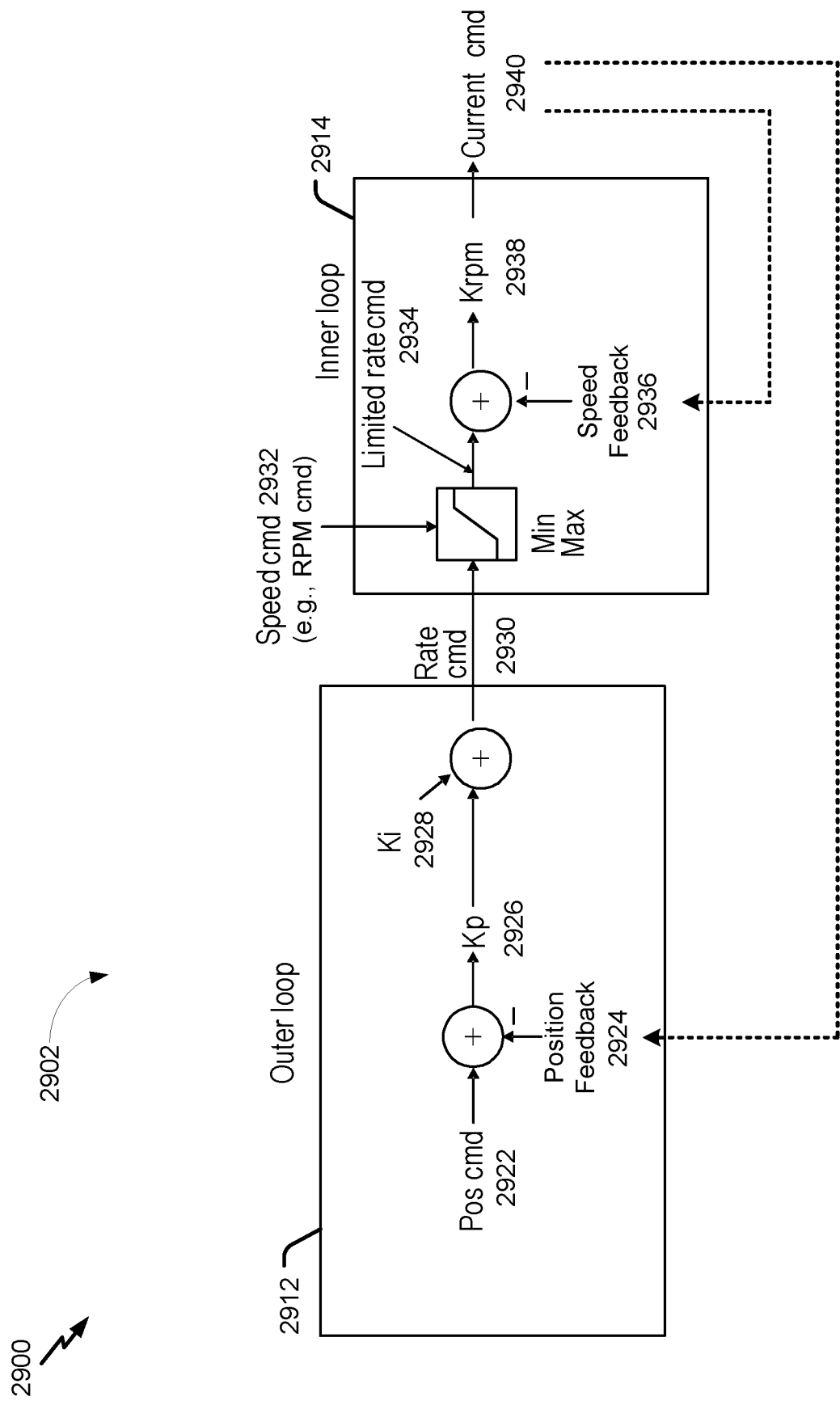
FIG. 29 is a diagram that illustrates an example of cascaded feedback logic for speed feedback and position feedback.

FIG. 29 is a diagram 2900 that illustrates an example of cascaded feedback logic 2902 for speed feedback and position feedback. The cascaded feedback logic 2902 includes an outer loop 2912 and an inner loop 2914. The outer and inner loops 2912, 2914 refer to feedback loops corresponding to position and speed feedback 2924, 2936 generated as a result of a current command 2940. The current command may include or corresponds to the current command 372 of FIG. 3.

The outer loop 2912 corresponds to a position feedback loop and is configured to generate a rate command 2930 based on a received position command 2922. The position command 2922 and the position feedback 2924 are used to generate an intermediary signal (e.g., an error signal). Control gain is applied to the intermediary signal to generate the rate command 2930. The rate command 2930 indicates a rate, such as a rate of change in position. The rate command 2930 (generated by the cascaded feedback logic 2902) may indicate a speed similar to a speed command 2932 (received from a flight computer), but the rate command 2930 may be in different units than the speed command 2932. For example, the rate command 2930 may be in radians per second and the speed command 2932 may be in RPM.

The inner loop 2914 is configured to limit the rate command 2930 based on the speed command 2932 (e.g., an RPM command) to generate a limited rate command 2934. The speed feedback 2936 (e.g., RPM feedback) is applied to the limited rate command 2934 and second control gain, such as an RPM gain 2938 (Krpm), is applied to generate the current command 2940. The inner loop 2914 outputs the current command 2940 and the current command 2940 is converted into a duty cycle value for the PWM 242, such as by the current tracker 330 of FIG. 3.

During operation, the outer loop 2912 receives the position command 2922 from the flight computer 254 of FIG. 2 and the position feedback 2924 from the resolver system 204. The outer loop 2912 generates an error signal based on subtracting the position feedback 2924 from the position command 2922. The control gain is applied to the error signal to generate the rate command 2930. For example, the error signal is multiplied by a proportional gain 2926 and the error signal (or an integral thereof) is multiplied by an integral gain 2928. The outer loop 2912 provides the rate command 2930 is to the inner loop 2914.

The inner loop 2914 rate limits the rate command 2930 based on the speed command 2932. For example, the rate command 2930 is decreased when the speed command 2932 indicates a lower RPM than the rate command 2930. To illustrate, when the RPM indicated by the speed command 2932 corresponds to a lesser (slower) change in position value than the change in position value of the rate command 2930, the inner loop 2914 decreases the change in position value of the rate command 2930 to the change in position value of the speed command 2932. The inner loop 2914 subtracts the speed feedback 2936, received from the resolver system 204 of FIG. 2, from the limited rate command 2934 to generate a second error signal. The current command 2940 is generated based on applying second control gain to the second error signal. For example, the second error signal is multiplied by the RPM gain 2938. The inner loop 2914 provides the current command 2940, indicative of torque of the motor 124 of FIG. 1, to the inverter 112 of FIG. 1, which controls operation of the motor 124 based on the current command 2940. The inner loop 2914 of the cascaded feedback logic 2902 can be difficult to implement, especially for low damped systems, such as the motors 124 used to position the gimbals 122 of FIG. 1.

Figure 30:
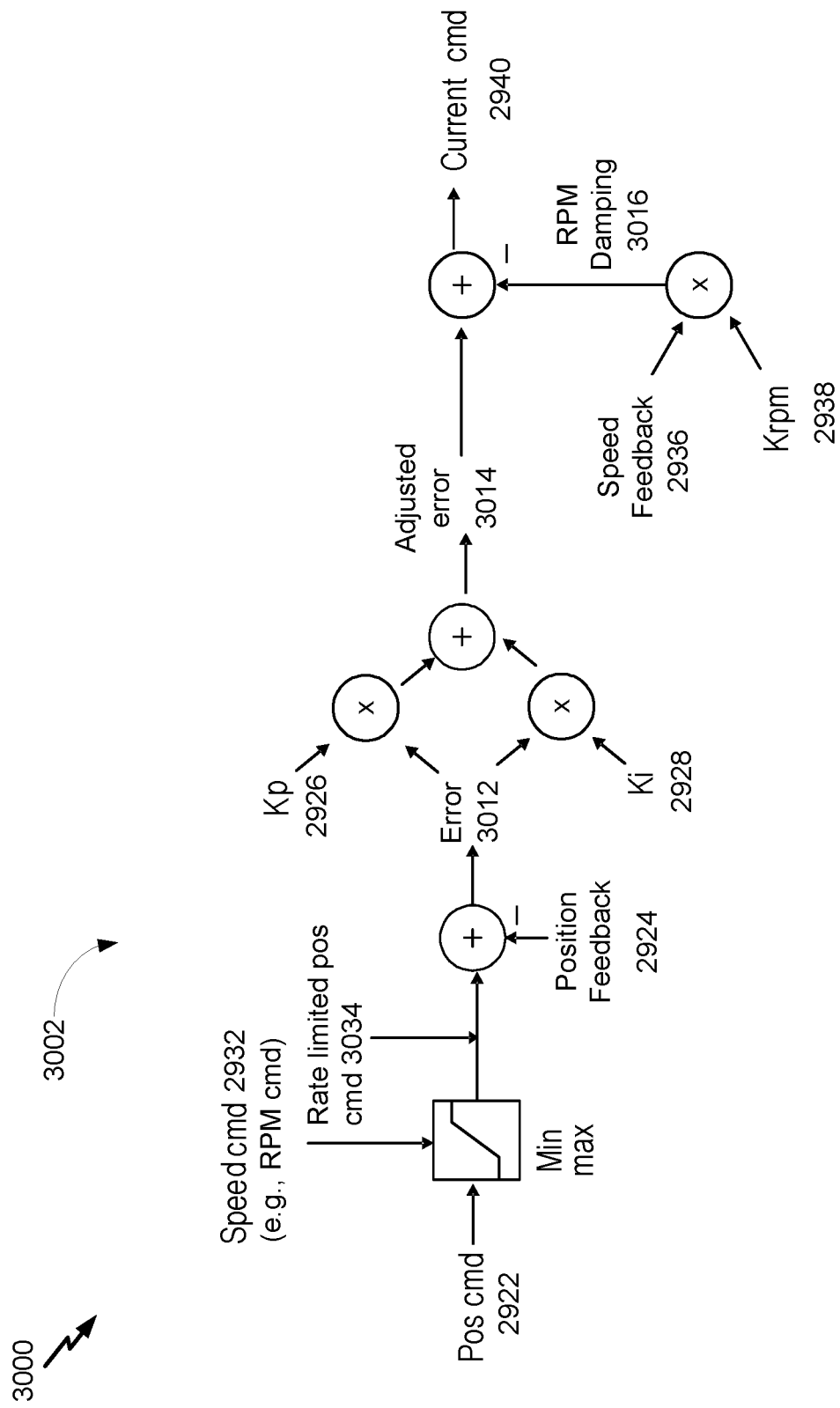
FIG. 30 is a logic diagram that illustrates an example of logic for combined speed and position feedback control.

FIG. 30 is a logic diagram 3000 that illustrates an example of logic 3002 for combined speed and position feedback control. As compared to the diagram 2900 of FIG. 29, the logic 3002 includes a single feedback loop for combined position and speed feedback. As opposed to the diagram 2900, the logic 3002 uses the speed feedback 2936 for damping, not as a separate feedback loop. Additionally, the logic 3002 generates a rate limited position command 3034 (e.g., a combined speed and position command) before applying feedback. The logic 3002 provides improved control and lower complexity for low damped motors, such as the motors 124 used to position the gimbals 122 of FIG. 1, as compared to the cascaded feedback logic 2902 of FIG. 29.

During operation, the logic 3002 receives the position command 2922 and the speed command 2932 from the flight computer 254 of FIG. 2. The logic 3002 rate limits the position command 2922 based on the speed command 2932 to generate the rate limited position command 3034. For example, a position value of the position command 2922 is decreased when the speed command 2932 (converted into a position value representing a maximum change in position relative to a previous position) indicates a lesser change in position relative to the previous position than a second change of position relative to the previous position indicated by the position value of the position command 2922.

The rate limited position command 3034 is generated before an error signal 3012 is generated (or control gain is applied). The logic 3002 generates the error signal 3012 by subtracting the position feedback 2924 from the rate limited position command 3034. For example, the position value of the rate limited position command 3034 is adjusted based on the position value of the position feedback 2924 to generate a position error.

The logic 3002 applies control gain to the error signal 3012. For example, the logic 3002 multiplies the error signal 3012 by the proportional gain 2926 and multiplies the error signal 3012 by the integral gain 2928. The logic 3002 generates an adjusted error signal 3014 based on a sum of the two products of the error signal 3012 and gains 2926, 2928. In a particular implementation, the first product corresponds to a derivative of the error signal 3012 multiplied by the proportional gain 2926.

Additionally, the logic 3002 may dampen the adjusted error signal 3014 based on the speed feedback 2936. The logic 3002 multiplies the speed feedback 2936 by the RPM gain 2938 (e.g., a damping factor) to generate an RPM damping value 3016. The logic 3002 subtracts the RPM damping value 3016 from the adjusted error signal 3014 to dampen the adjusted error signal 3014. For example, damping the adjusted error signal 3014 generates a damped error signal. The logic 3002 generates the current command 2940 based on the damped error signal. For example, the logic 3002 integrates the damped error signal to generate the current command 2940. As compared to the cascaded feedback logic 2902 of FIG. 29, the logic 3002 provides improved control and stability for low damped motors with lower complexity (e.g., without multiple or nested control loops).

Figure 31:
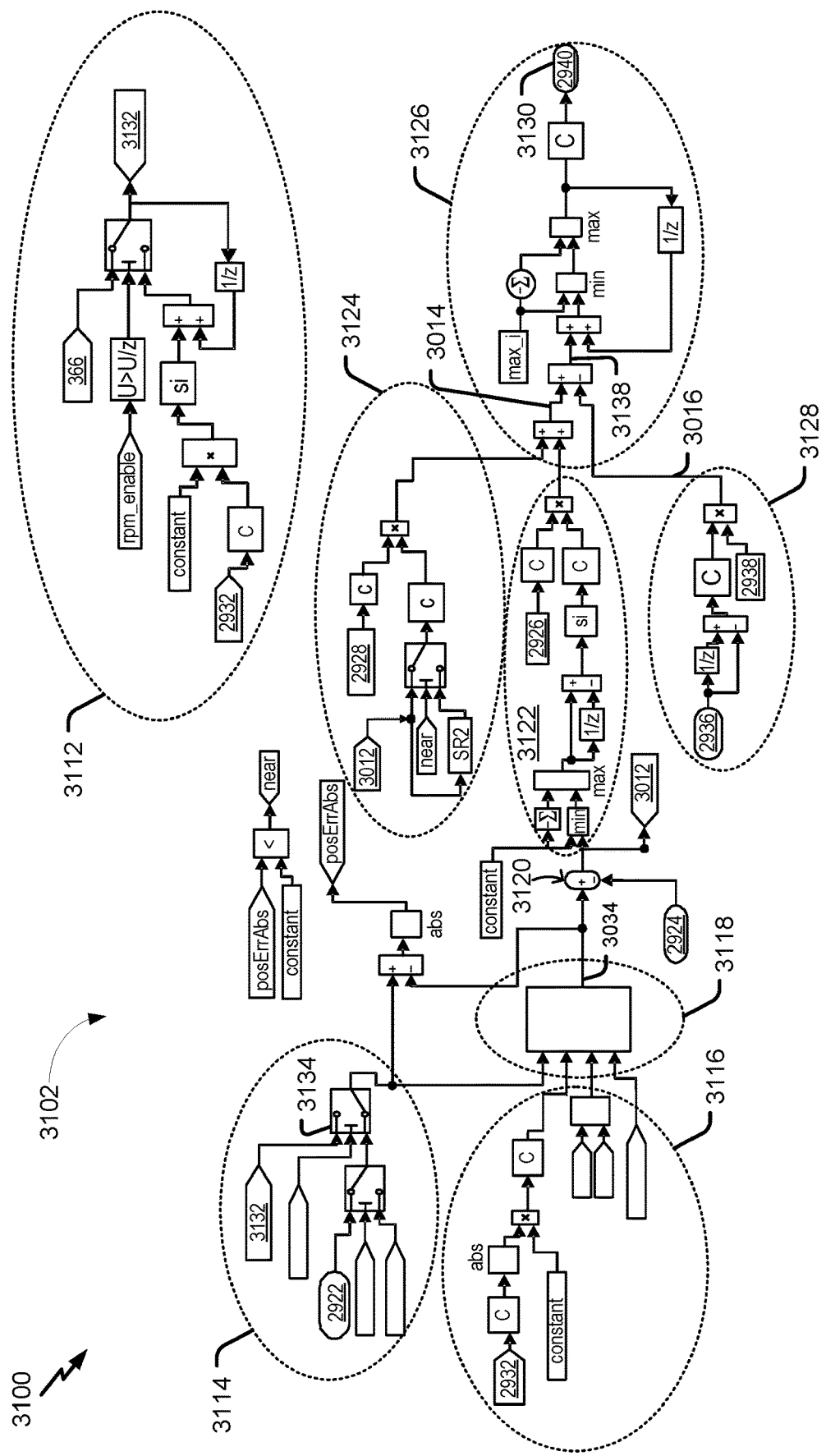
FIG. 31 is a logic diagram that illustrates an example of logic for combined speed and position feedback control including a direct speed command mode.
Figure 32:
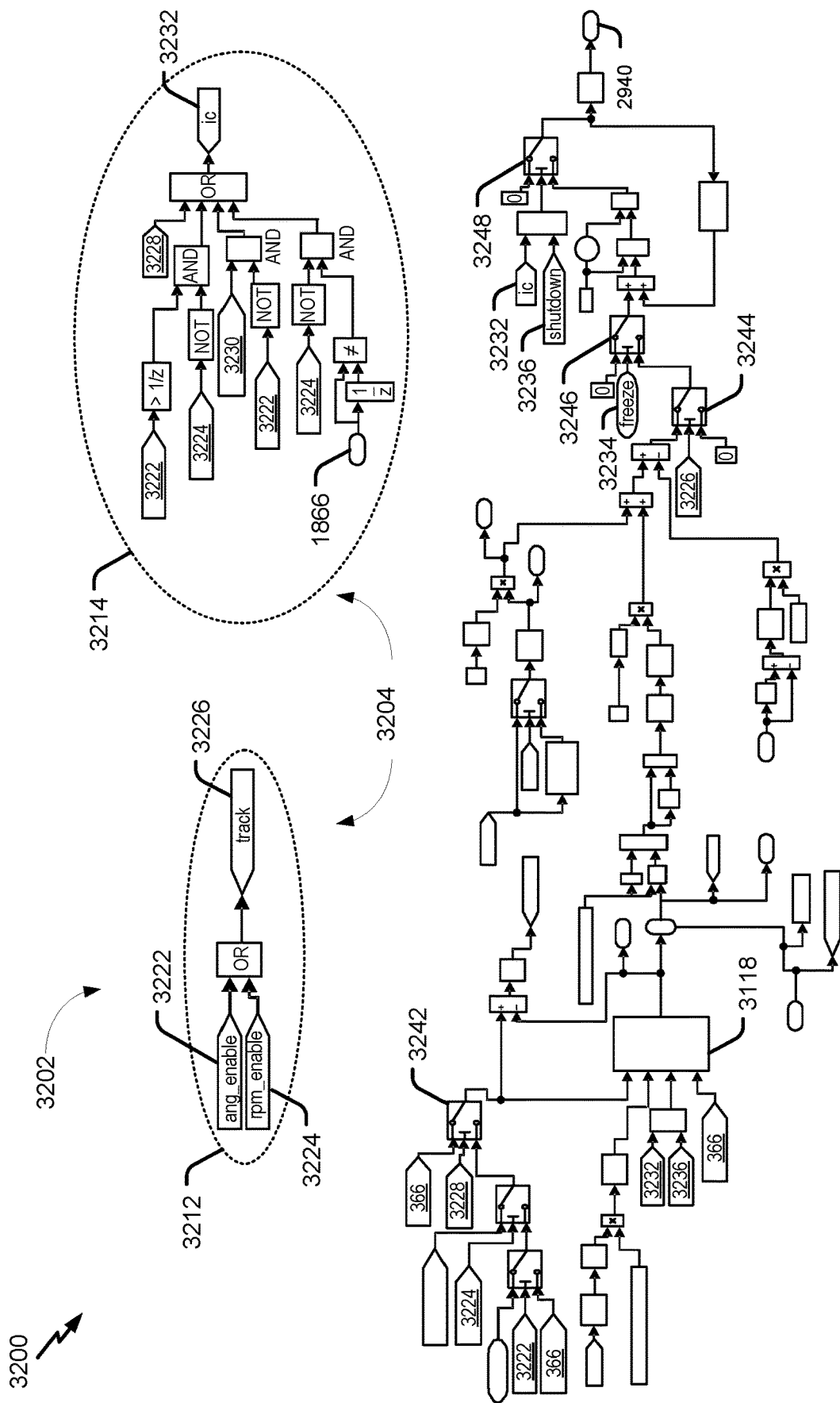
FIG. 32 is a logic diagram that illustrates an example of logic for combined speed and position feedback control including an initialization mode.

FIGS. 31 and 32 are logic diagrams that illustrate examples of logic for combined speed and position feedback including multiple operating modes. As illustrated in FIGS. 31 and 32, the diagrams have been simplified for clarity. For example, some logic boxes of the diagram of FIG. 31 are blank and are discussed with respect to FIG. 32 and vice versa. Additionally, some of the conversions, shifts, holds and constant values have been omitted from the description for clarity. In FIGS. 31 and 32, conversions logic boxes are represented by the letter "C" for bit conversions and "si" for signed/unsigned conversions, shift logic boxes are represented by a three character string including the letter "S", a direction (i.e., "L" or "R"), and a number of bits, absolute value logic boxes are represented by "abs", and holds or delay units are represented by "1/z".

Referring to FIG. 31, a logic diagram 3100 of an example of logic 3102 for combined speed and position feedback control including a direct speed command mode is illustrated. As compared to the logic 3002 of FIG. 30, the logic 3102 is configured to operate in a direct speed mode or in a position and speed mode. By utilizing both the direct speed mode and the position and speed mode, the logic 3102 can control the motor 124 by adjusting torque or speed of the motor 124. The logic 3102 includes direct speed command mode logic 3112, position command logic 3114, speed command logic 3116, rate limiter logic 3118, error generation logic 3120, combined proportional gain logic 3122, combined integral gain logic 3124, and output logic 3126.

The direct speed command mode logic 3112 is configured to generate a derived position command 3132 based on the speed command 2932. The derived position command 3132 indicates an incremental change in position from a previous position. The direct speed mode may include or correspond to a direct RPM command mode. The direct RPM command mode includes or corresponds to a mode where the flight computer 254 provides the speed command 2932 (RPM command) only in the commands 370 of FIG. 3. After switching from a first mode (a position and speed mode) to a second mode (a direct speed mode), the direct speed command mode logic 3112 is configured to output a position (e.g., the estimated position 366) of the motor determined by the resolver system 204 of FIG. 2 instead of the derived position command 3132. By outputting the estimated position 366 after switching modes, the direct speed command mode logic 3112 enables smooth operation of the motor (e.g., reduces or eliminates jerks from switching modes). Operations of the direct speed command mode logic 3112 may be performed by direct speed circuitry. As an example, the direct speed circuitry includes one more combiners, multipliers, delay elements, switches, etc., to perform the operations of the direct speed command mode logic 3112, as illustrated in FIG. 31.

The position command logic 3114 is configured to receive the position command 2922, such as from the flight computer 254 of FIG. 2, and to output the position command 2922 to the rate limiter logic 3118 when in the first mode. The position command logic 3114 is configured to output the derived position command 3132 when in the second mode. For example, the position command logic 3114 includes a switch 3134 configured to provide the derived position command 3132 to the rate limiter logic 3118 based on a Boolean input indicating that the logic 3102 is operating in the second mode. Accordingly, the output logic 3126 generates the current command 2940 based on the speed command 2932 and independent of a position command 2922 when operating in the second mode.

The speed command logic 3116 is configured to receive the speed command 2932 and to provide the speed command 2932 to the rate limiter logic 3118. In some implementations, the speed command logic 3116 is configured to convert the speed command 2932 into an unsigned integer and to convert a value of the speed command 2932 into an absolute value. Additionally or alternatively, the speed command 2932 may be adjusted for a resolver. For example, the speed command 2932 may be adjusted by multiplying the speed command 2932 by a constant value to account for a difference between the RPM of the motor and resolver speed.

The rate limiter logic 3118 is configured to generate the rate limited position command 3034 based on the position command 2922 and the speed command 2932 when in the first mode. The rate limiter logic 3118 is configured to generate the rate limited position command 3034 based on the speed command 2932 when in the second mode. In some implementations, the rate limiter logic 3118 is further configured to operate in an initialization mode, as described with reference to FIG. 32.

The error generation logic 3120 is configured to generate the error signal 3012 (indicative of a position error) based on the rate limited position command 3034 and the position feedback 2924 of the resolver system 204 of FIG. 2. For example, the error generation logic 3120 generates the error signal 3012 by subtracting the position feedback 2924 from the rate limited position command 3034. Operations of the error generation logic 3120 may be performed by error signal generation circuitry. As an example, the error signal generation circuitry includes a combiner, as illustrated in FIG. 31.

The combined proportional gain logic 3122 is configured to apply proportional gain 2926 to the error signal 3012. The combined proportional gain logic 3122 is configured to output a product of the error signal 3012 and the proportional gain 2926 to the output logic 3126. In a particular implementation, the proportional gain 2926 is multiplied by a derivative of the error signal 3012 to generate the product. The combined integral gain logic 3124 is configured to apply integral gain 2928 to the error signal 3012. The combined integral gain logic 3124 is configured to output a product of the error signal 3012 and the integral gain 2928 to the output logic 3126.

The output logic 3126 is configured to generate the current command 2940 based on the proportional gain 2926 and the integral gain 2928. For example, the output logic 3126 is configured to add the two products to generate the adjusted error signal 3014. The output logic 3126 is configured to generate the current command 2940 based on the adjusted error signal 3014. For example, the output logic 3126 is configured to integrate the adjusted error signal 3014 to generate the current command 2940. In a particular implementation, the integrated adjusted error signal 3014 may be limited based on a maximum current value and a minimum current value to generate the current command 2940. The output logic 3126 outputs the current command 2940 via an output terminal 3130.

In some implementations, the logic 3102 further includes damping logic 3128. The damping logic 3128 generates the damping value 3016 which is applied to the adjusted error signal 3014 to generate a damped error signal 3138. In such implementations, the damped error signal 3138 is integrated to generate the current command 2940. In addition, the logic 3102 may include a switch (not shown) to control a damping mode, i.e., when damping is applied or not. Operations of the damping logic 312 may be performed by damping circuitry. As an example, the damping circuitry includes one more combiners, multipliers, delay elements, switches, etc., to perform the operations of the damping logic 3128, as illustrated in FIG. 31.

Referring to FIG. 32, a logic diagram 3200 of an example of logic 3202 for combined speed and position feedback control including an initialization mode is illustrated. The logic 3202 includes similar logic to the logic 3102 of FIG. 31 and additionally includes initialization logic 3204. The initialization logic 3204 includes tracking logic 3212 and initial condition (ic) logic 3214.

The initialization logic 3204 is configured to receive and generate initialization inputs. For example, the tracking logic 3212 is configured to receive a position tracking enable input 3222 and an RPM tracking enable input 3224. The tracking logic 3212 generates a tracking input 3226 as an output based on either the position tracking enable input 3222 or the RPM tracking enable input 3224 indicating true (or tracking enabled).

The ic logic 3214 is configured to generate an ic input 3232 as an output based on the position tracking enable input 3222, the RPM tracking enable input 3224, an initialization filter input 3228, the servo offset output 1866, and an RPM pulse tracking enable input 3230.

The logic 3202, as compared to the logic 3102, includes additional switches 3242-3248. The switches 3422-3428 are configured to input initialization values (e.g., 0 or null values) responsive to one or more of the initialization inputs 3222-3232. For example, a first switch 3242 receives the initialization filter input 3228 and outputs a position of the motor determined by the resolver or outputs the position command 2922 based on the initialization filter input 3228. To illustrate, when in initialization mode, the estimated position 366 of the motor is provided to the rate limiter logic 3118, and after initialization mode, the position command 2922 is provided to the rate limiter logic 3118.

Additionally, the rate limiter logic 3118 is further configured to receive a present or current position (e.g., the estimated position 366 of FIG. 3) of the motor determined by the resolver system 204 of FIG. 2 and an ic enable input. The rate limiter logic 3118 is configured to output the present position of the motor as the rate limited position command 3034 responsive to the ic enable input indicating true. In a particular implementation, the ic enable input is generated based on the ic input 3232 and a shutdown input 3236. For example, an OR logic gate generates the ic enable input based on the ic input 3232 and the shutdown input 3236. To illustrate, when either of the ic input 3232 or the shutdown input 3236 indicates true, the ic enable input indicates true and the rate limiter logic 3118 outputs the present position (e.g., the estimated position 366) of the motor determined by the resolver as the rate limited position command 3034.

A second switch 3244 receives the tracking input 3226 and outputs a zero value or the adjusted error signal 3014 (or the damped error signal 3138) based on the tracking input 3226. A third switch 3246 receives a freeze input 3234 and outputs a zero value or the adjusted error signal 3014 (or the damped error signal 3138) based on the freeze input 3234. Thus, if either the tracking input 3226 or the freeze input 3234 are true, the third switch 3246 outputs a zero instead of the adjusted error signal 3014 (or the damped error signal 3138).

A fourth switch 3248 receives a Boolean output generated based on the ic input 3232 and the shutdown input 3236. Based the Boolean output, the fourth switch 3248 outputs a zero value or the current command. In the example illustrated in FIG. 32, the Boolean output is output by an OR logic gate, thus if either the ic input 3232 or the shutdown input 3236 are true, the switch 3248 outputs a zero. To illustrate, the logic 3202 outputs the current command 2940 indicating zero current during initialization and shutdown modes.

In other implementations, equivalent logic may be used. For example, the second and third switches 3244 and 3246 may be replaced by a single switch and a logic gate, similar to the fourth switch 3248 and corresponding OR logic gate.

Figure 33:
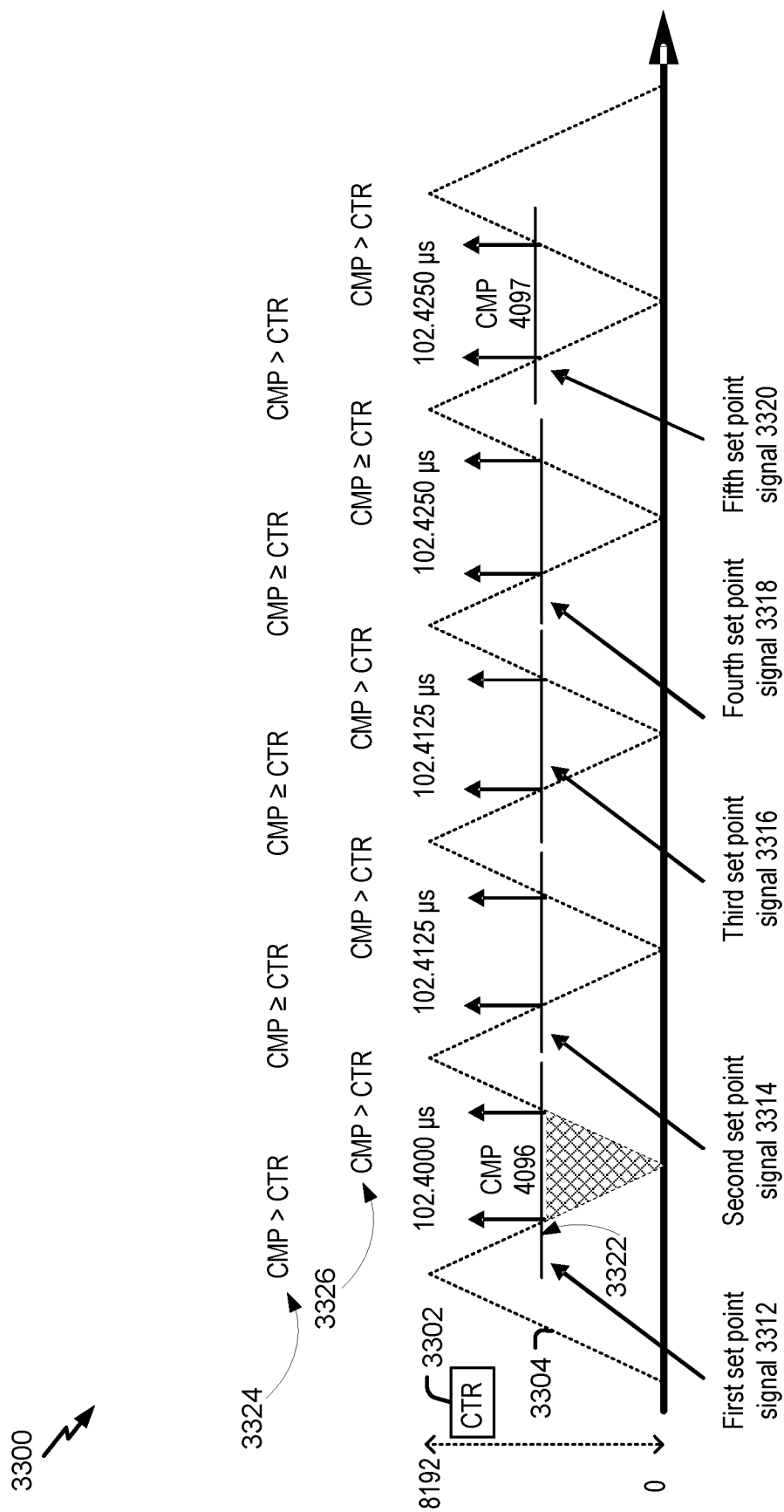
FIG. 33 is a diagram that illustrates an example of pulse-width modulation (PWM) operation with an adjustable comparison criterion.

FIG. 33 is a diagram 3300 that illustrates an example of PWM operation with an adjustable comparison criterion. A PWM, such as the PWM 242 of FIG. 2, receives a set point signal that includes a comparison value and at least one comparison criterion. The at least one comparison criterion includes a Boolean condition. For example, the Boolean condition includes or corresponds to a greater than condition, a less than condition, a greater than or equal to condition or a less than or equal to condition. In other implementations, the comparison value and the at least one comparison criterion are received in separate signals. The PWM 242 is configured to control power delivery to a controlled component. The controlled component may include a light emitting diode, a duty cycle controller, a clock signal generator, a buck converter, a servo, a stepper motor, a single phase motor, or a multi-phase motor.

In FIG. 33, a counter 3302, such as an up-down counter, is configured to count up from zero to a particular number and then back down from the particular number to zero. As illustrated in FIG. 33 the counter 3302 counts up to 8192 and a counter signal 3304 generated by the counter 3302 is depicted by the dashed line. The PWM 242 includes a comparator to compare a counter value of the counter signal 3304 to a comparison value 3322 (CMP) indicated by a set point signal. In some implementations, the counter 3302 is synchronized with the counter 842 of FIG. 8. Synchronization of the counters 842 and 3302 enables current drive switching of the motor to be synchronized with (e.g., offset from) excitation signals of the resolver system 204 of FIG. 2 and enables masking data affected by current drive switching.

FIG. 33 depicts operation of the PWM 242 for five different set point signals 3312-3320. A first set point signal 3312 includes a comparison value 3322 and two comparison criteria 3324, 3326. The PWM 242 determines the comparison value 3322 and the two comparison criteria 3324, 3326 by processing the set point signals 3312-3320. For example, the PWM 242 right shifts the first set point signal 3312 to get the comparison value 3322. The PWM 242 uses the two least significant bits (LSBs) of the first set point signal 3312 to determine the two comparison criteria 3324, 3326. As illustrated in FIG. 1, the first set point signal 3312 has a value of 16384. Right shifting the value 16384 of the first set point signal 3314 generates a value of 4096 for the comparison value 3322. In binary, the two LSBs of 16384 are "00." The PWM 242 determines that a two bit value of "00" corresponds to a first comparison criterion 3324 of greater than and a second comparison criterion 3326 of greater than. The PWM 242 may determine that the two bit value corresponds to or indicates the two comparison criteria 3324, 3326 by processing the two bit value with logic or by performing a table lookup.

The PWM 242 provides a high signal (or causes a high signal to be provided) to a gate of a transistor responsive to the comparison value 3322 satisfying the comparison criteria 3324, 3326 with respect to a value of the counter 3302. Providing the high signal to the transistor activates the transistor. As illustrated in FIG. 33, the PWM 242 activates the transistor when the comparison value 3322 of 4096 is greater than value of the counter 3302 (e.g., when the counter value decreases below the comparison value 3322 of 4096). In FIG. 33, the transistor is activated at a counter value of 4095 for the first set point signal 3312. Activating the transistor generates a pulse edge of a pulse of a PWM signal based on the first set point signal 3312.

The PWM 242 provides a low signal (or causes a low signal to be provided) to the gate of the transistor responsive to the comparison value 3322 not satisfying the comparison criteria 3324, 3326 with respect to a value of the counter 3302. Providing the low signal to the transistor deactivates the transistor. The PWM 242 deactivates the transistor when comparison value 3322 of 4096 is less than value of the counter 3302 (e.g., when the counter value increases above the comparison value 3322 of 4096). In FIG. 33, the transistor is deactivated at a counter value of 4096 for the first set point signal 3312, which means the transistor is on when the counter value is 4095. The on time of the transistor (and the pulse-width of the pulse of the PWM signal) is shown by the area of the triangle formed in FIG. 33 with cross hatching and corresponds to a period of time when the comparison value 3322 is greater than a value of the counter 3302 for the first set point signal 3312. The transistor on time of the first set point signal 3312 is 8190 counts, i.e., counts corresponding to counter values of 4095 to 0 and back from 0 to 4095.

The PWM 242 receives a second set point signal 3314. The second set point signal 3314 has a value of 16385. Right shifting the value 16385 of the second set point signal 3314 generates a value of 4096 for the comparison value 3322. In binary, the two LSBs of 16385 are "01." The PWM 242 determines that a two bit value of "01" corresponds to a first comparison criterion 3324 of greater than or equal to and a second comparison criterion 3326 of greater than. As illustrated in FIG. 33, the PWM 242 activates the transistor when the comparison value 3322 of 4096 is equal to the value of the counter 3302, i.e., at a counter value of 4096. Activating the transistor generates a pulse edge of a second pulse of the PWM signal based on the second set point signal 3314. The PWM 242 deactivates the transistor when the comparison value 3322 of 4096 is equal to (no longer greater than) the value of the counter 3302. In FIG. 33, the PWM 242 deactivates the transistor at a counter value of 4096. Deactivating the transistor generates a second pulse edge of the second pulse of the PWM signal based on the second set point signal 3314. The on time of the transistor (and the pulse-width of the pulse of the PWM signal) is shown by the area of the triangle formed in FIG. 33 with cross hatching.

As compared to the on time of the first set point signal 3312, the on time of the second set point signal 3314 is a single count (i.e., 1 of 8192) higher. To illustrate, the second set point signal 3314 indicates a transistor on time of 8191 counts i.e., counts corresponding to counter values of 4096 to 0 and 0 to 4095.

In conventional PWMs, the comparison criterion is constant (e.g., only greater than or only greater than or equal to). Thus, to increase the pulse-width of a pulse the comparison value is changed (similar to the comparison value changing from 4096 to 4097 between the first and fifth set point signals 3312, 3320). Changing the comparison value 3322 increases the on time or pulse-width by two counts. For example, increasing the comparison value 3322 from 4096 to 4097 (with a constant comparison criterion of greater than) increases the on time count by two from 8190 counts for 4096 to 8192 counts for 4097. To illustrate, for the comparison value 3322 of 4097 the transistor on time is on from 4097 to 0 and back from 0 to 4097. Accordingly, the PWM 242 has reduced granularity and finer precision and control of the motor 124.

The PWM 242 receives a third set point signal 3316. The third set point signal 3316 has a value of 16386. Right shifting the value 16385 of the second set point signal 3314 generates a value of 4096 for the comparison value 3322. In binary, the two LSBs of 16386 are "10." The PWM 242 determines that a two bit value of "10" corresponds to a first comparison criterion 3324 of greater than or equal to and a second comparison criterion 3326 of greater than. The third set point signal 3316 operates the same as the second set point signal 3314 to generate a third pulse of the PWM signal based on the third set point signal 3316. In multi lane implementations, such as described with reference to FIG. 34, the third set point signal 3316 may increase power delivery to a controlled component in combination with adjustable comparison criterion of a second lane by 1 count.

The PWM 242 receives a fourth set point signal 3318. The fourth set point signal 3318 has a value of 16387. In binary, the two LSBs of 16387 are "11." The PWM 242 determines that a two bit value of "11" corresponds to a first comparison criterion of 3324 greater than or equal to and a second comparison criterion 3326 of greater than or equal to. As illustrated in FIG. 33, the PWM 242 activates the transistor when the comparison value 3322 of 4096 is equal to the value of the counter 3302, i.e., at a counter value of 4096. Activating the transistor generates a pulse edge of a fourth pulse of the PWM signal based on the fourth set point signal 3318. The PWM 242 deactivates the transistor when the comparison value 3322 of 4096 is less than (no longer equal to or greater than) the value of the counter 3302, i.e., at a counter value of 4097, which means the transistor is on when the counter value is 4096. Deactivating the transistor generates a second pulse edge of the fourth pulse of the PWM signal based on the fourth set point signal 3318. As compared to the on time of the second set point signal 3314, the on time of the fourth set point signal 3318 is a single count (i.e., 1 of 8192) higher. To illustrate, the second set point signal 3314 indicates a transistor on time of 8191 counts and the fourth set point signal 3318 indicates a transistor on time of 8192 counts i.e., counts corresponding to counter values of 4096 to 0 and 0 to 4096.

The PWM 242 receives a fifth set point signal 3320. The fifth set point signal 3320 has a value of 16388. In binary, right shifting 16388 by 2 gives the comparison value 3322 a value of 4097. The two LSBs of 16388 are "00." The PWM 242 determines that a two bit value of "00" corresponds to a first comparison criterion 3324 of greater than and a second comparison criterion 3326 of greater than. The fifth set point signal 3320 operates with a different comparison value 3322 and different comparison criteria 3324, 3326 as compared to the fourth set point signal 3318 but produces the same number of counts of on time as the fourth set point signal 3318. In other implementations, each bit of the two LSBs may corresponds to the particular comparison rule or condition. For example, a bit having a value of 0 may indicate a greater than condition and a bit having a value of 1 may indicate greater than or equal to condition.

As illustrated in FIG. 33, the on time increases by 0.01250 microseconds for adjusting a comparison criterion, as opposed to 0.0250 microseconds for adjusting a comparison value. Accordingly, the PWM 242 has reduced granularity and increased precision and control by adjusting the comparison criteria 3324, 3326. In the example illustrated in FIG. 33, the PWM 242 has a frequency of 40 Megahertz. A frequency of the resolver system 204 (2441.2 Hertz) is equal to the frequency of the PWM 242 divided by double a period (8192) of the PWM 242.

In other implementations, a single adjustable comparison criterion may be used and may be indicated by 1 LSB of a set point signal. In such implementations, the PWM 242 still has a granularity of 1 counter value or 0.01250 microseconds per each 1 value adjustment of the set point signal. As an example illustration, in response to an increase in a value of the first set point signal 3312 by one, the PWM 242 would operate similar to the second set point signal 3314. In response to an increase in a value of the first set point signal 3312 by two, the PWM 242 would operate similar to the fifth set point signal 3320 (as opposed to the third set point signal 3316). Accordingly, as compared to right shifting the set point signal by two for two adjustable comparison criteria, the set point signal with a single adjustable comparison criterion is right shifted by one. Additionally, the set point signal with one adjustable comparison criterion would have a range of values from 0 to 16384, as opposed to a range of values from 0 to 32768 for a set point signal with two adjustable comparison criteria. Such implementations may be implemented where multilane control is not used, such as LEDs, one phase motors, etc.

As illustrated in FIG. 33, the set point signals 3312-3320 indicate a change each cycle to illustrated operation of the PWM 242. During operation of a controlled component, the PWM 242 may receive a set point signal each cycle, and the set point signal may or may not indicate a change in duty cycle of the controlled component from a previous set point signal for a previous cycle. Alternatively, the PWM 242 may receive a set point signal indicating a different duty cycle in response to changes in a duty value and may maintain a current set point signal (i.e., the comparison value 3322 and comparison criteria thereof 3324, 3326) until a new set point signal is received.

Figure 34:
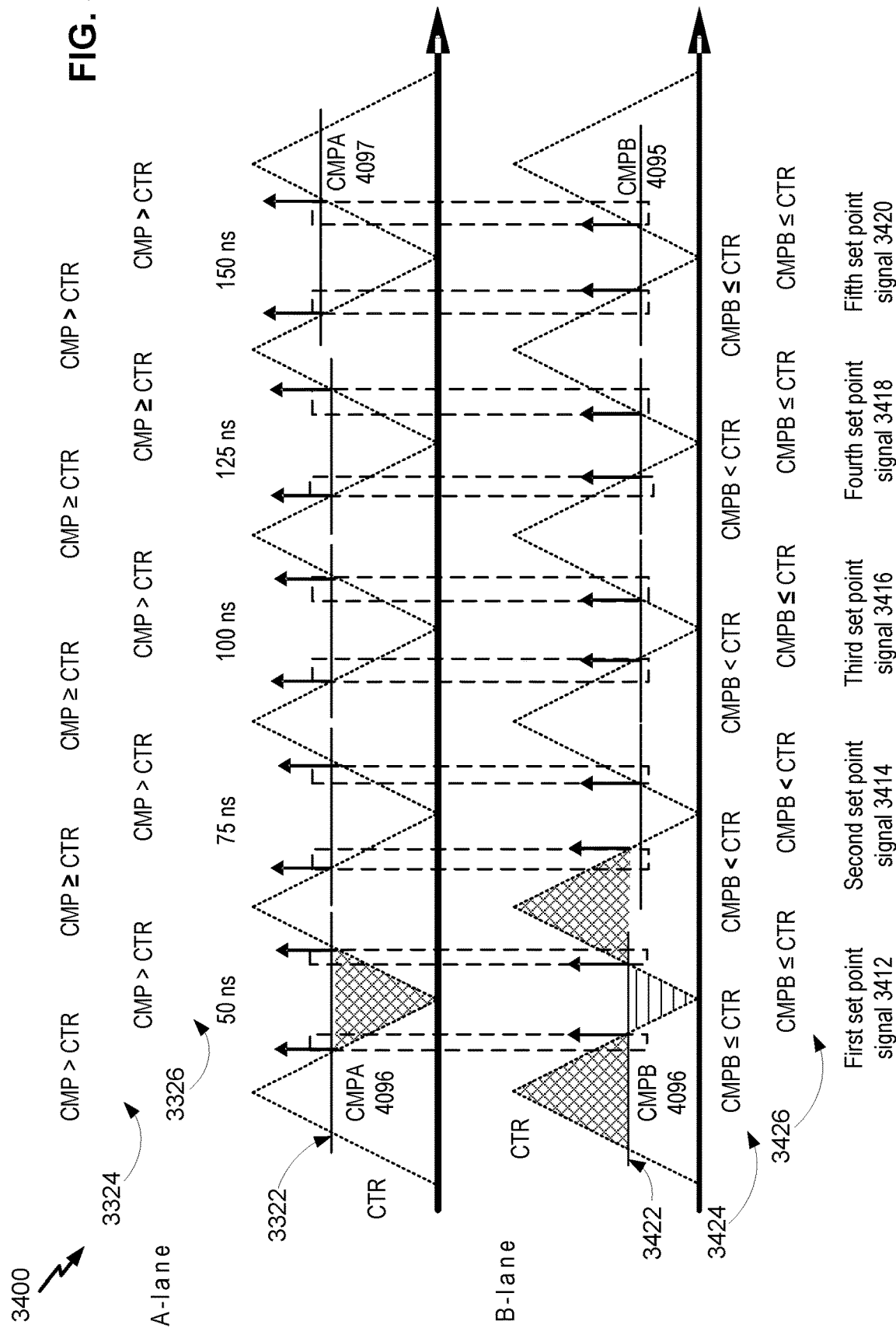
FIG. 34 is a diagram that illustrates an example of two lane PWM operation with an adjustable comparison criterion.

FIG. 34 is a diagram 3400 that illustrates an example of two lane PWM operation with an adjustable comparison criterion. Diagram 3400 illustrates operation of an A-lane and a B-lane. In a particular implementation, the A-lane corresponds to an upper transistor of a first phase and the B-lane corresponds to a lower transistor of a second phase. For example, the upper transistor corresponds to the 2822 of FIG. 28 and the lower transistor corresponds to the 2834 of FIG. 28.

The A-lane operates similar to the PWM operation described with respect to FIG. 33. The B-lane operates similarly to the A-lane, but in reverse. The B-lane is low (e.g., connected to ground) when a particular comparison value 3422 (CMPB) satisfies the comparison criteria 3424, 3426 for the B-lane (e.g., is less than or less than or equal to) with respect to a value of the counter 3302 of FIG. 33.

When the A-lane is high and the B-lane is low, a voltage difference is created across a controlled component, such as a motor, and current is provided to the controlled component. The A-lane being high and the B-lane being low can be achieved by closing or activating the upper transistor 2822 and the lower transistor 2834. Activating the transistors 2822 and 2834 allows current to flow from the battery (or other power source), through the upper transistor 2822 to the motor 124, across the motor 124 to the lower transistor 2834, and through the lower transistor 2834 to ground. As compared to the pulses of the PWM 242 described with respect to FIG. 33, pulses of the PWM 24 for the A and B lanes are generated by a combination of a set point signal of each lane. Said another way, each set point signal of a particular lane generates a pulse edge of two different pulses (rather than two pulse edges of a single pulse as in FIG. 33). In FIG. 33, pulses provided to a controlled component (e.g., a motor) corresponded to cross hatched triangles. In FIG. 34, pulses provided to a controlled component (e.g., a motor) correspond to dashed rectangles. In the implementation illustrated in FIG. 34, each set point signal of the set point signals 3312-3320 generates a first pulse edge of a first pulse and a second pulse edge of a second pulse and a corresponding set point signal of the set point signals 3412-3420 generates a second pulse edge of the first pulse and a first pulse edge of the second pulse.

The B-lane receives a first set point signal 3412. The first set point signal 3412 has a value of 16384. Right shifting the first set point signal 3412 value of 16384 by two (i.e., dividing by 4) indicates the comparison value 3422 (CMPB) of 4096 for the B-lane. The two LSB's of 16384 are "00," and for the B-lane the two LSB's indicate a first comparison criterion 3424 of less than or equal to and a second comparison criterion 3426 of less than or equal to. The B-lane is low while the comparison value 3422 is less than or equal to a value of the counter 3302, as illustrated in FIG. 34 by horizontal hatching.

The PWM 242 provides a low signal (or causes a low signal to be provided) to the gate of the lower transistor 2834 responsive to the comparison value 3422 not satisfying the comparison criteria 3424, 3426 with respect to a value of the counter 3302. Providing the low signal to the lower transistor 2834 deactivates the lower transistor 2834. The PWM 242 deactivates the lower transistor 2834 when comparison value 3422 of 4096 is less than or equal to the value of the counter 3302 (e.g., when the counter value decreases below the comparison value 3322 of 4096). In FIG. 34, the lower transistor 2834 is deactivated at a counter value of 4095 for the first set point signal 3412, which means the lower transistor 2834 is on when the counter value is 4096. Activating the upper transistor 2822 generates a first pulse edge of a first pulse of the PWM signal based on the first set point signals 3312, 3412, and deactivating the lower transistor 2834 generates a second pulse edge of the first pulse of the PWM signal based on the first set point signals 3312, 3412.

The on time of the lower transistor 2834 is shown by the area of the triangle formed in FIG. 34 with cross hatching and corresponds to a period of time when the comparison value 3422 is less than or equal to the value of the counter 3302 for the first set point signal 3412. The on time of the lower transistor 2834 is indicated by the first set point signal 3412 and a previous set point signal (not shown). The set point signals 3412-3420 correspond to an off time of the lower transistor 2834, and the set point signals 3312-3320 correspond to an on time of the upper transistor 2822.

The PWM 242 provides a high signal (or causes a high signal to be provided) to a gate of the lower transistor 2834 responsive to the comparison value 3422 satisfying the comparison criteria 3424, 3426 with respect to a value of the counter 3302. Providing the high signal to the lower transistor 2834 activates the lower transistor 2834. As illustrated in FIG. 34, the PWM 242 activates the lower transistor 2834 when the comparison value 3422 of 4096 is less than or equal to the value of the counter 3302 (e.g., when the counter value reaches the comparison value 3422 of 4096). In FIG. 34, the lower transistor 2834 is activated at a counter value of 4096 for the first set point signal 3412. Activating the lower transistor 2834 generates a first pulse edge of a second pulse of the PWM signal based on the first set point signals 3312, 3412, and deactivating the upper transistor 2822 generates a second pulse edge of the second pulse of the PWM signal based on the first set point signals 3312, 3412.

The first and second pulses of the PWM signal indicate a motor on time and correspond to overlapping of the on time of the A and B lanes (cross hatched triangles). The first and second pulses are indicated by rectangles in dashed lines in FIG. 34. As shown in FIG. 34, a first motor on time associated with the first pulse of the first set point signals 3312, 3412 is 25 ns and a second motor on time associated with the second pulse of the first set point signals 3312, 3412 is 25 ns. Thus, a total motor on time associated with the first set point signals 3312, 3412 of the A and B lanes is 50 nanoseconds.

The B-lane receives the second set point signal 3414 having a value of 16383. Right shifting the second set point signal 3414 value of 16383 by two (i.e., dividing by 4) indicates the comparison value 3422 of 4095. The two LSB's of 16383 are "11," and for the B-lane the two LSB's indicate a first comparison criterion 3424 of less than and a second comparison criterion 3426 of less than. Because the comparison criteria 3424, 3426 changed and the comparison value 3422 changed, the time the B-lane was off did not change. However, because one comparison criterion (i.e., the first comparison criterion 3324) of the A-lane changed in the corresponding second set point signal 3414, the total motor on time (duty cycle) increased by 25 ns for the second set point signals 3314, 3414 with respect to the previous total motor on time of 50 ns for the first set point signals 3312, 3412. As shown in FIG. 34, a first motor on time associated with the first pulse of the second set point signals 3314, 3414 is 50 ns and a second motor on time associated with the second pulse of the first set point signals 3314, 3414 is 25 ns, for a total motor on time of 75 ns.

The B-lane receives the third set point signal 3416 having a value of 16382. Right shifting the third set point signal 3416 value of 16382 by two (i.e., dividing by 4) indicates the comparison value 3322 of 4095. The two LSB's of 16382 are "10," and for the B-lane the two LSB's indicate a first comparison criterion 3424 of less than and a second comparison criterion 3426 of less than or equal to. The A-lane did not change comparison criteria 3324, 3326 or comparison value 3322 from the second set point signal 3312, as explained with reference to FIG. 33. Because the second comparison criterion 3426 of the second set point signal 3416 changed on the B-lane, the time the B-lane was off increased and the motor 124 on time (duty cycle) increased by 25 ns with respect to the previous total motor on time of 75 ns for the second set point signals 3314, 3414. As shown in FIG. 34, first and second motor on times of the third set point signals 3316, 3416 are 50 ns, for a total motor on time of 100 ns.

The B-lane receives the fourth set point signal 3418 having a value of 16381. Right shifting the fourth set point signal 3418 value of 16381 by two (i.e., dividing by 4) indicates a comparison value of 4095. The two LSB's of 16381 are "01," and for the B-lane the two LSB's indicate a first comparison criterion 3424 of less than and a second comparison criterion 3426 of less than or equal to. Because the comparison criteria 3424, 3426 changed and the comparison value 3422 changed, the time the B-lane was low did not change. However, because one comparison criterion (i.e., the second comparison criterion 3326) of the A-lane changed in the corresponding fourth set point signal 3318, the motor 124 on time (duty cycle) increased by 25 ns with respect to the previous total motor on time of 100 ns for the third set point signals 3316, 3416. As shown in FIG. 34, a first motor on time associated with the first pulse of the fourth set point signals 3318, 3418 is 75 ns and a second motor on time associated with the second pulse of the fourth set point signals 3318, 3418 is 50 ns, for a total motor on time of 125 ns.

The B-lane receives the fifth set point signal 3420 having a value of 16381. Right shifting the fifth set point signal 3420 value of 16380 by two (i.e., dividing by 4) indicates a comparison value 3422 of 4095. The two LSB's of 16380 are "00," and for the B-lane the two LSB's indicate a first comparison criterion 3424 of less than or equal to and a second comparison criterion 3426 of less than or equal to. Because the first comparison criterion 3424 changed on the B-lane, the time the B-lane was low increased and the motor 124 on time (duty cycle) increased by 25 ns with respect to the previous total motor on time of 125 ns for the fourth set point signals 3318, 3418. As shown in FIG. 34, a first motor on time associated with the first pulse of the fifth set point signals 3320, 3420 is 75 ns and a second motor on time associated with the second pulse of the fifth set point signals 3320, 3420 is 75 ns, for a total motor on time of 150 ns.

As illustrated in FIG. 34, the PWM 242 receives multiple set point signals, one for each lane. For example, the A-lane receives the second set point signal 3314 indicating a value 16385 and the B-lane receives the second set point signal 3414 indicating a value of 16383. In other implementations, the PWM 242 receives a single set point signal indicating a duty cycle value 374 and at least one comparison criterion. The PWM 242 calculates the comparison values 3322, 3422 for each lane based on the duty cycle value 374. For example, the PWM 242 calculates the comparison values 3322, 3422 for each lane using the equations CMPA=DutyCycle*CTRPRD*4 and CMPB=(1−DutyCycle)*CTRPRD*4, where CTRPRD is the maximum counter value (8192).

In some implementations, the PWM 242 is configured to control two transistors of each lane. In a particular implementation, the PWM 242 is configured to provide dead band control, i.e., the PWM 242 delays activation of a particular transistor of a lane to prevent both transistors of the lane from being active at the same time. For example, the PWM 242 delays activation of an upper transistor of a particular lane to allow a lower transistor of the particular lane to deactivate. This delay is referred to as dead time or dead ticks. The PWM 242 is configured to activate the transistors further based on a dead ticks setting or a determined number of dead ticks, as described with reference to FIG. 35.

Figure 35:
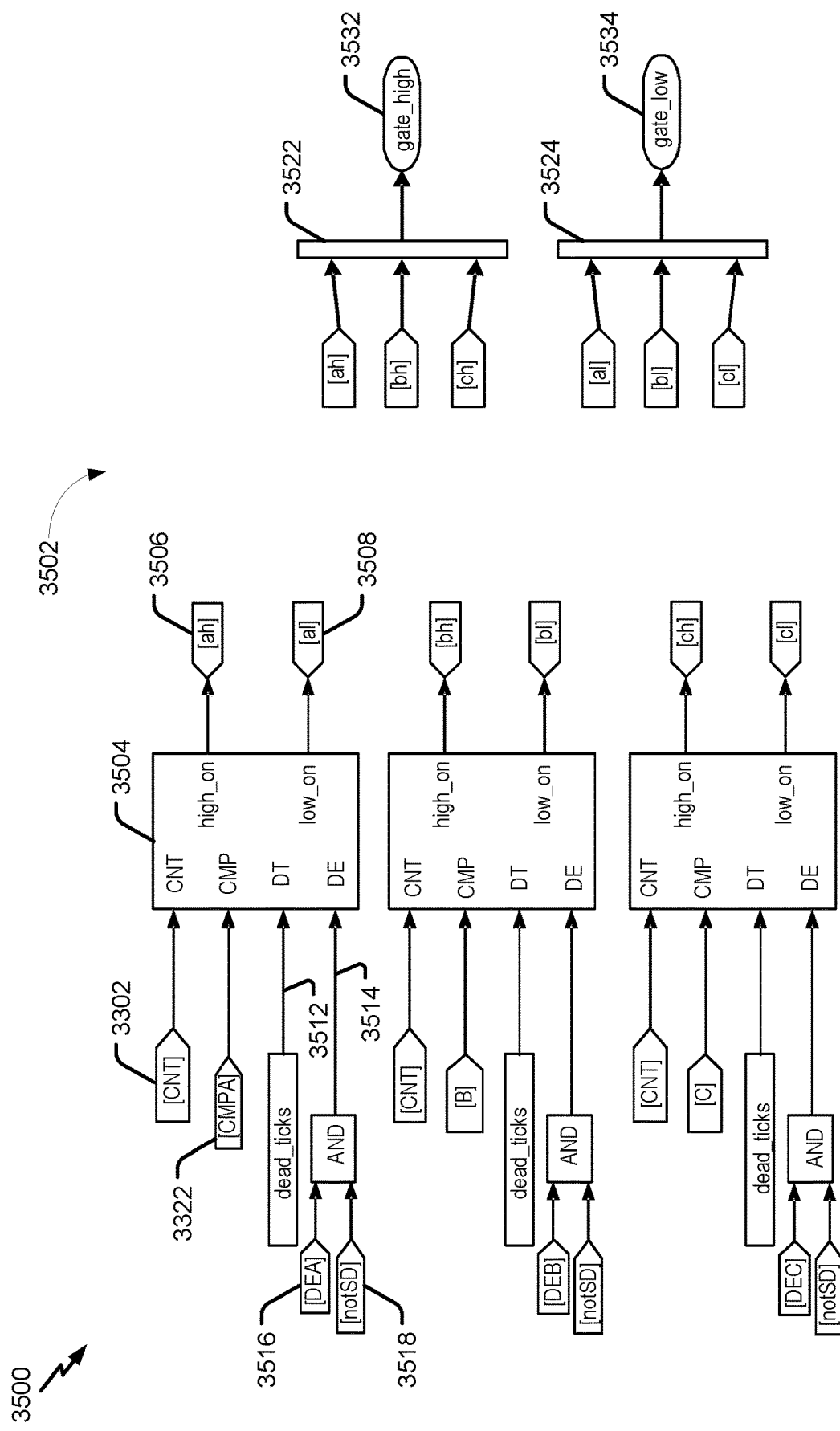
FIG. 35 is a logic diagram that illustrates an example of logic for a PWM with an adjustable comparison criterion and dead band control.

FIG. 35 is a logic diagram 3500 that illustrates an example of logic 3502 for a PWM with an adjustable comparison criterion and dead band control. The PWM logic 3502 is configured to control the transistors 336 of FIG. 3 (e.g., transistors 2822-2826 and 2832-2836) and provide power to the motor 124 of FIG. 1. In FIG. 35, the PWM logic 3502 controls a 3-phase motor, with phases or lanes A, B, and C. The PWM logic 3502 is configured to determine when to activate the transistors 336 based on a comparison value and at least one comparison criterion, as described with reference to FIGS. 33 and 34. In FIG. 35, the PWM logic 3502 is configured to determine when to activate the transistors 336 further based on a dead time input 3512 and a drive enable input 3514. For example, the PWM logic 3502 may adjust the on timings of the lanes to provide a dead band such that both the upper and lower transistors of a particular lane are not on at the same time.

The PWM logic 3502 includes a comparison logic block 3504 for each lane. Each of the comparison logic blocks 3504 is configured to generate two outputs: a high activation output 3506 and a low activation output 3508, based further on the dead time input 3512 and the drive enable input 3514. The high and low activation outputs 3506, 3508 include Boolean outputs, such as true or false indicated by a logical 0 or 1. The high and low activation outputs 3506, 3508 may include or correspond to dead band activation outputs or adjusted activation outputs as compared to the on time determined in FIGS. 33 and 34. Providing dead band control may reduce a total on time indicated by a particular set point signal, but dead band control does not increase or reduce the granularity of the on time control or a precision of a set point signal indicating an adjustable comparison criterion.

The dead time input 3512 (DT) is configured to adjust the on timings of the transistors 336. The dead time input 3512 value is based on a number of dead ticks determined based on the current command, a user setting, or both. For example, the user may input a constant value for the number of dead ticks. As another example, the number of dead ticks may be determined based on the current command 2940, a voltage of power source, or both. Additionally, the dead ticks may be positive or negative and may be in terms of either transistor, i.e., turn on the upper or lower transistors earlier or later.

The drive enable input 3514 (DE) is configured to enable a particular lane or phase for operation or control by the PWM 242. The drive enable input 3514 is a Boolean input or value. As illustrated in FIG. 35, the drive enable input 3514 is determined based on a lane drive enable input 3516 (e.g., [DEA]) and a shut down input 3518 ([notSD]). Each of these inputs 3516, 3518 may include a Boolean value. The lane drive enable input 3516 is configured to control enabling a particular lane or phase of the motor to be active or controlled. The shut down input 3518 is configured to open all of the transistors 336 to deactivate the motor 124. As illustrated in FIG. 35, the drive enable input 3514 is generated as an output of an AND logic gate that receives the lane drive enable input 3516 and the shut down input 3518. To illustrate, when the lane drive enable input 3516 and the shut down input 3518 indicate true or logical high, the drive enable input 3514 indicates true or high and the particular lane is enabled for control by the PWM logic 3502.

The PWM logic 3502 includes gate drivers 3522, 3524 configured to generate gate high and low outputs 3532, 3534 based on the high and low activation outputs 3506, 3508 from each lane. The gate drivers 3522, 3524 may include or correspond to the gate drivers 334 of FIG. 3. The gate high and low outputs 3532, 3534 include Boolean outputs, such as true or false indicated by a logical 0 or a 1.

During operation, each comparison logic block 3504 generates an on time for a corresponding lane based on the counter 3302, the comparison value 3322, one or more comparison criteria (e.g., the comparison criteria 3324, 3326) as described with reference to FIGS. 33 and 34. The comparison logic block 3504 adjusts the on time for the particular lane based on the dead time input 3512. For example, the comparison logic block 3504 reduces the on time for the A-lane to be high (e.g., AH) by 2 ticks or counts for each dead tick of the dead time input 3512 value. To illustrate, the upper transistor 2822 of the A-lane is turned on one counter later (one dead tick) and is turned off one count (one dead tick) earlier than determined in FIGS. 33 and 34 so that the upper transistor is not on at the same time as the lower transistors 2832 of the A-lane. Alternatively, the comparison logic block 3504 reduces the on time for the A-lane to be low (e.g., AL) by 2 dead ticks or counts.

The gate drivers 3522, 3524 generate the gate high output 3532 and the gate low output 3534 based on the high and low activation outputs 3506, 3508 for each lane. The gate high output 3532 and the gate low output 3534 indicate which upper and lower transistor are on or active. As illustrated in FIG. 35, the gate drivers 3522, 3524 activate one upper transistor (high transistor) and one lower transistor at a time. As an illustrative example, the gate drivers 3522, 3524 provide the gate high output 3532 and the gate low output 3534 to circuitry that generates logical high and low signals (e.g., high and low voltages) used to activate and deactivate the transistors 336.

Figure 36:
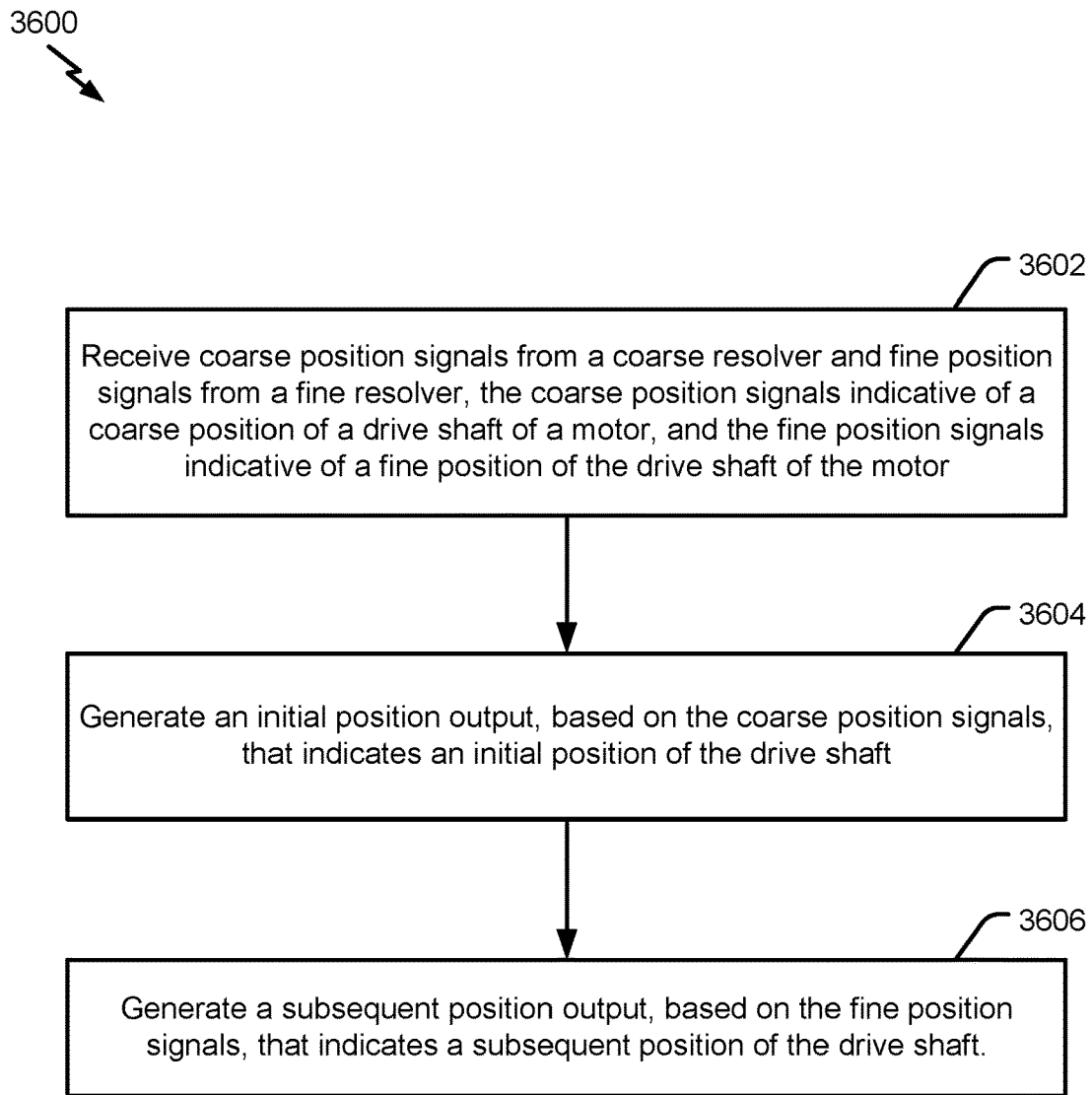
FIG. 36 is a flow chart of an example of a method of determining rotational position using a dual speed resolver.

FIG. 36 illustrates a method 3600 of determining rotational position using a dual resolver. The method 3600 may be performed by the resolver 126 of FIG. 1, the resolver system 204, the demodulation system 222, the dual resolver combination system 224 of FIG. 2, the dual speed resolver 312, the coarse resolver 342, the fine resolver 344 of FIG. 3, the output circuitry 532, the angle combination circuitry 542, the drift correction circuitry 544 of FIG. 5, or a combination thereof.

The method 3600 includes, at 3602, receiving coarse position signals from a coarse resolver and fine position signals from a fine resolver. The coarse position signals indicative of a coarse position of a drive shaft of a motor, and the fine position signals indicative of a fine position of the drive shaft of the motor. The coarse resolver may include or correspond to 342 of FIG. 3. The coarse position signals may include or correspond to the differential voltage outputs 354, the differential voltage signals 356, the ADC outputs 358 of FIG. 3, the sine and cosine values 1312, 1314 of FIG. 13, or a combination thereof, and the fine position signals may include or correspond to the differential voltage outputs 354, the differential voltage signals 356, the ADC outputs 358 of FIG. 3, the ADC output signal 1212 of FIG. 12, or a combination thereof.

The method 3600 of FIG. 36 also includes, at 3604, generating an initial position output, based on the coarse position signals, that indicates an initial position of the drive shaft. The initial position output may include or correspond to the initial position output 2012 of FIG. 20 and the initial position of the drive shaft may include or correspond the actual angle 2004 of FIG. 20. In some implementations, the initial position output corresponds to an output of an initialization mode of the dual speed resolver 312.

The method 3600 of FIG. 36 further includes, at 3606, generating a subsequent position output, based on the fine position signals, that indicates a subsequent position of the drive shaft. The subsequent position output may include or correspond to the subsequent position output 2014 of FIG.

20 of FIG. 20 and the subsequent position of the drive shaft may include or correspond the actual angle 2004 of FIG. 20. In some implementations, the subsequent position output corresponds to an output of a regular operation mode (i.e., a non-initialization mode) of the dual speed resolver 312.

In some implementations, the coarse position signals and the fine position signals are generated based on an excitation signal received by the resolvers. In a particular implementation, the excitation signal includes or corresponds to a dithered excitation signal, such as the dithered excitation signal 352 of FIGS. 3 and 23. Additionally or alternatively, the excitation signal (or the dithered excitation signal 352) is time coordinated with current direct switching of the motor. For example, the excitation signal is offset from current drive switching of the motor 124, as described with reference to FIGS. 2 and 3. To illustrate, the excitation signals 452 are synchronized with current drive switching signals associated with the motor 124 such that peak amplitudes of the excitation signals 452 are offset from current drive switching signals.

In some implementations, the subsequent position output is generated based on the initial position output and the fine position signals, wherein the subsequent position output is generated independent of subsequent coarse position signals, as described with reference to FIGS. 18 and 19.

In some implementations, generating the initial position output includes determining a starting position of the drive shaft based on the coarse position signals and providing the starting position as the initial position output based on an initialization mode input, as described with reference to FIGS. 18 and 19. For example, the logic 1802 generates the combined estimated position 1832 based on the estimated initial position 1822 (indicating the starting position determined based on resolver outputs 354 of the coarse resolver 342) provided from the switch 1826 responsive to the Boolean input 1824 (init_rslv) indicating true.

In some implementations, generating the subsequent position output includes differentiating the fine position signals and converting the differentiated fine position signals to a first domain associated with the coarse position signals. Generating the subsequent position output further includes generating an estimated subsequent position based on the initial position output, the differentiated fine position signals, and a drift correction value and includes outputting the subsequent position based on the estimated subsequent position, as described with reference to FIG. 18. For example, the logic 1802 differentiates the second domain angle estimates 1812 (the angle estimates 364 in a second domain based on fine position signals from the fine resolver 344) by subtracting the previous position value 1814 from the current position value 1816 of the second domain angle estimates 1812 to generate the change in position value 1818. The logic 1802 converts the change in position value 1818 to the converted change in position value 1820 and provides the converted change in position value 1820 to the combiner 1830. The combiner 1830 generates a subsequent combined estimated position 1832 based on the converted change in position value 1820, the delayed combined estimated position 1844 (e.g., the initial position output or initial combined estimated position 1832), and the drift correction value 1828.

In some implementations, generating the drift correction value includes converting the initial position output to a second domain associated with the fine position signals and generating an error value based on the converted initial position output, the fine position signals, and a 180 degree bias offset value. Generating the drift correction value further includes determining the drift correction value based on the error value, a proportional gain, and an integral gain, as described with reference to FIG. 19. For example, the logic 1902 converts the delayed combined estimated position 1844 from the 1 speed domain into the 16 speed and subtracts the converted estimate angle 1914 and the 180 degree bias offset 1918 from the second domain angle estimates 1812 to generate the error value 1920. The logic 1902 generates the drift correction value 1828 based on the error value 1920, the proportional gain 1922, and the integral gain 1924. In a particular implementation, the error value 1920 is right shifted to apply the proportional gain 1922 and the integral gain 1924 corresponds to 1 or −1 based on the error value 1920.

In some implementations, the initial position output and a plurality of subsequent position outputs, including the subsequent position output, are generated based on contiguous math. For example, the resolver system 204 generates position outputs based on contiguous functions where input parameters change one at a time.

In some implementations, a plurality of subsequent position outputs, including the subsequent position output, are generated independent of mode switching or counter jumps. For example, the resolver system 204 generates a plurality of subsequent position outputs corresponding to outputs for a full rotation of the motor (0 to 360 degrees) without switching modes or resetting a counter. The resolver system 204 does not need to have a separate mode for each half or quadrant of the motor and switch between the modes as the motor rotates from 0 to 360 degrees.

In some implementations, the method 3600 further includes transforming the fine position signals from the fine resolver from a second domain into a first domain associated with the coarse resolver and generating the subsequent position outputs based further on the transformed fine position signals. For example, the second domain angle estimate 1812 is differentiated to produce the change in position value 1818; the change in position value 1818 is transformed from the second domain to the first domain by right shifting the change in position value 1818 by four to generate the converted change in position value 1820 (transformed fine position signals), as described with reference to FIG. 18.

In some implementations, the method 3600 further includes transforming the initial position output into a second domain associated with the fine resolver and generating the subsequent position output based further on the transformed initial position output. For example, the delayed combined estimated position 1844 is transformed from the first domain to the second domain by left shifting the delayed combined estimated position 1844 by four to generate the converted estimate angle 1914 (transformed initial position output), as described with reference to FIG. 19.

Figure 37:
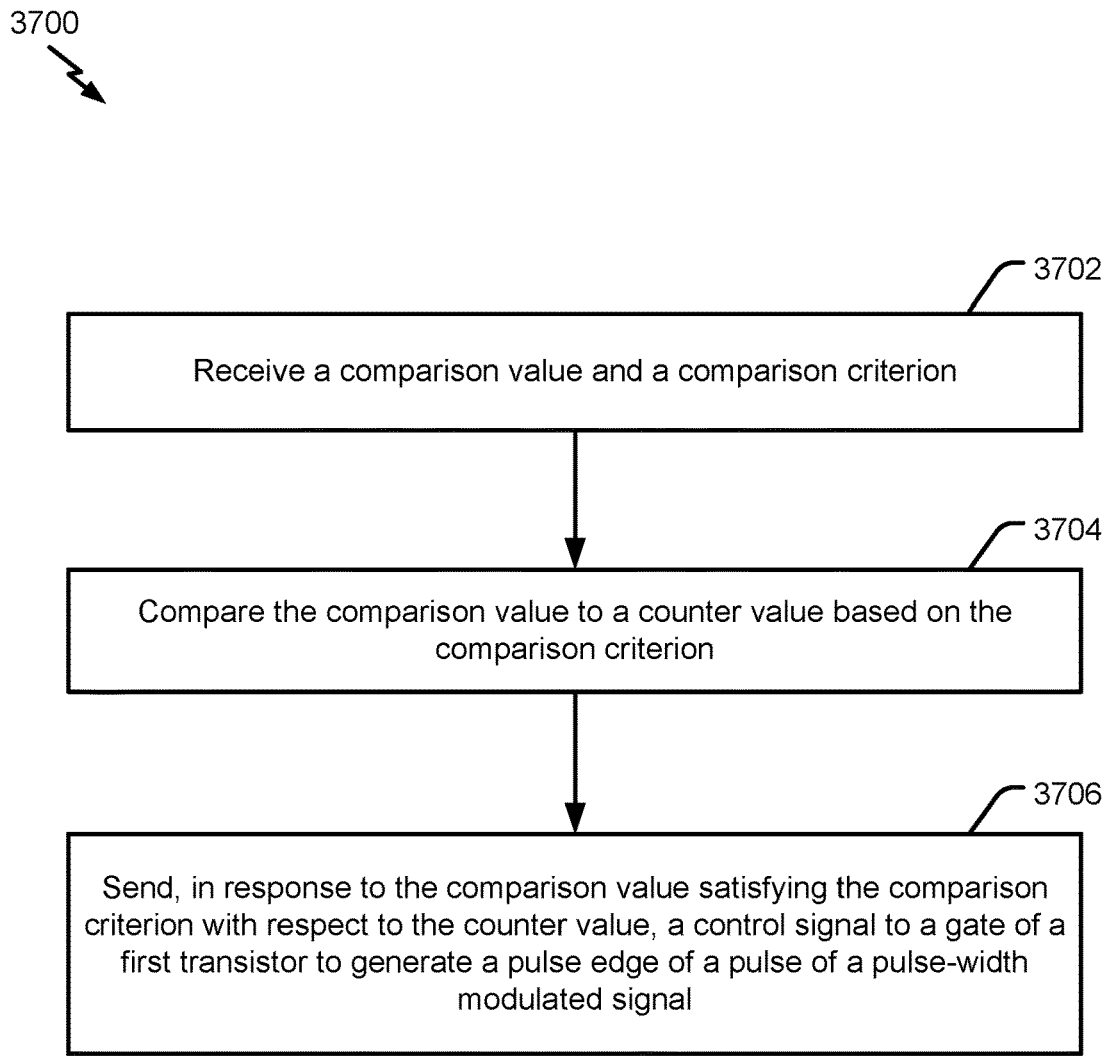
FIG. 37 is a flow chart of an example of a method of pulse-width modulation.

FIG. 37 illustrates a method 3700 of pulse-width modulation. The method 3700 may be performed by the inverter 112 of FIG. 1, the PWM 242 of FIG. 2, the PWM logic 3502 of FIG. 35, or a combination thereof. The method 3700 includes, at 3702, receiving a comparison value and a comparison criterion. The comparison value may include or correspond to comparison value 3322 of FIG. 33 or the comparison value 3422 of FIG. 34, and the comparison criterion may include or correspond to a comparison criterion of the comparison criteria 3324, 3326, 3424, or 3426 of FIGS. 33 and 34. In some implementations, the comparison value and the comparison criterion are included in a set point signal, such as the set point signals 3312-3320 and 3412-3420 of FIGS. 33 and 34.

The method 3700 of FIG. 37 also includes, at 3704, comparing the comparison value to a counter value based on the comparison criterion. The counter value may include or correspond to a counter value or of the counter signal of FIG. 33. The counter value may be received from a counter, such as the counter 3302 of FIG. 33.

The method 3700 of FIG. 37 further includes, at 3706, in response to the comparison value satisfying the comparison criterion with respect to the counter value, sending a control signal to a gate of a first transistor to generate a pulse edge of a pulse of a pulse-width modulated signal. The control signal may include or correspond to the one of the high and low activation outputs 3506, 3508 or the gate high and low outputs 3532, 3534 of FIG. 35. The gate of the first transistor may include or corresponds to a gate of any of the transistors 336 of FIG. 3 or the transistors 2822-2826 or 2832-2836 of FIG. 28. The pulse edge of the pulse-width modulated signal 378 may include or correspond to a first edge or a second edge of the pulse-width modulated signal 378 of FIG. 3.

In some implementations, the method 3700 of FIG. 37 includes receiving a set point signal indicating the comparison value, the comparison criterion, and a second comparison criterion and comparing the comparison value to a second counter value based on the second comparison criterion. The method 3700 further includes, in response to the comparison value satisfying the second comparison criterion with respect to the second counter value, sending a second control signal to the gate of the first transistor to generate a second pulse edge of the pulse of the pulse-width modulated signal, as described with reference to FIGS. 33 and 34. For example, the PWM 242 receives the first set point signal 3312 and generates the second pulse edge of the first pulse based on comparing the comparison value 3322 to a value of the counter 3302 based on the second comparison criterion 3326.

In some implementations, the method 3700 of FIG. 37 includes determining the comparison value based on one or more first bits of the set point signal and determining the comparison criterion and the second comparison criterion based on one or more second bits of the set point signal, as described with reference to FIGS. 33 and 34. For example, the PWM 242 receives the first set point signal 3312 and generates the comparison value 3322 by right shifting a value of the first set point signal 3312 indicated by the first set point signal 3312 (e.g., indicated by all of the bits of the first set point signal) and generates the comparison values by determining a value of LSBs of the first set point signal 3312 and retrieving the comparison criteria 3324, 3326 based on the value of the LSBs.

In some implementations, determining the comparison value includes right shifting the set point signal by one or more bits, as described with reference to FIGS. 33 and 34. In some implementations, the one or more second bits of the set point signal correspond to one or more least significant bits of the set point signal, as described with reference to FIGS. 33 and 34. In some implementations, the method 3700 of FIG. 37 includes selecting the comparison criterion from a table based on the one or more least significant bits of the set point signal, as described with reference to FIGS. 33 and 34.

In some implementations, the method 3700 of FIG. 37 includes receiving a second set point signal indicating a second comparison value and a second comparison criterion and comparing a second comparison value to the second counter value based on the second comparison criterion. The method 3700 further includes, in response to the second comparison value satisfying the second comparison criterion with respect to the second counter value, sending a second control signal to a gate of a second transistor to generate a pulse edge of a second pulse of the pulse-width modulated signal, as described with reference to FIGS. 33 and 34. For example, the PWM 242 receives the second set point signal 3314 and generates the first pulse edge of the second pulse based on comparing the comparison value 3322 to a value of the counter 3302 based on the first comparison criterion 3324 of the second set point signal 3314.

In some implementations, the method 3700 of FIG. 37 includes receiving a second set point signal indicating a second comparison value and a second comparison criterion and comparing a second comparison value to the second counter value based on the second comparison criterion. The method 3700 further includes, in response to the second comparison value satisfying the second comparison criterion with respect to the second counter value, sending a second control signal to a gate of a second transistor to generate a second pulse edge of the pulse of the pulse-width modulated signal, as described with reference to FIGS. 33 and 34. For example, the PWM 242 receives the first set point signal 3312 and generates the second pulse edge of the first pulse based on comparing the comparison value 3422 to a value of the counter 3302 based on the second comparison criterion 3426.

Figure 38:
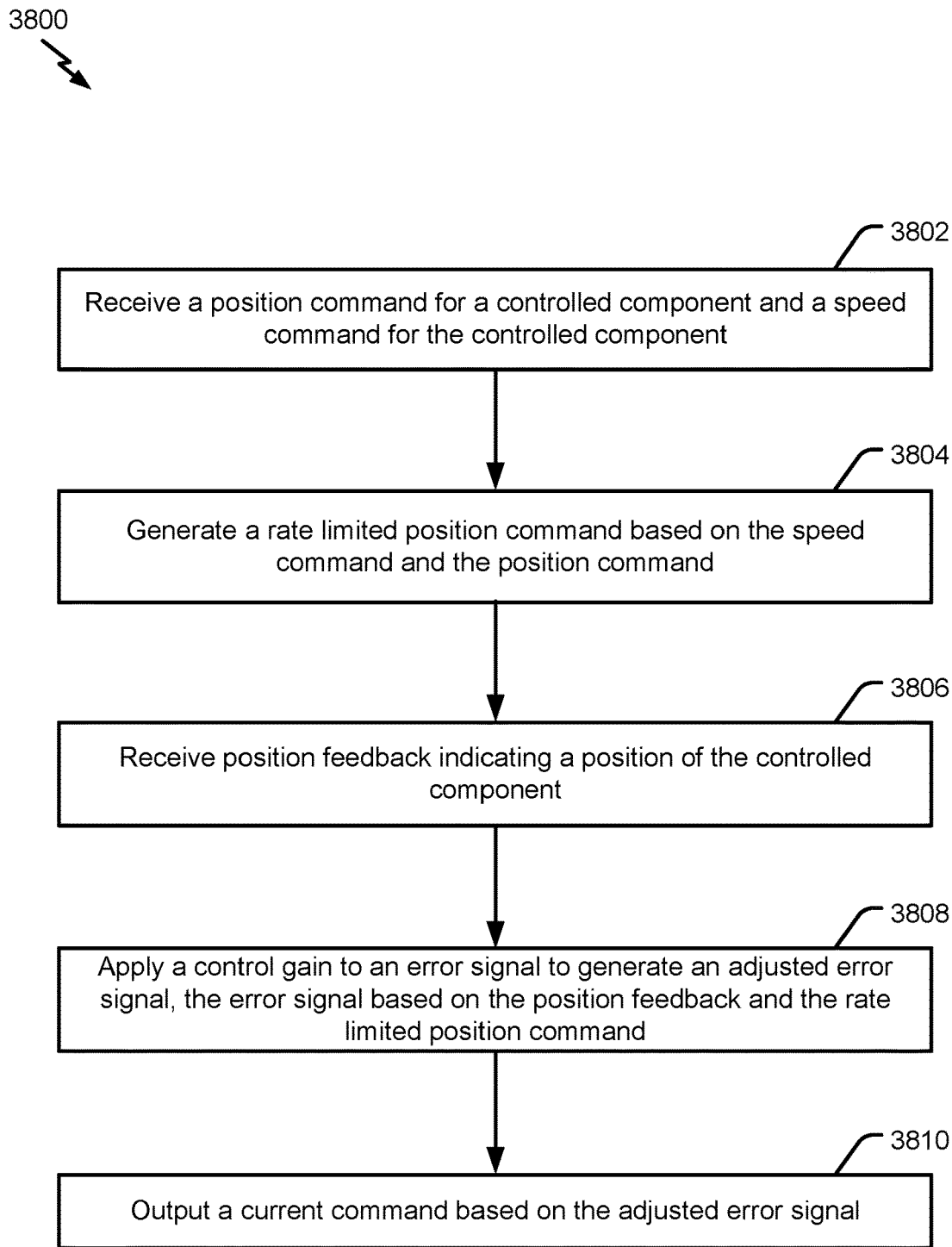
FIG. 38 is a flow chart of an example of a method for feedback control.

FIG. 38 illustrates a method 3800 for feedback control. The method 3800 may be performed by the control system 205, the feedback control system 232 of FIG. 2, the logic 3002 of FIG. 30, the logic 3102 of FIG. 31, the logic 3202 of FIG. 32, or a combination thereof. The method 3800 includes, at 3802, receiving a position command for a controlled component and a speed command for the controlled component. The controlled component may include or correspond to the motors 124, a drive shaft of the motors 124, the gimbals 122, the sensors 128 of FIG. 1, or a combination thereof. The position command may include or correspond to position command 2922 of FIGS. 29-32. The speed command may include or correspond to speed command 2932 of FIGS. 29-32. In some implementations, the position command indicates an angle of the motor and the speed command indicates an RPM of the motor.

The method 3800 of FIG. 38 also includes, at 3804, generating a rate limited position command based on the speed command and the position command. The rate limited position command may include or correspond to the rate limited position command 3034 of FIGS. 30-32. In some implementations, the method 3800 of FIG. 38 includes converting the current command to a duty cycle value and controlling a motor based on the duty cycle value, as described with reference to FIGS. 3 and 33-35.

The method 3800 of FIG. 38 includes, at 3806, receiving position feedback indicating a position of the controlled component. The position feedback may include or correspond to the position feedback 2924 of FIGS. 29-32. In some implementations, the position feedback is generated based on resolver outputs. For example, the position feedback may be generated by a resolver practicing the method 3600 of FIG. 36, by a demodulation circuit practicing the method 3900 of FIG. 39, or both.

The method 3800 of FIG. 38 further includes, at 3808, applying a control gain to an error signal to generate an adjusted error signal. The error signal is based on the position feedback and the rate limited position command. The control gain may include or correspond to the proportional gain 2926, the integral gain 2928 of FIGS. 29-32, or both. The error signal may include or correspond to the error signal 3012, and the adjusted error signal may include or correspond to the adjusted error signal 3014 of FIGS. 30-32.

The method 3800 of FIG. 38 further includes, at 3810, outputting a current command based on the adjusted error signal. The current command may include or correspond to the current command 2940 of FIGS. 29-32. In some implementations, the current command is used to control a motor and indicates a torque of the motor, as described with reference to FIG. 3. For example, the current command 2940 is provided to the current tracker 330, and the current tracker 330 generates the duty cycle value 374 based on the current command 2940, as described with reference to FIG. 3. The PWM 242 receives a set point signal indicating the duty cycle value 374 of the duty cycle setting 376 and supplies the AC power signal 380 to the motor 120 based on the set point signal.

In some implementations, generating the rate limited position command based on the speed command and the position command includes generating a threshold (e.g., a threshold value) based on the speed command and reducing a value of the position command to value of the speed command to generate the limited position command, as described with reference to FIGS. 30-32.

In some implementations, the method 3800 of FIG. 38 includes generating the error signal based on the position feedback and the rate limited position command. In some such implementations, generating the error signal includes subtracting the position indicated by the position feedback signal from the position indicated by the rate limited position command, as described with reference to FIGS. 30-32.

In some implementations, applying the control gain to the error signal to generate the adjusted error signal includes applying a proportional gain to the error signal and applying an integral gain to the error signal. Additionally or alternatively, applying the control gain to the error signal to generate the adjusted error signal includes multiplying the error signal by a proportional gain to generate a first product, multiplying an integral of the error signal by an integral gain to generate a second product, and adding the first product and the second product to generate the adjusted error signal, as described with reference to FIGS. 30-32.

In some implementations, the method 3800 of FIG. 38 includes dampening the adjusted error signal based on speed feedback, such as the speed feedback 2936 of FIGS. 29-32. In some such implementations, the current command is generated based on the damped error signal, such as the damped error signal 3138 of FIG. 31 and generating the damped error signal includes applying a second control gain to the adjusted error signal, as described with reference to FIGS. 30-32.

In a particular implementation, applying the second control gain to the adjusted error signal includes differentiating the speed feedback to generate differentiated speed feedback, multiplying the differentiated speed feedback by the second control gain to generate a damping value, and subtracting the damping value from the adjusted error signal, where subtracting the damping value from the adjusted error signal generates the damped error signal, and where the current command is generated based on the damped error signal, as described with reference to FIGS. 30-32. For example, the speed feedback 2936 is differentiated and multiplied by the rpm gain 2938 to generate the damping value 3016. The damping value 3016 is subtracted from the adjusted error signal 3014 to generate the damped error signal 3138; and the damped error signal 3138 is limited by minimum and maximum values and the limited damped error signal 3138 integrated to generate the current command 2940, as described with reference to FIGS. 30-32.

Figure 39:
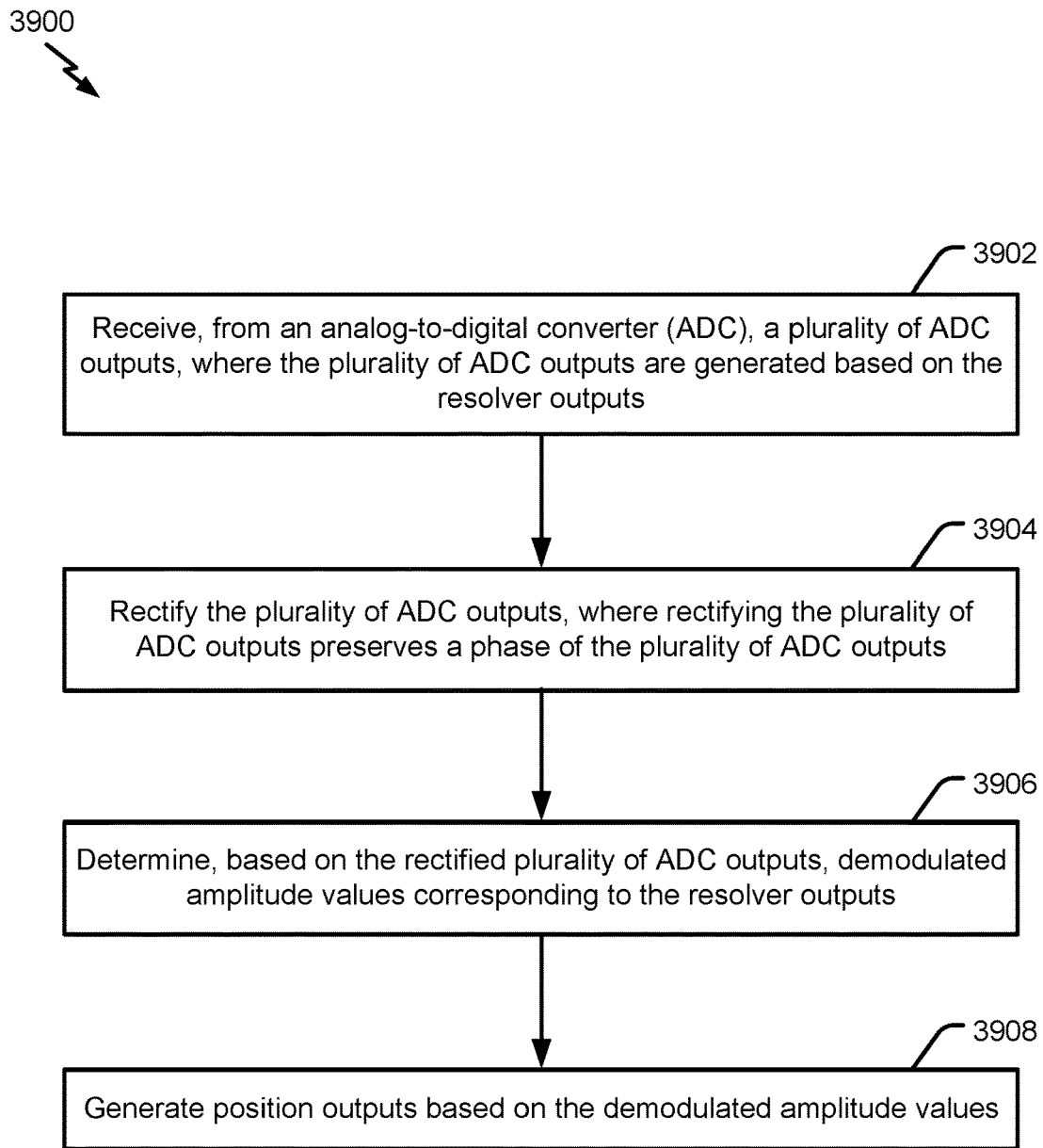
FIG. 39 is a flow chart of an example of a method of demodulating resolver outputs.

FIG. 39 illustrates a method 3900 of demodulating resolver outputs. The method 3900 may be performed by the resolver system 204, the demodulation system 222, the dual resolver combination system 224, the demodulation circuitry 514, 524 of FIG. 5, one or more circuits or firmware configured to perform operations of the logic of FIGS. 7-11, 14, 16, 18, and 19, or a combination thereof. The method 3900 includes, at 3902, receiving, from an analog-to-digital converter (ADC), a plurality of ADC outputs. The plurality of ADC outputs are generated based on the resolver outputs. The ADC may include or correspond to one of the ADCs 318, 320 of FIG. 3. The resolver may include or correspond to the resolvers 126 of FIG. 1, the dual speed resolver 312, the coarse resolver 342, the fine resolver 344 of FIG. 3, or a combination thereof. The ADC outputs may include or correspond to the ADC outputs 358 or the conditioned voltage values 360 of FIG. 3.

The method 3900 of FIG. 39 also includes, at 3904, rectifying the plurality of ADC outputs based on a square wave. In some implementations, the square wave includes a square wave having an amplitude of 1 and −1. The square wave may switch between amplitudes based on a counter value, such as the flip input 1022 which is determined based on the counter input 852, as described with reference to FIGS. 10-12.

The method 3900 of FIG. 39 includes, at 3906, determining, based on the rectified plurality of ADC outputs, demodulated amplitude values corresponding to the resolver outputs. The demodulated amplitude values may include or correspond to the demodulated amplitude values 362 of FIG. 3. In some implementations, the demodulated amplitude values may be generated by recursive median filtering, as described with reference to FIGS. 9 and 16.

The method 3900 of FIG. 39 further includes, at 3908, generating position outputs based on the demodulated amplitude values. The position outputs may include or correspond to the angle estimates 364 or the position estimate 366 of FIG. 3. In some implementations, the position outputs indicate a position (angle) of the drive shaft of the motor 124, as described with reference to FIG. 3. In some implementations, the demodulated amplitude values include sign information (e.g., are signed integers) and the angle estimates 364, the position estimates 366, or both are calculated based on the function atan 2. Additionally or alternatively, the position outputs may be generated based on shared sine table circuitry.

In some implementations, generating the demodulated amplitude values includes generating accumulated values based on the rectified plurality of ADC outputs, computing a median value of the last n number of accumulated values, and outputting the median value as a particular demodulated amplitude value of the demodulated amplitude values, as described with reference to FIG. 16.

In some implementations, rectifying the plurality of ADC outputs includes multiplying the plurality of ADC outputs based on a square wave. In a particular implementation, the square wave has an amplitude of 1 for counter values below a particular counter value, such as a median counter value, and has an amplitude of −1 for counter values above the particular counter value, as described with reference to FIGS. 10-12.

In some implementations, multiplying the plurality of ADC output based on the square wave includes changing a sign of a particular ADC output of the plurality of ADC outputs to generated an inverted ADC output, selecting the particular ADC output or the inverted ADC output based on a flip input, and outputting the selected ADC output as a particular rectified ADC output, as described with reference to FIG. 11.

In some implementations, the method 3900 of FIG. 39 includes masking a subset of ADC outputs that align with current drive switching of a motor associated with the resolver to generate a filtered set of ADC outputs. The method 3900 further includes determining the demodulated amplitude value based on the filtered set of ADC outputs in the data windows 1514, as described with reference to FIGS. 14 and 15.

In some implementations, the masked set of ADC output comprises ADC outputs that occur near peak amplitudes of a first harmonic of an excitation signal associated with the resolver, as described with reference to FIGS. 14 and 15. Additionally, each demodulated amplitude value of the demodulated amplitude values corresponds to a cycle of the first harmonic of the excitation signal, as described with reference to FIGS. 14-16.

In some implementations, the method 3900 of FIG. 39 includes recursively filtering the plurality of ADC outputs to generate median ADC outputs, as described with reference to FIGS. 8 and 9. In such implementations, rectifying the plurality of ADC outputs includes rectifying the median ADC outputs.

In some implementations, the resolver receives a dithered excitation signal that has zero mean dither and generates the resolver outputs based on the dithered excitation signal. In such implementations, the ADC oversamples the resolver outputs to generate the ADC output.

Figure 40:
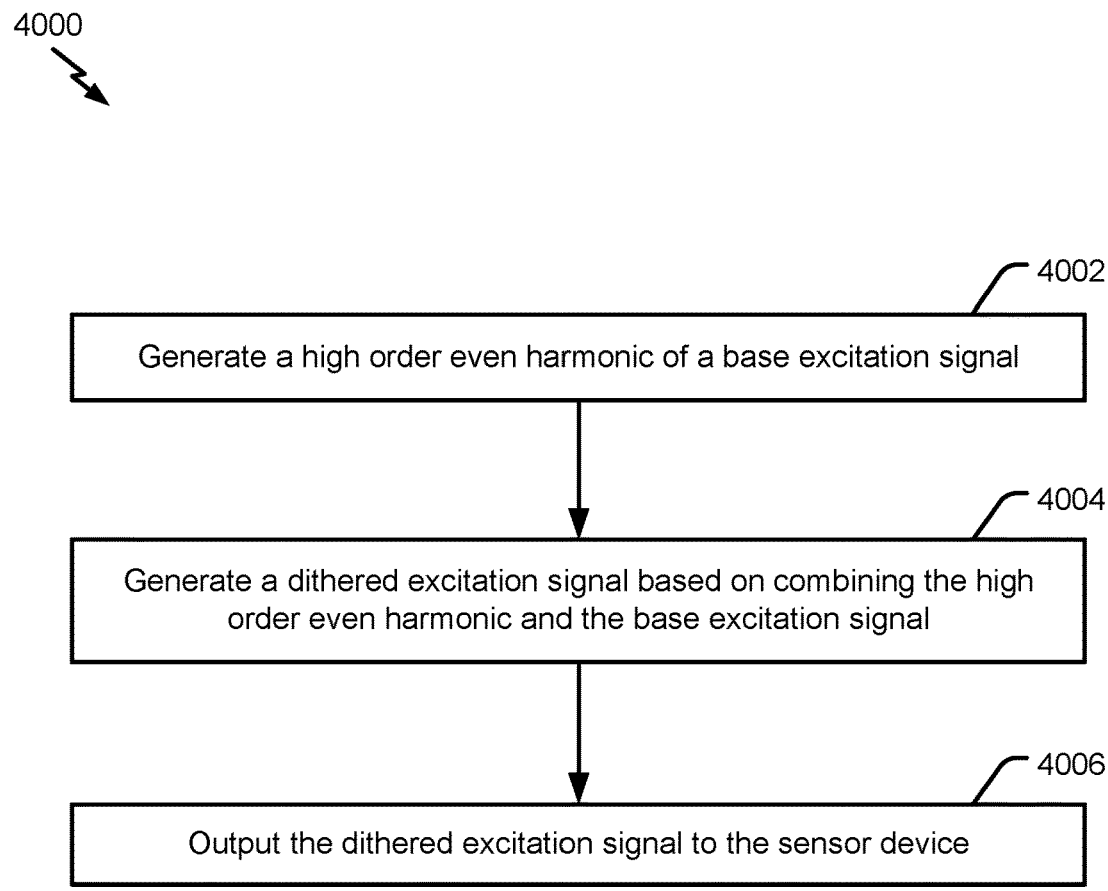
FIG. 40 is a flow chart of an example of a method of generating an excitation signal for a sensor device.

FIG. 40 illustrates a method 4000 of generating an excitation signal for a sensor device. The method 4000 may be performed by the excitation signal generation system 202, the dither generator 212, the coordination system 214 of FIG. 2, the logic 2602 of FIG. 26, the resolver driver circuit 2702 of FIG. 27, or a combination thereof. The method 4000 includes, at 4002, generating a high order even harmonic of a base excitation signal. The high order even harmonic may include or correspond to the high order even harmonic signal 2666 of FIG. 26. The base excitation signal may include or correspond to the base excitation signal 452 of FIG. 23.

The method 4000 of FIG. 40 also includes, at 4004, generating a dithered excitation signal based on combining the high order even harmonic and the base excitation signal. The dithered excitation signal may include or correspond to the dithered excitation signal 352 of FIGS. 3 and 23.

The method 4000 of FIG. 40 further includes, at 4006, outputting the dithered excitation signal to the sensor device. In some implementations, the sensor device comprises a resolver. In a particular implementation, the resolver comprises a dual resolver or dual speed resolver, such as the dual speed resolver 312 of FIG. 3. In other implementations, the sensor device may include or correspond to a synchro, active transducers (e.g., a linear variable differential transformer), or other active sensors. Additionally, the sensor may be included in the inertial measurement unit 102 of FIG. 1.

In some implementations, the dithered excitation signal includes or corresponds to a digital signal and includes digital samples. In such implementations, a DAC, such as the DAC 310, converts the dithered excitation signal into an analog signal and provides the dithered excitation signal to the sensor device.

In some implementations, the base excitation signal corresponds to a sine wave signal and the dithered excitation signal has zero mean deviation from the sine wave signal. For example, a 16th order harmonic signal includes 16 sine waves for each sine wave of the base excitation signal. Thus, a combined signal of the high order even harmonic and the base excitation signal produces the dithered excitation signal 352 where during each sine wave of the base excitation signal 452, an average amplitude of the dithered excitation signal 352 does not deviate from an average amplitude of the base excitation signal 452, as illustrated in FIG. 23.

In some implementations, the method 4000 further includes generating the base excitation signal. For example, the excitation signal generator system 202 of FIG. 2 generates the base excitation signal 452 and provides the base excitation signal 452 to the combiners 2624, 2626, as described with reference to FIG. 26. In a particular implementation, the excitation signal is generated based on a sine function and an amplitude setting. For example, the excitation signal generation system 202 (e.g., the first logic chain 2612 thereof) generates the base excitation signal 452 by retrieving a value from a sine look-up table and multiplying the value by the amplitude setting. In some such implementations, the look-up table is shared with one or more other components, the look-up table is accessed based on Round-Robin scheduling.

In some implementations, the method 4000 further includes generating the high order even harmonic based on a $16^{th}$ harmonic of the sine function and a second amplitude setting. For example, the second logic chain 2614 of the excitation signal generation system 202 generates the high order even harmonic signal 2666 based on the harmonic of the sine function and the amplitude setting and provides the high order even harmonic signal 2666 to the combiners 2624, 2626, as described with reference to FIG. 26.

In some implementations, the method 4000 further includes generating a low order odd harmonic signal and combining the low order odd harmonic, the high order even harmonic, and the base excitation signal to generate the dithered excitation signal. In other implementations, the combiner is configured to combine the high order even harmonic and the base excitation signal to generate the dithered excitation signal.

In some implementations, the method 4000 further includes time coordinating the dithered excitation signal with current switching of a motor. In a particular implementation, time coordinating the dithered excitation signal with current switching of the motor includes offsetting current switching from peaks and valleys of the base excitation signal, as described with reference to FIGS. 27, 28, and 33-35. Additionally or alternatively, time coordinating the dithered excitation signal with current switching of the motor includes performing an even number of current switches during a wave of the base excitation signal, as described with reference to FIG. 33. In a particular implementation, the number of current switched occurring during a wave has an equal number of current switch activations and current switch deactivations.

In some implementations, the method 4000 further includes time coordinating the dithered excitation signal with current switching of a motor. In a particular implementation, time coordinating the dithered excitation signal with current switching of the motor includes offsetting current switching from peaks and valleys of the base excitation signal, as described with reference to FIG. 33. Additionally or alternatively, the dithered excitation signal is synched with a sampling rate of outputs of the resolver.

In some implementations, a motor is coupled to the sensor and the dithered excitation signal is offset the current drive switching of the motor. In some such implementations, the method 4000 further includes time coordinating a first clock, used to generate the dithered excitation signal, with a second clock of a PWM, configured to control the motor, such that current drive switching of the motor is offset from the dithered excitation signal. For example, the counters 842 of FIG. 8 and 3302 of FIG. 33 may be synchronized.

In some implementations, an ADC is coupled to the resolver. In some such implementations, the method 4000 further includes receiving, by the ADC, output signals from the resolver and oversampling the output signals. In a particular implementation, the first clock is synchronized with a second clock of the ADC. In other implementations, the ADC oversamples the output signals based on the first clock, such as the counter 842 of FIG. 8.

Referring to FIG. 41, a block diagram 4100 of an illustrative embodiment of an aircraft 4102. As shown in FIG. 41 the aircraft 4102 (e.g., a spaceship, a satellite, or a space station) includes a frame 4118, an interior 4122, and a plurality of systems 4120. The systems 4120 may include one or more of a propulsion system 4124, an electrical system 4126, an environmental system 4128, a hydraulic system 4130, and the inertial measurement unit 102. In other implementations, the aircraft 4102 may include additionally systems or fewer systems than the systems 4120 illustrated in FIG. 41.

The inertial measurement unit 102 includes the inverter 112 and the gimbal device 114 of FIG. 1. The inverter 112 may include the PWM 242 of FIG. 2, the current tracker 330, the gate drivers 334, the transistors 336 of FIG. 3, the motor driver circuit 2802 of FIG. 28, or a combination thereof. The inverter 112 may include circuitry and firmware configured to perform the operations described in FIG. 33, the operations described in FIG. 34, the operations of the PWM logic 3502 of FIG. 35, or a combination thereof.

The gimbal device 114 may include the gimbals 122, the motors 124, the resolvers 126, the sensors 128 of FIG. 1, the excitation signal generation system 202, the resolver system 204, the control system 206, the demodulation system 222, the dual resolver combination system 224, the feedback control system 232 of FIG. 2, the DAC 310, the dual speed resolver 312, the differential voltage sensors 314, 316, the ADCs 318, 320, the voltage conditioning circuitry 322, 324, the angle estimation circuitry 326 of FIG. 3, the demodulation circuitry 514, 524, the angle calculation circuitry 516, 526, the angle combination circuitry 542, and the drift correction circuitry 544 of FIG. 5, or a combination thereof.

Additionally or alternatively, the gimbal device 114 may include circuitry and firmware configured to perform operations of the logic 602 of FIG. 6, the logic 702 of FIG. 7, the logic 802 of FIG. 8, the RMVA logic 812 of FIG. 9, the demodulation logic 826 of FIG. 10, the accumulator logic 1014 of FIG. 11, the logic 1102 of FIG. 11, the mask logic 1018 of FIG. 14, the output logic 1026 of FIG. 16, the logic 1802 of FIG. 18, the logic 1902 of FIG. 19, the logic 2602 of FIG. 26, the logic 3002 of FIG. 30, the logic 3102 of FIG. 31, the logic 3202 of FIG. 32, or a combination thereof. The inertial measurement unit 102 may be included within in the aircraft 4102 or coupled to an exterior surface of the aircraft 4102.

The inertial measurement unit 102 is configured to enable inertial navigation of the aircraft 4102 as described above with reference to FIGS. 1-40. For example, the inertial measurement unit 102 (e.g., one or more components thereof) is configured to perform one or more operations of one or more of the method 3600-400. As another example, the inertial measurement unit 102 is be configured to execute computer-executable instructions (e.g., a program of one or more instructions) stored in a memory. The instructions, when executed, cause the inertial measurement unit 102 to perform one or more operations of one or more of the method 3600-4000. For example, the processor receives the coarse position signals from the coarse resolver and the fine position signals from the fine resolver, generates the initial position output based on the coarse position signals, and generates the subsequent position output based on the fine position signals, as described with reference to FIG. 36.

The illustrations of the examples described herein are intended to provide a general understanding of the structure of the various implementations. The illustrations are not intended to serve as a complete description of all of the elements and features of apparatus and systems that utilize the structures or methods described herein. Many other implementations may be apparent to those of skill in the art upon reviewing the disclosure. Other implementations may be utilized and derived from the disclosure, such that structural and logical substitutions and changes may be made without departing from the scope of the disclosure. For example, method operations may be performed in a different order than shown in the figures or one or more method operations may be omitted. Accordingly, the disclosure and the figures are to be regarded as illustrative rather than restrictive.

Moreover, although specific examples have been illustrated and described herein, it should be appreciated that any subsequent arrangement designed to achieve the same or similar results may be substituted for the specific implementations shown. This disclosure is intended to cover any and all subsequent adaptations or variations of various implementations. Combinations of the above implementations, and other implementations not specifically described herein, will be apparent to those of skill in the art upon reviewing the description.

The Abstract of the Disclosure is submitted with the understanding that it will not be used to interpret or limit the scope or meaning of the claims. In addition, in the foregoing Detailed Description, various features may be grouped together or described in a single implementation for the purpose of streamlining the disclosure. Examples described above illustrate but do not limit the disclosure. It should also be understood that numerous modifications and variations are possible in accordance with the principles of the present disclosure. As the following claims reflect, the claimed subject matter may be directed to less than all of the features of any of the disclosed examples. Accordingly, the scope of the disclosure is defined by the following claims and their equivalents.

What is claimed is:

1. Demodulation circuitry comprising:
an input terminal configured to be coupled to an analog-to-digital converter (ADC) and configured to receive a plurality of ADC outputs, wherein the plurality of ADC outputs are generated based on resolver outputs;
a rectifier configured to rectify the plurality of ADC outputs, wherein rectifying the plurality of ADC outputs preserves a phase of the plurality of ADC outputs;
amplitude determination circuitry configured to determine, based on the rectified plurality of ADC outputs, demodulated amplitude values corresponding to the resolver outputs; and
angle computation circuitry configured to determine estimated angle outputs based on the demodulated amplitude values and configured to generate position outputs based on the estimated angle outputs.

2. The demodulation circuitry of claim 1, wherein the rectifier is configured to rectify the plurality of ADC outputs by multiplying the plurality of ADC outputs by a square wave.

3. The demodulation circuitry of claim 1, further comprising a second input terminal configured to be coupled to a second ADC and configured to receive a second plurality of ADC outputs, wherein the second plurality of ADC outputs are generated based on outputs of a second resolver of a dual speed resolver.

4. The demodulation circuitry of claim 1, wherein the demodulated amplitude values include sign information, and wherein the angle computation circuitry is configured to compute the estimated angle outputs using an atan 2 function.

5. The demodulation circuitry of claim 1, wherein the angle computation circuitry is configured to generate the estimated angle outputs based on shared sine table circuitry, and wherein the shared sine table circuitry is shared with excitation signal generation circuitry via Round-Robin scheduling.

6. The demodulation circuitry of claim 1, wherein the amplitude determination circuitry comprises an accumulator configured to accumulate multiple rectified ADC outputs of the rectified plurality of ADC outputs to generate accumulated outputs, and wherein the demodulated amplitude values are generated based on the accumulated outputs.

7. The demodulation circuitry of claim 6, further comprising a counter configured to generate a counter value, wherein the accumulator is configured to output a particular accumulated output as a particular demodulated amplitude value responsive to the counter having a particular counter value.

8. The demodulation circuitry of claim 1, further comprising voltage conditioning circuitry configured to adjust a voltage of the plurality of ADC outputs to account for a voltage bias of the demodulation circuitry, the voltage conditioning circuitry comprising a low pass filter configured to determine the voltage bias.

9. A method of demodulating resolver outputs, the method comprising:
receiving, from an analog-to-digital converter (ADC), a plurality of ADC outputs, wherein the plurality of ADC outputs are generated based on the resolver outputs;
rectifying the plurality of ADC outputs, wherein rectifying the plurality of ADC outputs preserves a phase of the plurality of ADC outputs;
determining, based on the rectified plurality of ADC outputs, demodulated amplitude values corresponding to the resolver outputs;
determining estimated angle outputs based on the demodulated amplitude values; and
generating position outputs based on the estimated angle outputs.

10. The method of claim 9, wherein determining the demodulated amplitude values comprises:
generating accumulated values based on the rectified plurality of ADC outputs;
computing a median value of a last n number of accumulated values, wherein n is an integer greater than one; and
outputting the median value as a particular demodulated amplitude value of the demodulated amplitude values.

11. The method of claim 9, wherein rectifying the plurality of ADC outputs comprises multiplying a signal of the plurality of ADC outputs and a square wave, wherein the square wave has an amplitude of 1 for counter values below a particular counter value and an amplitude of −1 for counter values above the particular counter value, and wherein each ADC output of the plurality of ADC outputs corresponds to a counter value.

12. The method of claim 11, wherein multiplying the signal of the plurality of ADC outputs based on the square wave includes:
changing a sign of a particular ADC output of the plurality of ADC outputs to generate an inverted ADC output;
selecting the particular ADC output or the inverted ADC output based on a flip input, the flip input generated based on the counter values; and
outputting the selected ADC output as a particular rectified ADC output of the rectified plurality of ADC outputs.

13. The method of claim 9, further comprising:
masking a subset of ADC outputs of the plurality of ADC outputs that align with current drive switching of a motor associated with a resolver to generate a filtered set of ADC outputs; and
determining the demodulated amplitude values based on the filtered set of ADC outputs.

14. The method of claim 13, wherein the filtered set of ADC outputs comprises ADC outputs that occur near peak amplitudes of a first harmonic of an excitation signal associated with the resolver, and wherein each demodulated amplitude value of the demodulated amplitude values corresponds to a cycle of the first harmonic of the excitation signal.

15. The method of claim 9, further comprising recursively filtering the plurality of ADC outputs to generate median ADC outputs, wherein rectifying the plurality of ADC outputs includes rectifying the median ADC outputs.

16. A system comprising:
a resolver;
an analog-to-digital converter (ADC) coupled to the resolver; and
demodulation circuitry coupled to the ADC and configured to generate demodulated resolver outputs, the demodulation circuitry comprising:
an input terminal coupled to the ADC and configured to receive a plurality of ADC outputs, wherein the plurality of ADC outputs are generated based on resolver outputs;
a rectifier configured to rectify the plurality of ADC outputs, wherein rectifying the plurality of ADC outputs preserves a phase of the plurality of ADC outputs;
amplitude determination circuitry configured to determine, based on the rectified plurality of ADC outputs, demodulated amplitude values corresponding to the resolver outputs; and
angle computation circuitry configured to determine estimated angle outputs based on the demodulated amplitude values and configured to generate position outputs based on the estimated angle outputs.

17. The system of claim 16, wherein the resolver is configured to receive a dithered excitation signal that has zero mean dither and is configured to generate the resolver outputs based on the dithered excitation signal, and wherein the ADC is configured to oversample the resolver outputs to generate the plurality of ADC outputs.

18. The system of claim 16, wherein the resolver, the ADC, and the demodulation circuitry are included in a gimbaled inertial measurement unit.

19. The system of claim 18, wherein the gimbaled inertial measurement unit further comprises a motor, the motor configured to position a gimbal of the gimbaled inertial measurement unit, and wherein the resolver is configured to generate the resolver outputs indicative of a position of a drive shaft of the motor.

20. The system of claim 19, wherein the gimbaled inertial measurement unit further comprises feedback control circuitry coupled to the demodulation circuitry, wherein the feedback control circuitry is configured to receive the position outputs and to control a pulse-width modulation control circuit based on the position outputs, and wherein the pulse-width modulation control circuit is configured to control the motor.

* * * * *